(12) United States Patent
Okutani et al.

(10) Patent No.: US 11,302,525 B2
(45) Date of Patent: Apr. 12, 2022

(54) SUBSTRATE PROCESSING METHOD AND SUBSTRATE PROCESSING APPARATUS

(71) Applicant: SCREEN Holdings Co., Ltd., Kyoto (JP)

(72) Inventors: Manabu Okutani, Kyoto (JP); Hiroaki Takahashi, Kyoto (JP); Masayuki Otsuji, Kyoto (JP); Hiroshi Abe, Kyoto (JP); Chikara Maeda, Kyoto (JP); Hitoshi Nakai, Kyoto (JP); Yuta Sasaki, Kyoto (JP)

(73) Assignee: SCREEN Holdings Co., Ltd.

( * ) Notice: Subject to any disclaimer, the term of this patent is extended or adjusted under 35 U.S.C. 154(b) by 705 days.

(21) Appl. No.: 16/136,317

(22) Filed: Sep. 20, 2018

(65) Prior Publication Data

US 2019/0091736 A1     Mar. 28, 2019

(30) Foreign Application Priority Data

Sep. 22, 2017   (JP) .............................. JP2017-182551
Jan. 11, 2018   (JP) .............................. JP2018-002992
May 31, 2018   (JP) .............................. JP2018-105412

(51) Int. Cl.
*H01L 21/02*       (2006.01)
*B08B 3/08*        (2006.01)
(Continued)

(52) U.S. Cl.
CPC .......... *H01L 21/02057* (2013.01); *B08B 3/08* (2013.01); *B08B 3/10* (2013.01);
(Continued)

(58) Field of Classification Search
None
See application file for complete search history.

(56) References Cited

U.S. PATENT DOCUMENTS

2012/0073599 A1    3/2012  Miya et al. ....................... 134/4
2012/0304483 A1*  12/2012  Sirard ............... H01L 21/67248
                                                     34/289
(Continued)

FOREIGN PATENT DOCUMENTS

JP    H07-020637 A    1/1995
JP    2010-199261 A   9/2010
(Continued)

*Primary Examiner* — Mikhail Kornakov
*Assistant Examiner* — Ryan L Coleman
(74) *Attorney, Agent, or Firm* — Ostrolenk Faber LLP

(57) ABSTRACT

A substrate processing method includes a processing liquid film forming step of supplying a processing liquid, containing a sublimable substance, to a pattern forming surface of a substrate, to form a processing liquid film on the pattern forming surface, a temperature maintaining step of maintaining a temperature of the processing liquid film, formed on the pattern forming surface, in a temperature range not lower than a melting point of the sublimable substance and lower than a boiling point of the sublimable substance, a film thinning step of thinning the processing liquid film while the temperature of the processing liquid film is in the temperature range, a freezing step of making the processing liquid film, thinned by the film thinning step, freeze on the pattern forming surface after the temperature maintaining step to form a frozen body of the sublimable substance, and a sublimating step of sublimating the frozen body to remove the frozen body from the pattern forming surface.

43 Claims, 38 Drawing Sheets

(51) Int. Cl.
   *H01L 21/67*       (2006.01)
   *B08B 3/10*        (2006.01)
(52) U.S. Cl.
   CPC .......... *H01L 21/67028* (2013.01); *H01L 21/67034* (2013.01); *H01L 21/67051* (2013.01); *H01L 21/67109* (2013.01); *H01L 21/67253* (2013.01); *H01L 21/67167* (2013.01)

(56) References Cited

U.S. PATENT DOCUMENTS

| | | | |
|---|---|---|---|
| 2013/0008868 A1 | 1/2013 | Uozumi et al. | 216/41 |
| 2014/0144465 A1 | 5/2014 | Kaneko et al. | 134/4 |
| 2017/0062244 A1 | 3/2017 | Sato et al. | |

FOREIGN PATENT DOCUMENTS

| | | |
|---|---|---|
| JP | 2012-243869 A | 12/2012 |
| JP | 2013-033817 A | 2/2013 |
| JP | 2014-011426 A | 1/2014 |
| JP | 2014-140085 A | 7/2014 |
| JP | 2015-142069 A | 8/2015 |
| JP | 2017-037985 A | 2/2017 |
| TW | 201214534 A1 | 4/2012 |

\* cited by examiner

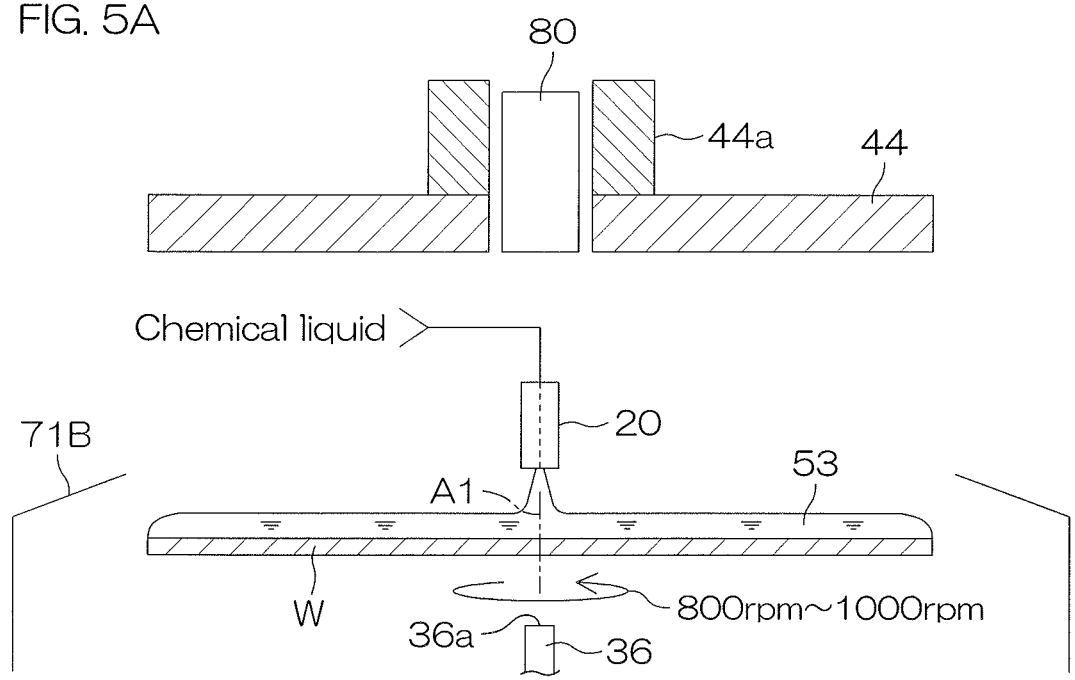
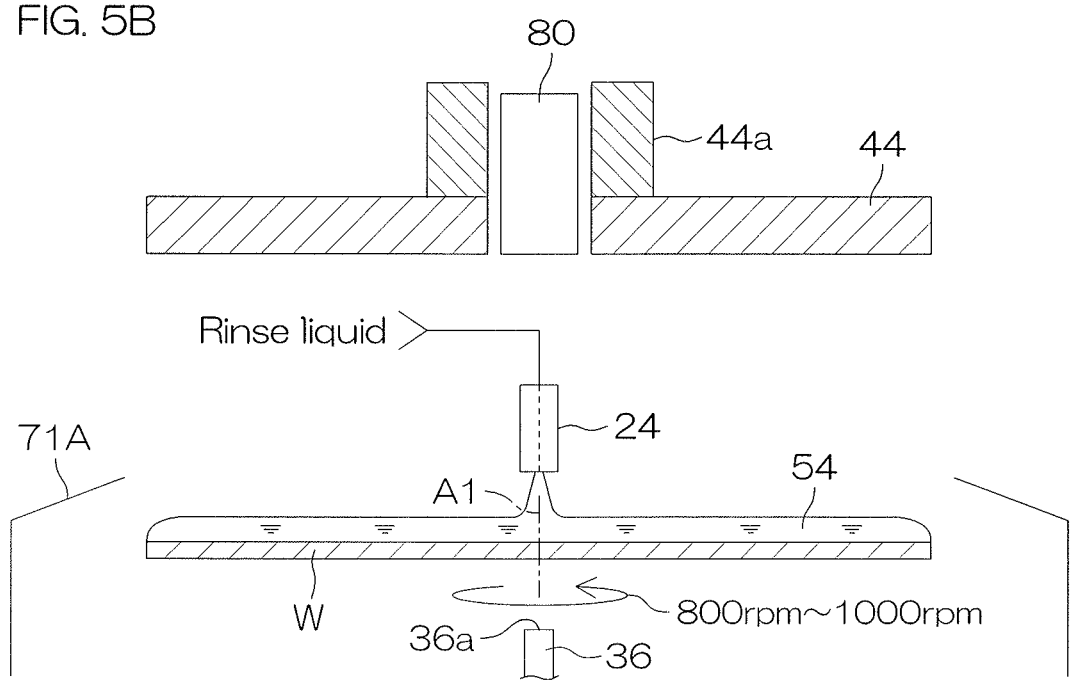

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus. Examples of substrates to be processed include semiconductor wafers, substrates for FPDs (Flat Panel Displays) such as liquid crystal displays, plasma displays and electroluminescence displays, substrates for magnetic disks, substrates for magneto-optical disks, substrates for photomasks, ceramic substrates, substrates for solar cells, etc.

2. Description of the Related Art

A wet substrate processing is performed in a semiconductor device manufacturing process.

For example, on a front surface (pattern forming surface) of a substrate, on which a fine pattern with projections and recesses is formed through a dry etching step, etc., an etching residue, which is a reaction byproduct, may be present. A metal impurity or an organic contaminant, etc., may also be attached to the pattern forming surface.

To remove these substances, a chemical liquid processing using a chemical liquid is performed. An etching liquid, a cleaning liquid, etc., is used as the chemical liquid. Also, after the chemical liquid processing, a rinse processing of removing the chemical liquid by a rinse liquid is performed. Deionized water, etc., is used as the rinse liquid.

Thereafter, a drying processing of drying the substrate by removing the rinse liquid is performed.

With the pattern with recesses and projections formed on the pattern forming surface of the substrate being made finer in recent years, there is a tendency for the projections of the pattern to increase in aspect ratio (ratio of height and width of a projection).

There are thus cases where, during the drying processing, mutually adjacent projections of the pattern collapse due to being drawn together by a surface tension acting on a liquid surface (an interface between the rinse liquid and a gas on it) of the rinse liquid that entered into a recess between the projections.

For example, there is known a method where a solution, capable of changing into a solid by drying or a chemical change, etc., is supplied to a pattern forming surface of a substrate and changed to the solid to form a supporting material supporting the pattern and thereafter the formed supporting material is removed by changing it from a solid phase to a gas phase without passing through a liquid phase (see United States Patent Application Publication No. 2013/008868).

With the present method, the influence of surface tension of a liquid can be eliminated and therefore the pattern forming surface of the substrate can be dried while suppressing pattern collapse.

As a material forming the supporting material, for example, a substance (may hereinafter be referred to as a "sublimable substance"), with a so-called sublimating property, that is high in vapor pressure at ordinary temperature and changes from a solid phase to a gas phase without passing through a liquid phase is used.

With the method of using the sublimable substance, a processing liquid, containing the sublimable substance, is supplied to the pattern forming surface of the substrate to form a processing liquid film and the formed processing liquid film is made to freeze on the pattern forming surface to form a frozen body. Next, the pattern forming surface of the substrate can be dried by sublimating and thereby removing the frozen body while using the formed frozen body as the supporting material for the projections of the pattern to suppress collapse of the projections.

SUMMARY OF THE INVENTION

In supplying the processing liquid, containing the sublimable substance, to the pattern forming surface of the substrate to form the processing liquid film, a rotational speed of the substrate is preferably increased to remove excess processing liquid by a centrifugal force. This is done to make the processing liquid film as thin in film thickness as possible to shorten times required for formation and sublimation/removal of the frozen body.

However, the faster the processing liquid film is rotated in accompaniment with the rotation of the substrate, the more easily is the sublimable substance vaporized from the liquid surface of the processing liquid film.

And, by the sublimable substance removing heat of vaporization in the process of vaporizing, the temperature of the processing liquid film decreases and the freezing of the processing liquid film progresses. A rate of progress of such an unintended freezing phenomenon that accompanies vaporization is slower than that of an intentional freezing phenomenon in a freezing step executed after the processing liquid film is formed.

An internal stress (strain) thus tends to remain in the frozen body formed on the pattern forming surface of the substrate by the freezing of the processing liquid film and this becomes a cause of pattern collapse through an increase in internal stress in the frozen body.

Also, the freezing of the processing liquid film already begins from the step of supplying the processing liquid and there is thus a tendency for a final film thickness of the frozen body formed on the pattern forming surface of the substrate through the freezing step to increase. An excessive increase in the film thickness of the frozen body also becomes a cause of pattern collapse through an increase in internal stress remaining in the frozen body.

Thus, an object of the present invention is to provide a substrate processing method and a substrate processing apparatus that enables a pattern forming surface of a substrate to be dried while suppressing pattern collapse.

A preferred embodiment of the present invention provides a substrate processing method including a processing liquid film forming step of supplying a processing liquid, containing a sublimable substance, to a pattern forming surface of a substrate, to form a processing liquid film on the pattern forming surface, a temperature maintaining step of maintaining a temperature of the processing liquid film, formed on the pattern forming surface, in a temperature range not lower than a melting point of the sublimable substance and lower than a boiling point of the sublimable substance, a film thinning step of thinning the processing liquid film while the temperature of the processing liquid film is in the temperature range, a freezing step of making the processing liquid film, thinned by the film thinning step, freeze on the pattern forming surface after the temperature maintaining step to form a frozen body of the sublimable substance, and a sublimating step of sublimating the frozen body to remove the frozen body from the pattern forming surface.

With the present method, by maintaining the temperature of the processing liquid film in the above-stated temperature range in the temperature maintaining step, the processing liquid film can be suppressed from freezing and the processing liquid film before the freezing step can be maintained in a liquid phase. For example, even if the processing liquid film undergoes partial freezing in a processing liquid film forming step, it can be remelted and put in a liquid state in the temperature maintaining step.

Also, in the subsequent film thinning step, by thinning the processing liquid film while the temperature of the processing liquid film is in the above-stated temperature range and freezing of the processing liquid film is not occurring, a film thickness of the frozen body formed in the freezing step can be reduced.

The frozen body, which is made as low as possible in internal stress and moreover is adjusted appropriately in film thickness, can thus be formed on the pattern forming surface of the substrate in the freezing step.

Therefore, with the present method, by sublimating and thereby removing the frozen body in the subsequent sublimating step, the pattern forming surface of the substrate can be dried while suppressing pattern collapse.

In the preferred embodiment of the present invention, the processing liquid film forming step includes a step of forming the processing liquid film that spreads to a peripheral edge of the pattern forming surface. And, the film thinning step includes a film removing thinning step of thinning the processing liquid film by removing a portion of the processing liquid, constituting the processing liquid film, from the pattern forming surface after the supply of the processing liquid is stopped.

With the present method, a portion of the processing liquid, constituting the processing liquid film that spreads to the peripheral edge of the pattern forming surface, is removed to thin the processing liquid film. The processing liquid can thus be made to spread across an entirety of the pattern forming surface reliably and the film thickness of the frozen body formed in the freezing step can be reduced appropriately.

In the preferred embodiment of the present invention, the film removing thinning step includes a substrate rotating step of horizontally holding and rotating the substrate. The processing liquid film can thus be thinned by a simple method of removing a portion of the processing liquid from the pattern forming surface by a centrifugal force due to the rotation of the substrate.

In the preferred embodiment of the present invention, the processing liquid film forming step includes a core forming step of forming, as the processing liquid film, a processing liquid core of smaller than the diameter of the substrate, in a predetermined region that includes a center of the pattern forming surface. Also, the film thinning step includes a film enlarging thinning step of spreading and thinning the processing liquid core to a peripheral edge of the pattern forming surface to thin the processing liquid film.

With the present method, the thin processing liquid film that spreads to the peripheral edge of the pattern forming surface is formed by spreading the processing liquid core, formed in the predetermined region that includes the center of the pattern forming surface, to the peripheral edge of the pattern forming surface. The film thickness of the frozen body formed in the freezing step can thus be reduced appropriately. Further, it suffices to supply, to the pattern forming surface, the processing liquid of an amount such that it spreads thinly to the peripheral edge of the pattern forming surface, and therefore the amount of processing liquid used to form the frozen body can be reduced.

In the preferred embodiment of the present invention, the film enlarging thinning step includes a substrate rotating step of horizontally holding and rotating the substrate. The processing liquid film can thus be thinned by a simple method of spreading the processing liquid core thinly by a centrifugal force due to the rotation of the substrate.

In the preferred embodiment of the present invention, the core forming step includes a first substrate rotating step of horizontally holding and rotating the substrate at a first rotational speed. Also, the film enlarging thinning step includes a second substrate rotating step of horizontally holding and rotating the substrate at a second rotational speed that is a higher speed than the first rotational speed.

With the present method, when the processing liquid core is formed, the substrate is rotated at the first rotational speed that is a comparatively low speed. A centrifugal force acting on the processing liquid on the pattern forming surface is thus comparatively small. The processing liquid core that spreads uniformly in the predetermined region can thus be formed while suppressing the processing liquid from spreading toward the peripheral edge of the substrate. On the other hand, in spreading the processing liquid core to the peripheral edge, the substrate is rotated at the second rotational speed that is a comparatively high speed. The centrifugal force acting on the processing liquid on the pattern forming surface is thus comparatively large. The processing liquid can thus be spread rapidly to the peripheral edge of the substrate.

In the preferred embodiment of the present invention, the substrate processing method further includes a processing liquid supply stopping step of stopping the supply of the processing liquid before the start of the film enlarging thinning step. An amount of the processing liquid expelled outside the substrate in the film thinning step can thereby be reduced. The usage amount of the processing liquid can thereby be reduced further.

In the preferred embodiment of the present invention, the substrate processing method further includes a processing liquid replenishing step of continuing the supply of the processing liquid to the pattern forming surface during execution of the film enlarging thinning step to replenish the processing liquid to the processing liquid film. The processing liquid can thus be spread evenly across the entirety of the pattern forming surface.

In the preferred embodiment of the present invention, the temperature maintaining step includes a temperature adjusting medium supplying step of supplying a temperature adjusting medium to a rear surface at an opposite side to the pattern forming surface of the substrate to adjust the temperature of the processing liquid film, formed on the pattern forming surface, via the substrate. The temperature of the processing liquid film can thus be adjusted by a simple method of supplying the temperature adjusting medium to the rear surface of the substrate. The configuration of a substrate processing apparatus configured to perform the substrate processing method can thus be simplified.

In the preferred embodiment of the present invention, the freezing step includes a substrate cooling step of supplying a cooling medium to the rear surface at the opposite side to the pattern forming surface of the substrate to cool the processing liquid film to a temperature not higher than a freezing point of the sublimable substance via the substrate. Also, the temperature adjusting medium supplying step includes a first heating medium supplying step of supplying a first heating medium of a first temperature, not lower than the melting point of the sublimable substance and lower than the boiling point of the sublimable substance, to the rear surface at the opposite side to the pattern forming surface of the substrate, and a second heating medium supplying step, executed after the first heating medium supplying step and, in which a second heating medium of a temperature not lower than the melting point of the sublimable substance, lower than the boiling point of the sublimable substance, and lower than the first heating medium, is supplied to the rear surface at the opposite side to the pattern forming surface of the substrate.

With the present method, in the temperature maintaining step, the second heating medium supplying step is executed after the first heating medium supplying step, and in the subsequent freezing step, the substrate cooling step is executed. That is, the processing liquid film is not cooled rapidly from the first temperature to the temperature not higher than the freezing point temperature of the sublimable substance in the freezing step but is cooled once from the first temperature to a second temperature lower than the first temperature in the temperature maintaining step and thereafter cooled from the second temperature to the temperature not higher than the freezing point temperature of the sublimable substance in the freezing step. The processing liquid film is thus cooled stepwise and therefore occurrence of a temperature non-uniformity in the processing liquid film in the process of cooling can be suppressed. Occurrence of a portion in the processing liquid film that is not frozen in the freezing step can thus be suppressed, and occurrence of non-uniformity of sublimation rate of the frozen body in the sublimating step after the freezing step can be suppressed.

In the preferred embodiment of the present invention, the freezing step includes a substrate cooling step of supplying a cooling medium to the rear surface at the opposite side to the pattern forming surface of the substrate to cool the processing liquid film to a temperature not higher than a freezing point of the sublimable substance via the substrate.

With the present method, the freezing step can be executed by a simple method of supplying the cooling medium to the rear surface of the substrate. The steps of the substrate processing method and the configuration of a substrate processing apparatus configured to perform the steps can thus be simplified.

In the preferred embodiment of the present invention, the temperature maintaining step includes a heater temperature adjusting step of adjusting the temperature of the processing liquid by heat transmitted to the substrate from a heater unit having a facing surface facing a rear surface at an opposite side to the pattern forming surface of the substrate. The heat generated by the heater unit can thus be transmitted uniformly to the portion of the rear surface of the substrate that faces the facing surface.

In the preferred embodiment of the present invention, the temperature maintaining step includes a heating medium supplying step of supplying a heating medium by a heating medium supplying unit to a rear surface at an opposite side to the pattern forming surface of the substrate, and the freezing step includes a cooling medium supplying step of supplying a cooling medium by a cooling medium supplying unit to the rear surface of the substrate. The substrate processing method further includes a step of controlling at least one of either of a timing of stopping the supply of the heating medium by the heating medium supplying unit and a timing of starting the supply of the cooling medium by the cooling medium supplying unit to adjust a film thinning period for the film thinning step and thereby control a film thickness of the processing liquid film after the film thinning step.

With the present method, the film thickness of the processing liquid film after the film thinning step can be adjusted by adjusting the film thinning period for the film thinning step by a simple method of controlling at least one of either of the heating medium supply stopping timing and the cooling medium supply starting timing. Consequently, the film thickness of the frozen body can be adjusted.

The adjustment of the film thinning period may be executed, more specifically, by setting the above timings and a timing of stopping the supply of the processing liquid by the processing liquid supplying step. For example, the timing of stopping the supply of the heating medium to a heating medium path or the timing of starting the supply of the cooling medium to a cooling medium path may be set to not earlier than (including at the same time as) a point at which the supply of the processing liquid by the processing liquid supplying step is stopped.

In the preferred embodiment of the present invention, the heating medium path and the cooling medium path share a piping at least partially. The configuration of the substrate processing apparatus configured to perform the substrate processing method can thereby be simplified further.

In the preferred embodiment of the present invention, the freezing step includes a substrate cooling step of making heat be transmitted from the substrate to a cooler unit having a facing surface facing the rear surface at the opposite side to the pattern forming surface of the substrate to cool the processing liquid film to a temperature not higher than a freezing point of the sublimable substance via the substrate. The heat of a portion of the rear surface of the substrate facing the facing surface of the cooler unit is thus removed uniformly by the cooler unit and the processing liquid film is cooled uniformly.

In the preferred embodiment of the present invention, the temperature maintaining step is started earlier than the processing liquid film forming step. The processing liquid is thus supplied in the processing liquid film forming step in a state where the substrate is heated in advance to the temperature range not lower than the melting point of the sublimable substance and lower than the boiling point of the sublimable substance. The freezing of the processing liquid film in the processing liquid film forming step can thus be suppressed further. Also, because the freezing of the processing liquid film in the processing liquid film forming step is suppressed, there is no need to remelt the frozen processing liquid film in the temperature maintaining step and a period of the temperature maintaining step can also be shortened.

In the preferred embodiment of the present invention, the processing liquid contains the sublimable substance, as a solute, and a solvent, and the temperature maintaining step includes a step of maintaining the temperature of the processing liquid film, formed on the pattern forming surface, lower than a boiling point of the solvent. Boiling of the solvent in the temperature maintaining step can thereby be suppressed. Scattering of the processing liquid on the pattern forming surface to an unintended location due to boiling can thus be suppressed or prevented.

In the preferred embodiment of the present invention, the substrate processing method further includes a preprocessing liquid supplying step of supplying a preprocessing liquid, which is miscible with the processing liquid, to the pattern forming surface. The processing liquid film forming step is executed after the preprocessing liquid supplying step.

With the present method, by mixing with the preprocessing liquid supplied in advance to the pattern forming surface of the substrate, the processing liquid can be spread smoothly across the pattern forming surface of the substrate.

In the preferred embodiment of the present invention, the substrate processing method further includes a dew condensation preventing step, executed in parallel to the sublimating step and preventing dew condensation on the pattern forming surface.

With the present method, even if the frozen body absorbs heat of vaporization in the process of sublimating and temperatures of the frozen body itself and the substrate decrease, dew condensation, due thereto, of moisture in the atmosphere on the frozen body and the pattern forming surface of the substrate can be prevented. Obstruction of sublimation of the frozen body by moisture dew-condensed on a front surface of the frozen body and pattern collapse due to surface tension generated by moisture dew-condensed on the pattern forming surface of the substrate can thus be suppressed.

In order to prevent dew condensation, for example, a step of supplying an inert gas to the pattern forming surface of the substrate, an atmosphere blocking step of blocking an atmosphere of a space in a vicinity of the pattern forming surface, a dehumidifying step of dehumidifying an atmosphere in a periphery of the substrate, etc., may be performed. With the step of supplying the inert gas, it is preferable to use a high-temperature inert gas of higher temperature than room temperature to improve the dew condensation preventing effect.

In the preferred embodiment of the present invention, the substrate processing method further includes a sublimation promoting step, executed in parallel to the sublimating step and promoting the sublimation of the frozen body.

With the present method, the frozen body can be sublimated in as short a period as possible to shorten a period of the sublimating step.

In order to promote the sublimation, for example, a depressurizing step of depressurizing the space in the vicinity of the pattern forming surface of the substrate, a rotation sublimation promoting step of rotating the substrate, an atmosphere heating step of heating an atmosphere in the vicinity of the pattern forming surface, etc., may be performed.

A preferred embodiment of the present invention provides a substrate processing apparatus used in the substrate processing method and being a substrate processing apparatus that includes a processing liquid supplying unit which supplies the processing liquid that contains the sublimable substance to the pattern forming surface of the substrate, a temperature maintaining unit which maintains the temperature of the processing liquid film, formed on the pattern forming surface of the substrate, at a temperature not lower than the melting point of the sublimable substance and lower than the boiling point of the sublimable substance, a film thinning unit which thins the processing liquid film, a freezing unit which makes the processing liquid film freeze on the pattern forming surface to form a frozen body, a sublimating unit which sublimates the frozen body to remove the frozen from the pattern forming surface, and a controller which is programmed to control the processing liquid supplying unit, the temperature maintaining unit, the film thinning unit, the freezing unit, and the sublimating unit to execute the respective steps of the substrate processing method.

With the present configuration, by maintaining the temperature of the processing liquid film in the above-stated temperature range in the temperature maintaining step, the processing liquid film can be suppressed from freezing and the processing liquid film before the freezing step can be maintained in the liquid phase. For example, even if the processing liquid film undergoes partial freezing in the processing liquid supplying step, it can be remelted and put in the liquid state in the temperature maintaining step.

Also, in the subsequent film thinning step, by thinning the processing liquid film while the temperature of the processing liquid film is in the above-stated temperature range and the freezing of the processing liquid film is not occurring, the film thickness of the frozen body formed in the freezing step can be adjusted.

The frozen body, which is made as low as possible in internal stress and moreover is adjusted appropriately in film thickness, can thus be formed on the pattern forming surface of the substrate in the freezing step.

Therefore, with the present configuration, by sublimating and thereby removing the frozen body in the subsequent sublimating step, the pattern forming surface of the substrate can be dried while suppressing pattern collapse.

A preferred embodiment of the present invention provides a substrate processing method including a processing liquid supplying step of supplying a processing liquid, containing a sublimable substance, to a pattern forming surface of a substrate, to form a processing liquid film on the pattern forming surface, a temperature maintaining step of maintaining a temperature of the processing liquid film, formed on the pattern forming surface of the substrate, in a temperature range not lower than a melting point of the sublimable substance and lower than a boiling point of the sublimable substance, a film thinning step of removing a portion of the processing liquid, constituting the processing liquid film, from the pattern forming surface after stopping the supply of the processing liquid by the processing liquid supplying step and while the temperature of the processing liquid film is in the temperature range to thin the processing liquid film, a freezing step of making the processing liquid film, thinned by the film thinning step, freeze on the pattern forming surface after the temperature maintaining step to form a frozen body, and a sublimating step of sublimating and thereby removing the frozen body from the pattern forming surface.

With the present method, by maintaining the temperature of the processing liquid film in the above-stated temperature range in the temperature maintaining step, the processing liquid film can be suppressed from freezing and the processing liquid film before the freezing step can be maintained in a liquid phase. For example, even if the processing liquid film undergoes partial freezing in a processing liquid supplying step, it can be remelted and put in a liquid state in the temperature maintaining step.

Also, in the subsequent film thinning step, by removing excess processing liquid film while the temperature of the processing liquid film is in the above-stated temperature range and freezing of the processing liquid film is not occurring, a film thickness of the frozen body formed in the freezing step can be adjusted.

The frozen body, which is made as low as possible in internal stress and moreover is adjusted appropriately in film thickness, can thus be formed on the pattern forming surface of the substrate in the freezing step.

Therefore, with the present method, by sublimating and thereby removing the frozen body in the subsequent sublimating step, the pattern forming surface of the substrate can be dried while suppressing pattern collapse.

In the preferred embodiment of the present invention, the temperature maintaining step includes a substrate temperature adjusting step of putting a heating medium in contact with a rear surface at an opposite side to the pattern forming surface of the substrate to adjust the temperature of the processing liquid film, formed on the pattern forming surface, via the substrate.

With the present method, the temperature maintaining step can be executed by a simple method of supplying the heating medium to the rear surface of the substrate. The configuration of a substrate processing apparatus configured to perform the substrate processing method can thus be simplified.

In the preferred embodiment of the present invention, the substrate temperature adjusting step is started earlier than a start of the processing liquid supplying step.

With the present method, by executing the processing liquid supplying step in a state where the substrate is heated in advance by supplying the heating medium to the rear surface of the substrate, the freezing of the processing liquid film in the processing liquid supplying step can be suppressed further. Also, because the freezing of the processing liquid film in the processing liquid supplying step is suppressed, there is no need to remelt the frozen processing liquid film in the temperature maintaining step and a period of the temperature maintaining step can also be shortened.

In the preferred embodiment of the present invention, the freezing step includes a substrate cooling step of putting a cooling medium, of a temperature not higher than a freezing point of the sublimable substance, in contact with the rear surface at the opposite side to the pattern forming surface of the substrate to cool the processing liquid film via the substrate.

With the present method, the freezing step can be executed by a simple method of supplying the cooling medium to the rear surface of the substrate. The steps of the substrate processing method and the configuration of the substrate processing apparatus configured to perform the steps can thus be simplified.

In the preferred embodiment of the present invention, the temperature maintaining step includes a heating medium supplying step of supplying a heating medium by a heating medium supplying unit to the rear surface at the opposite side to the pattern forming surface of the substrate and the freezing step includes a cooling medium supplying step of supplying a cooling medium by a cooling medium supplying unit to the rear surface of the substrate. The substrate processing method further includes a step of controlling at least one of either of a timing of stopping the supply of the heating medium by the heating medium supplying unit and a timing of starting the supply of the cooling medium by the cooling medium supplying unit to adjust a film thinning period for the film thinning step and thereby control a film thickness of the processing liquid film after the film thinning step.

With the present method, the film thickness of the processing liquid film after the film thinning step can be adjusted by adjusting the film thinning period for the film thinning step by a simple method of controlling at least one of either of the heating medium supply stopping timing and the cooling medium supply starting timing. Consequently, the film thickness of the frozen body can be adjusted.

The adjustment of the film thinning period may be executed, more specifically, by setting the above timings and a timing of stopping the supply of the processing liquid by the processing liquid supplying step.

For example, the timing of stopping the supply of the heating medium to a heating medium path or the timing of starting the supply of the cooling medium to a cooling medium path may be set to not earlier than (including at the same time as) a point at which the supply of the processing liquid by the processing liquid supplying step is stopped.

In the preferred embodiment of the present invention, the heating medium path and the cooling medium path share a piping at least partially.

By the present method, the configuration of the substrate processing apparatus configured to perform the substrate processing method can be simplified further.

In the preferred embodiment of the present invention, the film thinning step includes a substrate rotating step of horizontally holding and rotating the substrate.

With the present method, the processing liquid film can be thinned by a simple method of rotating the substrate to remove the excess processing liquid by a centrifugal force.

In the preferred embodiment of the present invention, the substrate processing method further includes a preprocessing liquid supplying step of supplying a preprocessing liquid, which is miscible with the processing liquid, to the pattern forming surface. The processing liquid supplying step is executed after the preprocessing liquid supplying step.

With the present method, respective steps of a drying processing can be executed with the processing liquid being spread smoothly across the pattern forming surface of the substrate by mixing it with the preprocessing liquid supplied in advance to the pattern forming surface of the substrate.

In the preferred embodiment of the present invention, the substrate processing method further includes a dew condensation preventing step, executed in parallel to the sublimating step and preventing dew condensation on the pattern forming surface of the substrate.

With the present method, even if the frozen body absorbs heat of vaporization in the process of sublimating and temperatures of the frozen body itself and the substrate decrease, dew condensation, due thereto, of moisture in the atmosphere on the frozen body and the pattern forming surface of the substrate can be prevented. Obstruction of sublimation of the frozen body by moisture dew-condensed on a front surface of the frozen body and pattern collapse due to surface tension generated by moisture dew-condensed on the pattern forming surface of the substrate can thus be suppressed.

In order to prevent dew condensation, for example, a step of supplying an inert gas to the pattern forming surface of the substrate, an atmosphere blocking step of blocking an atmosphere of a space in a vicinity of the pattern forming surface, a dehumidifying step of dehumidifying an atmosphere in a periphery of the substrate, etc., may be performed. With the step of supplying the inert gas, it is preferable to use a high-temperature inert gas of higher temperature than room temperature to improve the dew condensation preventing effect.

In the preferred embodiment of the present invention, the substrate processing method further includes a sublimation promoting step, executed in parallel to the sublimating step and promoting the sublimation of the frozen body.

With the present method, the frozen body can be sublimated in as short a period as possible to shorten a period of the sublimating step.

In order to promote the sublimation, for example, a depressurizing step of depressurizing the space in the vicinity of the pattern forming surface of the substrate, a substrate rotating step of rotating the substrate, an atmosphere heating step of heating an atmosphere in the vicinity of the pattern forming surface, etc., may be performed.

A preferred embodiment of the present invention provides a substrate processing apparatus used in the substrate processing method and being a substrate processing apparatus that includes a processing liquid supplying unit which supplies the processing liquid that contains the sublimable substance to the pattern forming surface of the substrate, a temperature maintaining unit which maintains the temperature of the processing liquid film, formed on the pattern forming surface of the substrate, at a temperature not lower than the melting point of the sublimable substance and lower than the boiling point of the sublimable substance, a film thinning unit which removes a portion of the processing liquid, constituting the processing liquid film, from the pattern forming surface to thin the processing liquid film, a freezing unit which makes the processing liquid film freeze on the pattern forming surface to form the frozen body, a sublimating unit which sublimates the frozen body to remove the frozen body from the pattern forming surface, and a controller which is programmed to control the processing liquid supplying unit, the temperature maintaining unit, the film thinning unit, the freezing unit, and the sublimating unit to execute the respective steps of the substrate processing method.

With the present configuration, by maintaining the temperature of the processing liquid film in the above-stated temperature range in the temperature maintaining step, the processing liquid film can be suppressed from freezing and the processing liquid film before the freezing step can be maintained in the liquid phase. For example, even if the processing liquid film undergoes partial freezing in the processing liquid supplying step, it can be remelted and put in the liquid state in the temperature maintaining step.

Also, in the subsequent film thinning step, by removing the excess processing liquid while the temperature of the processing liquid film is in the above-stated temperature range and the freezing of the processing liquid film is not occurring, the film thickness of the frozen body formed in the freezing step can be adjusted.

The frozen body, which is made as low as possible in internal stress and moreover is adjusted appropriately in film thickness, can thus be formed on the pattern forming surface of the substrate in the freezing step.

Therefore, with the present configuration, by sublimating and thereby removing the frozen body in the subsequent sublimating step, the pattern forming surface of the substrate can be dried while suppressing pattern collapse.

A preferred embodiment of the present invention provides a substrate processing method including a mixed liquid film forming step of supplying, to a front surface of a substrate, a mixed processing liquid, being a mixed processing liquid, in which a first sublimable substance and a first additive, differing from the first sublimable substance, are mixed, and being lower in freezing point than the first sublimable substance, to form a liquid film of the mixed processing liquid on the front surface of the substrate, a freezing step of making the liquid film of the mixed processing liquid freeze to form a frozen body, and a sublimating step of sublimating and removing the first sublimable substance, contained in the frozen body, from the front surface of the substrate.

With the present method, due to freezing point depression by the mixing of the first sublimable substance and the first additive, a freezing point of the mixed processing liquid is lower than the freezing point of the first sublimable substance. That is, under a temperature condition not higher than the freezing point of the first sublimable substance, the mixed processing liquid does not freeze and is maintained in a liquid state. Therefore, even when the mixed liquid film forming step is performed under such temperature condition, the liquid film of the mixed processing liquid can be formed satisfactorily without separately providing a temperature adjusting mechanism arranged to prevent the freezing of the mixed processing liquid. The frozen body can then be formed in the freezing step subsequent the mixed liquid film forming step. Also, in the subsequent sublimating step, the frozen body can be removed from the front surface of the substrate by sublimating the first sublimable substance contained in the frozen body.

Therefore, unintended freezing of the mixed processing liquid (processing liquid with a sublimating property) can be avoided while suppressing cost increase and the front surface of the substrate can be processed satisfactorily.

In the preferred embodiment of the present invention, the freezing point of the first sublimable substance is higher than ordinary temperature and the freezing point of the mixed processing liquid is lower than ordinary temperature.

With the present method, due to freezing point depression by the mixing of the first sublimable substance and the first additive, the freezing point of the mixed processing liquid is lower than ordinary temperature. That is, under ordinary temperature, the mixed processing liquid does not freeze and is maintained in a liquid state. Therefore, even when the mixed liquid film forming step is performed under an ordinary temperature environment, the liquid film of the mixed processing liquid can be formed satisfactorily. The frozen body can then be formed in the freezing step subsequent the mixed liquid film forming step. Also, in the subsequent sublimating step, the frozen body can be removed from the front surface of the substrate by sublimating the first sublimable substance contained in the frozen body.

Therefore, unintended freezing of the mixed processing liquid (processing liquid with a sublimating property) can be avoided under an ordinary temperature environment while suppressing cost increase and the front surface of the substrate can be processed satisfactorily.

In the preferred embodiment of the present invention, the first additive includes a solvent without a sublimating property. In this case, the solvent may include an alcohol or water.

With the present method, the freezing point of the mixed processing liquid can be decreased using a comparatively inexpensive solvent. Cost reduction can thus be achieved.

In the preferred embodiment of the present invention, the first additive includes a second sublimable substance.

With the present method, in the case of the second sublimable substance, sublimation occurs without passing through a liquid state. Remaining of liquid after the sublimating step can thus be prevented reliably.

As stated for the preferred embodiment of the present invention, the freezing point of the first additive may be lower than the freezing point of the first sublimable substance.

In the preferred embodiment of the present invention, the substrate processing method further includes a mixed liquid preparing step of mixing the first sublimable substance and the first additive to prepare the mixed processing liquid. In this case, the mixed liquid film forming step may include a step of supplying the mixed processing liquid, prepared by the mixed liquid preparing step, to the front surface of the substrate.

With the present method, the mixed processing liquid can be formed during the substrate processing. Just the necessary amount of the mixed processing liquid can be prepared.

In the preferred embodiment of the present invention, the freezing step includes a step of supplying a mixed cooling medium, which is a mixed cooling medium with a cooling medium and a second additive being mixed and is lower in freezing point than the cooling medium, to a rear surface at an opposite side to the front surface of the substrate to cool the liquid film of the mixed processing liquid.

With the present method, due to freezing point depression by the mixing of the cooling medium and the second additive, the freezing point of the mixed cooling medium is lower than the freezing point of the cooling medium. That is, even under a temperature lower than the freezing point of the cooling medium, the mixed cooling medium is maintained in a liquid state. The mixed cooling medium of liquid state, which is maintained at a temperature lower than the freezing point of the cooling medium, can thus be supplied to the rear surface of the substrate. The liquid film of the mixed processing liquid can thus be cooled to a lower temperature in the freezing step.

In this case, the second additive may be the same as the first additive.

In the preferred embodiment of the present invention, the substrate processing method further includes a film thinning step of thinning the liquid film of the mixed processing liquid while a temperature of the liquid film of the mixed processing liquid is in a temperature range not lower than the freezing point of the mixed processing liquid and lower than a boiling point of the mixed processing liquid. In this case, the freezing step may include a step of freezing the liquid film of the mixed processing liquid thinned by the film thinning step.

With the present method, the frozen body formed in the freezing step can be reduced in film thickness by thinning the liquid film of the mixed liquid in the film thinning step.

The frozen body, which is made as low as possible in internal stress and moreover is adjusted appropriately in film thickness, can thus be formed on the front surface of the substrate in the freezing step.

A preferred embodiment of the present invention provides a substrate processing apparatus including a mixed processing liquid supplying unit which supplies to a front surface of a substrate, a mixed processing liquid, being a mixed processing liquid, in which a first sublimable substance and a first additive, differing from the first sublimable substance, are mixed, and being lower in freezing point than the first sublimable substance, a freezing unit which solidifies a liquid film of the mixed processing liquid freeze, and a controller which controls the mixed processing liquid supplying unit and the freezing unit.

The controller is programmed to execute a mixed liquid film forming step of supplying the mixed processing liquid to the front surface of the substrate by the mixed processing liquid supplying unit to form the liquid film of the mixed processing liquid on the front surface of the substrate, a freezing step of making the liquid film of the mixed processing liquid freeze by the freezing unit to form a frozen body, and a sublimating step of sublimating and removing the first sublimable substance, contained in the frozen body, from the front surface of the substrate.

With the present configuration, due to freezing point depression by the mixing of the first sublimable substance and the first additive, the freezing point of the mixed processing liquid is lower than the freezing point of the first sublimable substance. That is, under a temperature condition not higher than the freezing point of the first sublimable substance, the mixed processing liquid does not freeze and is maintained in a liquid state. Therefore, even when the mixed liquid film forming step is performed under such temperature condition, the liquid film of the mixed processing liquid can be formed satisfactorily. The frozen body can then be formed in the freezing step subsequent the mixed liquid film forming step. Also, in the subsequent sublimating step, the frozen body can be removed from the front surface of the substrate by sublimating the first sublimable substance contained in the frozen body.

Therefore, unintended freezing of the mixed processing liquid (processing liquid with a sublimating property) can be avoided while suppressing cost increase and the front surface of the substrate can be processed satisfactorily.

The aforementioned or yet other objects, features, and effects of the present invention will be clarified by the following description of preferred embodiments with reference to the accompanying drawings.

BRIEF DESCRIPTION OF THE DRAWINGS

FIG. 5A to FIG. 5H are illustrative sectional views for describing conditions of the substrate processing.

DETAILED DESCRIPTION OF THE PREFERRED EMBODIMENTS

First Preferred Embodiment

Figure 1:
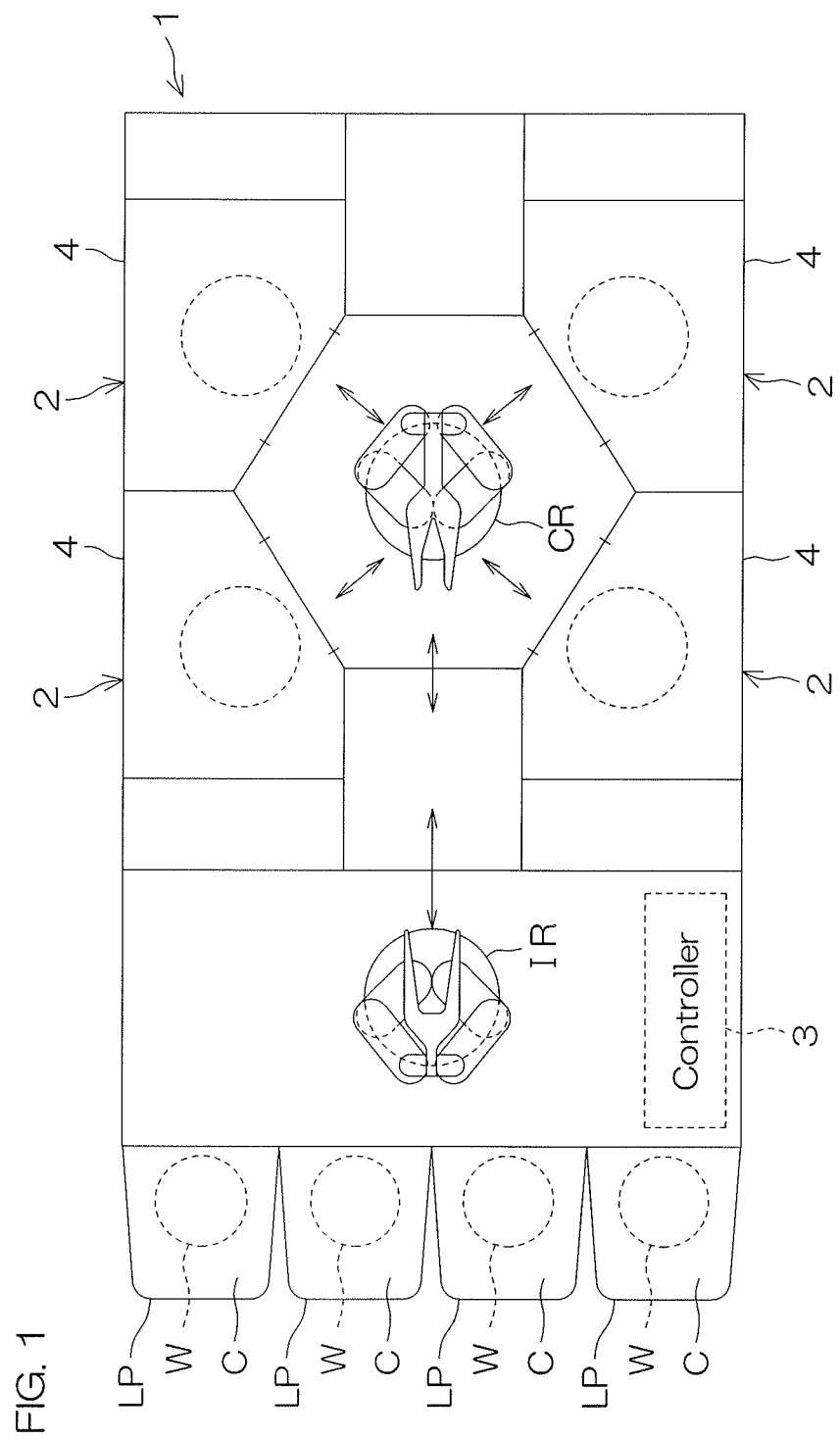
FIG. 1 is an illustrative plan view of a layout of a substrate processing apparatus according to a first preferred embodiment of the present invention.

FIG. 1 is an illustrative plan view of a layout of a substrate processing apparatus 1 according to a first preferred embodiment of the present invention. The substrate processing apparatus 1 is a single substrate processing type apparatus that processes substrates W, such as silicon wafers, etc., one at a time. The substrate processing apparatus is located inside a clean room. In the present preferred embodiment, the substrate W is a disk-shaped substrate.

The substrate processing apparatus 1 includes a plurality of processing units 2 that process the substrates W, load ports LP in which are placed carriers C that house the plurality of substrates W to be processed by the processing units 2, transfer robots IR and CR transferring the substrates W between the load ports LP and the processing units 2, and a controller 3 controlling the substrate processing apparatus 1.

The transfer robot IR transfers the substrates W between the carriers C and the transfer robot CR. The transfer robot CR transfers the substrates W between the transfer robot IR and the processing units 2. The plurality of processing units 2 have, for example, the same configuration.

Figure 2:
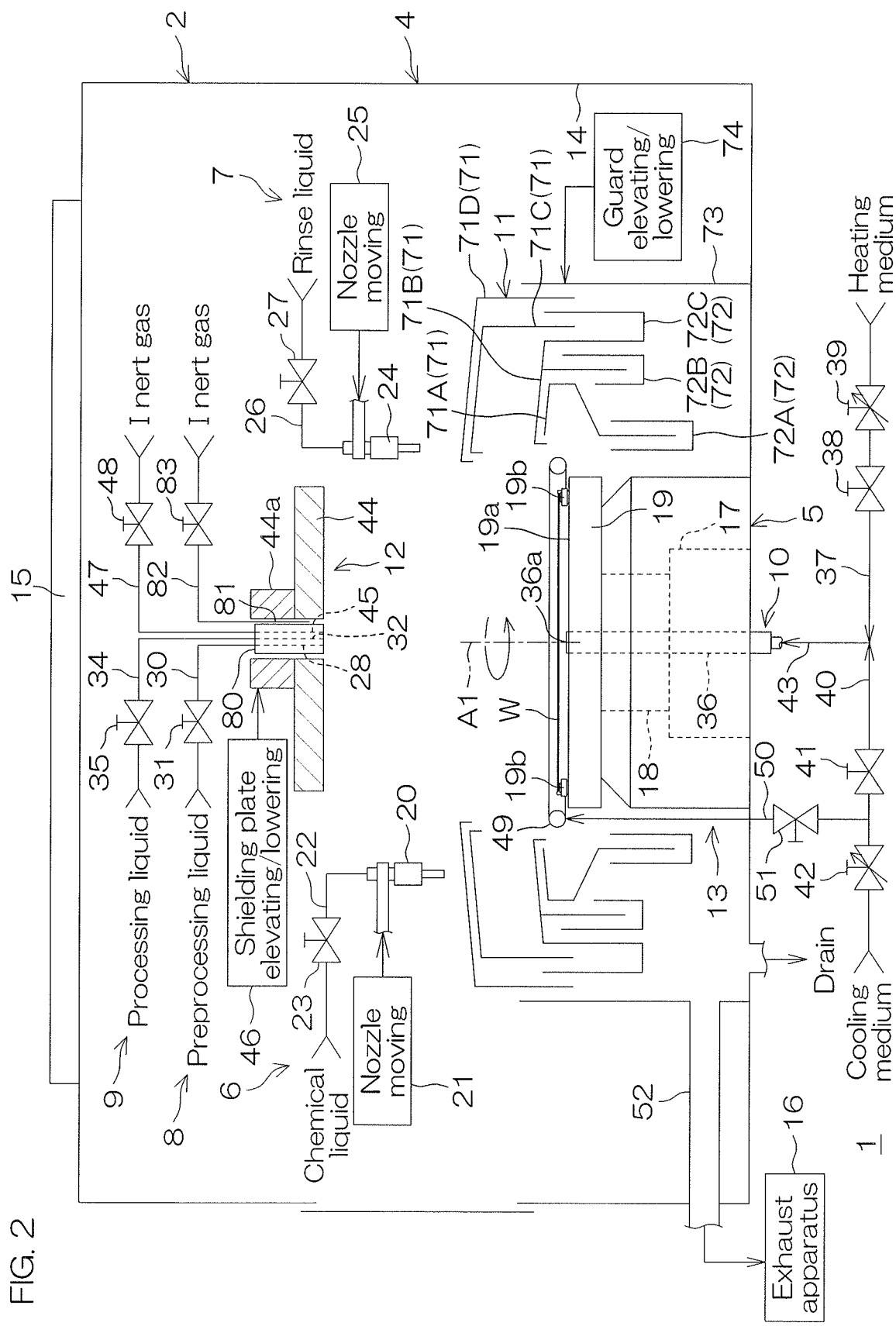
FIG. 2 is a schematic sectional view of the general configuration of a processing unit included in the substrate processing apparatus.

FIG. 2 is a schematic sectional view of the general configuration of the processing unit 2 included in the substrate processing apparatus 1.

The processing unit 2 includes a box-shaped chamber 4, having an internal space, and a spin chuck 5, rotating a single substrate W around a vertical rotational axis A1 passing through a center of the substrate W while holding the substrate W in a horizontal orientation inside the chamber 4.

The processing unit 2 further includes a chemical liquid supplying unit 6, supplying a chemical liquid to a pattern forming surface that is an upper surface of the substrate W held by the spin chuck 5, and a rinse liquid supplying unit 7, supplying a rinse liquid to the pattern forming surface of the substrate W held by the spin chuck 5.

The processing unit 2 further includes a preprocessing liquid supplying unit 8, supplying a preprocessing liquid, which is miscible with a processing liquid, to the pattern forming surface of the substrate W held by the spin chuck 5, and a processing liquid supplying unit 9, supplying a processing liquid containing a sublimable substance to the pattern forming surface of the substrate W held by the spin chuck 5.

The processing unit 2 further includes a rear surface supplying unit 10, supplying a temperature adjusting medium to a rear surface at an opposite side to the pattern forming surface of the substrate W held by the spin chuck 5, and a cylindrical processing cup 11, surrounding the spin chuck 5. The temperature adjusting medium refers to a fluid for adjusting, via the substrate W, a temperature of the processing liquid on the pattern forming surface of the substrate W. The temperature adjusting medium includes a heating medium and a cooling medium. The heating medium refers to a fluid for heating the processing liquid on the pattern forming surface of the substrate W. The cooling medium refers to a fluid for cooling the processing liquid on the pattern forming surface of the substrate W.

The processing unit 2 further includes a first dew condensation preventing unit 12 and a second dew condensation preventing unit 13 that execute a dew condensation preventing step of preventing dew condensation from occurring on the pattern forming surface of the substrate W when a frozen body of the sublimable substance is sublimated.

The chamber 4 includes a box-shaped partition wall 14, an FFU (fan filter unit) 15 as a blower unit feeding clean air from an upper portion of the partition wall 14 into an interior of the partition wall 14 (corresponding to an interior of the chamber 4), and an exhaust apparatus 16, exhausting gas inside the chamber 4 from a lower portion of the partition wall 14.

As the spin chuck 5, a clamping type chuck, which clamps the substrate W in horizontal directions to hold the substrate W horizontally, is adopted. Specifically, the spin chuck 5 includes a spin motor 17, a spin shaft 18, made integral to a drive shaft of the spin motor 17, and a disk-shaped spin base 19, mounted substantially horizontally on an upper end of the spin shaft 18. The spin shaft 18 is formed to be hollow in the present preferred embodiment.

The spin base 19 includes a horizontal, circular upper surface 19*a*, having an outer diameter larger than an outer diameter of the substrate W. A plurality (not less than three; for example, four) of clamping members 19*b* are disposed at a peripheral edge portion of the upper surface 19*a*. At the peripheral edge portion of the upper surface 19*a* of the spin base 19, the plurality of clamping members 19*b* are disposed at suitable intervals, for example, at equal intervals on a circumference corresponding to an outer peripheral shape of the substrate W.

The spin chuck 5 is an example of a film thinning unit that executes a film thinning step of horizontally holding and rotating the substrate W to thin a processing liquid film formed on the pattern forming surface of the substrate W. The spin chuck 5 is also an example of a sublimation promoting unit that executes a sublimation promoting step of promoting the sublimation of the frozen body by rotating the substrate when the frozen body is sublimated.

The chemical liquid supplying unit 6 includes a chemical liquid supply nozzle 20. The chemical liquid supply nozzle 20 is moved by a first nozzle moving mechanism 21. The chemical liquid supply nozzle 20 is moved between a central position and a retracted position. When positioned at the central position, the chemical liquid supply nozzle 20 faces a rotation center position of the pattern forming surface of the substrate W. When positioned at the retracted position, the chemical liquid supply nozzle 20 does not face the pattern forming surface of the substrate W. The rotation center position of the pattern forming surface of the substrate W is a position of intersection of the rotational axis A1 in the pattern forming surface of the substrate W. The retracted position is a position at an outer side of the spin base 19 in plan view.

A chemical liquid supply pipe 22 is connected to the chemical liquid supply nozzle 20. The chemical liquid supply pipe 22 has interposed therein a valve 23 that opens and closes its flow passage.

An etching liquid and a cleaning liquid are specific examples of the chemical liquid. More specifically, the chemical liquid may be hydrofluoric acid, SC1 solution (ammonia-hydrogen peroxide mixture), SC2 solution (hydrochloric acid-hydrogen peroxide mixture), ammonium fluoride, buffered hydrofluoric acid (mixed liquid of hydrofluoric acid and ammonium fluoride), etc.

The rinse liquid supplying unit 7 includes a rinse liquid supply nozzle 24. The rinse liquid supply nozzle 24 is moved by a second nozzle moving mechanism 25. The rinse liquid supply nozzle 24 is moved between a central position and a retracted position. When positioned at the central position, the rinse liquid supply nozzle 24 faces the rotation center position of the pattern forming surface of the substrate W. When positioned at the retracted position, the rinse liquid supply nozzle 24 does not face the pattern forming surface of the substrate W.

A rinse liquid supply pipe 26 is connected to the rinse liquid supply nozzle 24. The rinse liquid supply pipe 26 has interposed therein a valve 27 that opens and closes its flow passage.

A specific example of the rinse liquid is, for example, deionized water (DIW). The rinse liquid is not restricted to DIW and may be any of carbonated water, electrolyzed ion water, hydrogen water, ammonia water, ozone water, and aqueous hydrochloric acid solution of dilute concentration (for example, of approximately 10 to 100 ppm).

The preprocessing liquid supplying unit 8 includes a preprocessing liquid supply nozzle 28. A preprocessing liquid supply pipe 30 is connected to the preprocessing liquid supply nozzle 28. The preprocessing liquid supply pipe 30 has interposed therein a valve 31 that opens and closes its flow passage.

As the preprocessing liquid, a solvent, etc., that is miscible with the processing liquid is used. By supplying the processing liquid in a state where the preprocessing liquid is supplied to and spread across the pattern forming surface of the substrate W in advance, the processing liquid can be spread smoothly across the pattern forming surface of the substrate W.

Especially in the preferred embodiment, it is preferable to use a solvent, which is miscible with both the rinse liquid and the processing liquid, as the preprocessing liquid. By using such a preprocessing liquid, the rinse liquid that is supplied in a prior step and remains on the pattern forming surface of the substrate W can be replaced smoothly with the processing liquid via the preprocessing liquid. The processing liquid can thus be spread more smoothly across the pattern forming surface of the substrate W.

For example, an organic solvent represented by isopropyl alcohol (IPA) is a specific example of a preprocessing liquid that is miscible with both a water-based rinse liquid and a processing liquid that contains a fluorohydrocarbon compound, and various solvents miscible with both water and the processing liquid may be used.

The processing liquid supplying unit 9 includes a processing liquid supply nozzle 32. A processing liquid supply pipe 34 is connected to the processing liquid supply nozzle 32. The processing liquid supply pipe 34 has interposed therein a valve 35 opens and closes its flow passage.

As the processing liquid, the processing liquid containing the sublimable substance is used. As the processing liquid containing the sublimable substance, for example, that containing the sublimable substance in a molten state, such as a melt of the sublimable substance, etc., or a solution, in which the sublimable substance is dissolved as a solute in a solvent, etc., may be used. Here, "molten state" refers to a state where the sublimable substance has fluidity due to being molten completely or partially and assumes a liquid state.

As the sublimable substance, any of various substances that is high in vapor pressure at a first ordinary temperature and changes from a solid phase to a gas phase without passing through a liquid phase is used. The first ordinary temperature is a temperature inside the clean room in a state where the temperature is not adjusted, and is a temperature inside the processing unit 2 in a state where the temperature is not adjusted. The first ordinary temperature is, for example, 5° C. to 35° C.

The rear surface supplying unit 10 includes a rear surface supply nozzle 36. The rear surface supply nozzle 36 is inserted through the hollow spin shaft 18 and has a discharge port 36*a*, facing a center of the rear surface of the substrate W, at an upper end.

In the present preferred embodiment, the rear surface supply nozzle 36 supplies the temperature adjusting medium from the discharge port 36*a* toward a central position of the rear surface of the substrate W while the substrate W is being rotated. The supplied temperature adjusting medium spreads across substantially an entirety of the rear surface of the substrate W due to an action of a centrifugal force. If the supplied temperature adjusting medium is the heating medium, the substrate W and the processing liquid film formed on the pattern forming surface of the substrate W are heated. Also, if the supplied temperature adjusting medium is the cooling medium, the processing liquid film is cooled. A rotation center position of the rear surface of the substrate W is a position of intersection of the rotational axis A1 in the rear surface of the substrate W.

A heating medium supply pipe 37 is connected to the rear surface supply nozzle 36. The heating medium supply pipe 37 has interposed therein a valve 38 that opens and closes its flow passage and a valve 39 adjusting a flow rate of the heating medium flowing through the heating medium supply pipe 37.

Also, a cooling medium supply pipe 40 is further connected to the rear surface supply nozzle 36. The cooling medium supply pipe 40 has interposed therein a valve 41 that opens and closes its flow passage and a valve 42 adjusting a flow rate of the cooling medium flowing through the cooling medium supply pipe 40.

The heating medium supply pipe 37 and the cooling medium supply pipe 40 are connected to the rear surface supply nozzle 36 via a common piping 43.

The rear surface supplying unit 10 is an example of a heating medium supplying unit that executes a temperature maintaining step of maintaining a temperature of the processing liquid film, formed on the pattern forming surface of the substrate W, in a temperature range (melting temperature range) not lower than a melting point of the sublimable substance and lower than a boiling point of the sublimable substance. The heating medium supply pipe 37, the common piping 43, and the rear surface supply nozzle 36 constitute a heating medium path of the heating medium supplying unit.

The rear surface supplying unit 10 is also an example of a cooling medium supplying unit that executes a freezing step of making the processing liquid film, thinned by the film thinning step, freeze on the pattern forming surface of the substrate W to form the frozen body of the sublimable substance. The cooling medium supply pipe 40, the common piping 43, and the rear surface supply nozzle 36 constitute a cooling medium path of the cooling medium supplying unit.

The heating medium path and the cooling medium path share the common piping 43 and the rear surface supply nozzle 36. That is, the heating medium path and cooling medium path share a piping at least partially. The configuration of the substrate processing apparatus 1 can thus be simplified.

An example of the heating medium is DIW heated to the melting temperature range. An example of the cooling medium is DIW cooled to a temperature range (freezing temperature range) not higher than a freezing point (melting point) of the sublimable substance.

The processing cup 11 is disposed further outward (in a direction away from the rotational axis A1) than the substrate W held by the spin chuck 5. The processing cup 11 surrounds the spin base 19.

The processing cup 11 includes a plurality of guards 71, receiving liquid (the chemical liquid, the rinse liquid, the preprocessing liquid, or the processing liquid) scattered outward from a peripheral edge of the substrate W held by the spin chuck 5, a plurality of cups 72, receiving the liquid guided downward by the plurality of guards 71, and an outer wall member 73 of circular cylindrical shape that surrounds the plurality of guards 71 and the plurality of cups 72. With the present preferred embodiment, an example where four guards 71 (a first guard 71A, a second guard 71B, a third guard 71C, and a fourth guard 71D) and three cups 72 (a first cup 72A, a second cup 72B, and a third cup 72C) are provided is illustrated.

Each of the cups 72 has an upwardly-open, groove-shaped form. Each of the guards 71 surrounds the spin base 19. The first guard 71A, the second guard 71B, the third guard 71C, and the fourth guard 71D are disposed in that order from an inner side. The first cup 72A receives the liquid guided downward by the first guard 71A. The second cup 72B receives the liquid guided downward by the second guard 71B. The third guard 72C is formed integral to the second guard 71B and receives the liquid guided by the third guard 71C.

The processing unit 2 includes a guard elevating/lowering mechanism 74 that elevates and lowers each of the four guards 71 separately. The guard elevating/lowering mechanism 74 elevates and lowers each guard 71 between a lower position and an upper position. Each guard 71 is positioned laterally to the substrate W in an entirety of a movable range between the upper position and the lower position. The upper position and the lower position are included in the movable range.

The guard elevating/lowering mechanism 74 includes, for example, a ball-screw mechanism (not shown), mounted to each guard 71, and a motor (not shown), applying a driving force to each ball screw.

The guard elevating/lowering mechanism 74 elevates and lowers the plurality of guards 71 such that when mainly the chemical liquid scatters from the substrate W, the liquid scattering from the substrate W is received by the second guard 71B (see FIG. 5A described below).

The guard elevating/lowering mechanism 74 elevates and lowers the plurality of guards 71 such that when mainly the rinse liquid scatters from the substrate W, the liquid scattering from the substrate W is received by the first guard 71A (see FIG. 5B described below).

The guard elevating/lowering mechanism 74 elevates and lowers the plurality of guards 71 such that when mainly the processing liquid scatters from the substrate W, the liquid scattering from the substrate W is received by the third guard 71C (see FIG. 5E to FIG. 5G described below).

The guard elevating/lowering mechanism 74 elevates and lowers the plurality of guards 71 such that when the pattern forming surface of the substrate W is being dried and when mainly the preprocessing liquid scatters from the substrate W, the liquid scattering from the substrate W is received by the fourth guard 71D (see FIG. 5C, FIG. 5D, and FIG. 5H described below). The liquid received by the guards 71 is fed to an unillustrated recovery apparatus or waste liquid apparatus.

The first dew condensation preventing unit 12 includes a shielding plate 44, facing the pattern forming surface of the substrate W and shielding an atmosphere between itself and the substrate W from an ambient atmosphere, and a first inert gas nozzle 45, supplying an inert gas to a central region of the pattern forming surface of the substrate W.

The shielding plate 44 is formed to a disk shape having a diameter substantially equal to or a diameter not less than that of the substrate W. The shielding plate 44 is disposed horizontally above the spin chuck 5. A hollow shaft 44a is fixed to a center of an upper surface of the shielding plate 44. The hollow shaft 44a extends in a vertical direction along the rotational axis A1.

A shielding plate elevating/lowering mechanism 46, which elevates and lowers the hollow shaft 44a along the vertical direction to elevate and lower the shielding plate 44 fixed to the hollow shaft 44a, is connected to the hollow shaft 44a. The shielding plate elevating/lowering mechanism 46 can elevate and lower the shielding plate 44 between a proximity position (see FIG. 5H described below) and a separated position (see FIG. 5A described below). When the shielding plate 44 is positioned at the proximity position, a lower surface of the shielding plate 44, facing the pattern forming surface of the substrate W, is put in proximity to the pattern forming surface of the substrate W. The separated position is a position higher than the proximity position.

In the state where the shielding plate 44 is lowered to the proximity position, the atmosphere between the lower surface of the shielding plate 44 and the pattern forming surface of the substrate W is shielded from the ambient atmosphere. The shielding plate 44 can thereby suppress liquid, splashing back from the guards 71, from entering between the pattern forming surface of the substrate W and the lower surface of the shielding plate 44. Further, when sublimating the frozen body formed on the pattern forming surface of the substrate W, an amount of moisture contained in an atmosphere in contact with the frozen body can be restricted. The dew condensation of the moisture in the atmosphere on the frozen body and the pattern forming surface of the substrate can then be prevented.

A first inert gas supply pipe 47 is connected to the first inert gas nozzle 45. The first inert gas supply pipe 47 has interposed therein a valve 48 that opens and closes its flow passage.

A specific example of the inert gas is, for example, nitrogen gas ($N_2$). The inert gas refers to a gas that is inert to the front surface and the pattern of the substrate W. The inert gas is not restricted to nitrogen gas and may, for example, be a noble gas, such as argon, etc. In particular, it is preferable to use a high-temperature inert gas of higher temperature than room temperature to improve the effect of preventing the dew condensation. Room temperature is a temperature inside the clean room and is a temperature inside the processing unit 2.

In the present preferred embodiment, the preprocessing liquid supply nozzle 28, the processing liquid supply nozzle 32, and the first inert gas nozzle 45 are housed in common in a nozzle housing member 80, extending in the vertical direction along the rotational axis A1 and inserted through the hollow shaft 44a. A lower end portion of the nozzle housing member 80 faces the central region of the upper surface of the substrate W. By making the preprocessing liquid be discharged from a discharge port of the preprocessing liquid supply nozzle 28, the preprocessing liquid is supplied to the central region of the pattern forming surface of the substrate W. Similarly, by making the processing liquid be discharged from a discharge port of the processing liquid supply nozzle 32, the processing liquid is supplied to the central region of the pattern forming surface of the substrate W.

Each of the preprocessing liquid supply nozzle 28, the processing liquid supply nozzle 32, and the first inert gas nozzle 45 has a discharge port facing the pattern forming surface of the substrate W at a lower end. The preprocessing liquid supply nozzle 28, the processing liquid supply nozzle 32, and the first inert gas nozzle 45 are elevated and lowered together with the shielding plate 44 fixed to the hollow shaft 44a.

By lowering the shielding plate 44, the discharge port of the first inert gas nozzle 45 is made to face the rotation center position of the pattern forming surface of the substrate W at the proximity position, at which the lower surface of the shielding plate 44 is put in proximity to the pattern forming surface of the substrate W. By the inert gas being discharged from the discharge port of the first inert gas nozzle 45 in this state, the inert gas is supplied to the central region of the pattern forming surface of the substrate W. The supplied inert gas spreads outward in the atmosphere between the lower surface of the shielding plate 44 and the pattern forming surface of the substrate W from the central region of the pattern forming surface of the substrate W and is exhausted out of the atmosphere from a peripheral edge of the pattern forming surface of the substrate W.

The atmosphere between the lower surface of the shielding plate 44 and the pattern forming surface of the substrate W that is shielded from the atmosphere of the periphery by the shielding plate 44 is thereby dehumidified. The moisture in the atmosphere can thus be prevented from dew-condensing on the frozen body and the pattern forming surface of the substrate when sublimating the frozen body formed on the pattern forming surface of the substrate W. Especially when the high-temperature inert gas is supplied, an atmosphere in the vicinity of the pattern forming surface of the substrate W is warmed and the effect of preventing the dew condensation is improved.

Also, by the inert gas being made to flow on a front surface of the frozen body, the sublimation of the frozen body is promoted. Especially when the high-temperature inert gas is supplied, the atmosphere in the vicinity of the pattern forming surface of the substrate W is warmed and the sublimation of the frozen body is promoted further. The first inert gas nozzle 45, the first inert gas supply pipe 47, and the valve 48 are thus also an example of the sublimation promoting unit that executes the sublimation promoting step of promoting the sublimation of the frozen body.

The second dew condensation preventing unit 13 includes an annular cooling pipe 49, which, inside the processing cup 11, surrounds the spin base 19 and is disposed further outward (in the direction away from the rotational axis A1) than the substrate W.

A cooling medium supply pipe 50 is connected to the cooling pipe 49. The cooling medium supply pipe 50 is connected to a portion of the cooling medium supply pipe 40 further downstream than the valve 42 and further upstream than the valve 41. The cooling medium supply pipe 50 has interposed therein a valve 51 that opens and closes its flow passage. Also, although unillustrated, a cooling medium drain piping, draining the cooling medium that flowed through inside the cooling pipe 49 to outside the chamber 4, is connected to the cooling pipe 49.

By opening the valve 51 and making the cooling medium circulate through the cooling medium supply pipe 50, the cooling pipe 49, and the cooling medium drain pipe to cool the cooling pipe 49, the moisture in the atmosphere can be dew-condensed on the front surface of the cooling pipe 49 and removed from inside the atmosphere. The moisture in the atmosphere can thereby be prevented from dew-condensing on the frozen body and the pattern forming surface of the substrate W.

The FFU 15 is disposed above the partition wall 14, and is mounted on the ceiling of the partition wall 14. The FFU 15 delivers clean air from the ceiling of the partition wall 14 into the chamber 4. The exhaust apparatus 16 is connected to a bottom portion of the outer wall member 73 of the processing cup 11 via an exhaust duct 52 connected to the outer wall member 73 of the processing cup 11, and suctions an interior of the processing cup 11 from the bottom portion of the outer wall member 73 of the processing cup 11. A downflow (downward flow) is formed inside the chamber 4 by the FFU 15 and the exhaust apparatus 16.

By forming the downflow inside the chamber 4 to dehumidify the interior of the chamber 4, the FFU 15 and the exhaust apparatus 16 execute the dew condensation preventing step of preventing the occurrence of dew condensation on the pattern forming surface of the substrate W when the frozen body is sublimated. That is, the FFU 15 and the exhaust apparatus 16 function as an example of a dew condensation preventing unit.

Also, for example, by increasing a flow velocity of the downflow and promoting ventilation of the interior of the chamber 4, the FFU 15 and the exhaust apparatus 16 execute the sublimation promoting step of promoting the sublimation of the frozen body. That is, the FFU 15 and the exhaust apparatus 16 also function as an example of the sublimation promoting unit.

Also, the exhaust apparatus 16 functions as an example of the sublimation promoting unit by depressurizing the interior of the processing cup 11 from a bottom portion of the processing cup 11 to execute the sublimation promoting step of promoting the sublimation of the frozen body.

A second inert gas nozzle 81 is provided between an inner peripheral surface of the hollow shaft 44*a* and an outer peripheral surface of the nozzle housing member 80. A second inert gas supply pipe 82 is connected to the second inert gas nozzle 81. The second inert gas supply pipe 82 has interposed therein a valve 83 that opens and closes its flow passage.

The inert gas supplied from the second inert gas nozzle 81 is supplied to a space between the shielding plate 44 and the pattern forming surface of the substrate W. The inert gas supplied to the space between the shielding plate 44 and the pattern forming surface of the substrate W forms a gas stream that moves from the central region of the pattern forming surface of the substrate W toward the peripheral edge of the pattern forming surface of the substrate W. Liquid splashing back from the guards 71 can be forced back by the gas stream. Thus, while the inert gas is supplied from the second inert gas nozzle 81, the liquid splashing back from the guards 71 can be suppressed from attaching to the pattern forming surface of the substrate W. Consequently, particles due to splash-back from the guards 71 can be suppressed. To form the gas stream efficiently in the space between the shielding plate 44 and the pattern forming surface of the substrate W, the shielding plate 44 is preferably positioned at the proximity position.

A flow rate of the inert gas supplied from the second inert gas nozzle 81 is a flow rate such that the sublimation of the frozen body is not promoted.

If, when a temperature adjusting medium is supplied from the rear surface supply nozzle 36 to the rear surface of the substrate W while the supply of the processing fluid to the pattern forming surface of the substrate W is stopped, the temperature adjusting medium supplied to the rear surface of the substrate W splashes back from the guards 71 and attaches to the pattern forming surface of the substrate W, the temperature adjusting medium attached to the pattern forming surface of the substrate W is not washed away by the processing fluid supplied to the pattern forming surface of the substrate W. Particles may thus form due to the temperature adjusting medium attached to the pattern forming surface of the substrate W.

It is therefore further preferable to position the shielding plate 44 at the proximity position when a temperature adjusting medium is supplied from the rear surface supply nozzle 36 to the rear surface of the substrate W while the supply of the processing fluid to the pattern forming surface of the substrate W is stopped.

On the other hand, if while the processing fluid is supplied to the pattern forming surface of the substrate W, the shielding plate 44 is put in excessive proximity to the pattern forming surface of the substrate W, the processing fluid supplied to the pattern forming surface of the substrate W may splash back from the pattern forming surface and become attached to the lower surface of the shielding plate 44. Therefore, while the processing fluid is supplied to the pattern forming surface of the substrate W, it is preferable for the shielding plate 44 to be disposed at a processing position that is a position between the separated position and the proximity position.

Figure 3:
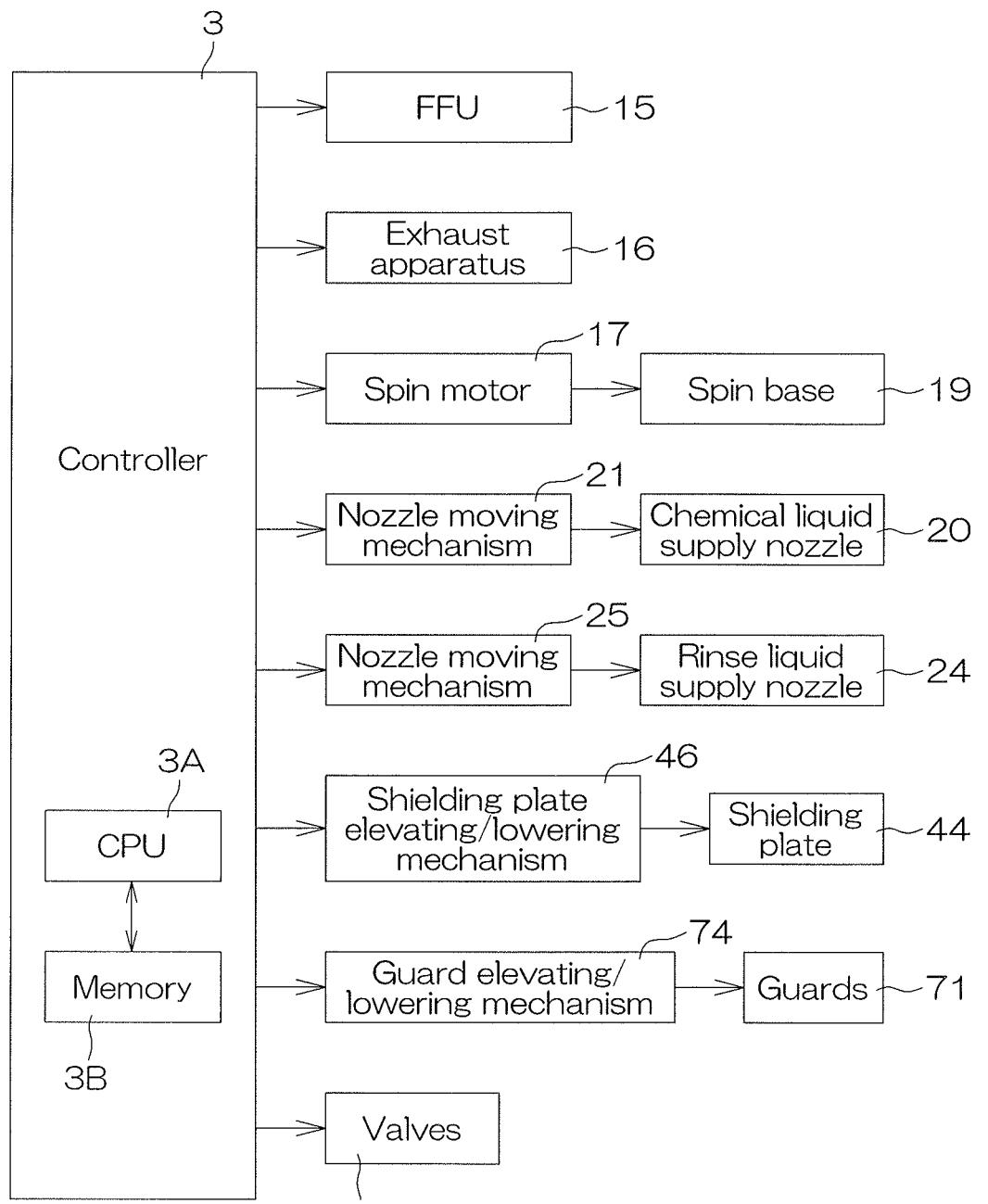
FIG. 3 is a block diagram of the electrical configuration of a main portion of the substrate processing apparatus.

FIG. 3 is a block diagram of the electrical configuration of a main portion of the substrate processing apparatus 1.

The substrate processing apparatus 1 includes the controller 3. The controller 3 includes a microcomputer and controls control objects included in the substrate processing apparatus 1 in accordance with a predetermined control program. Specifically, the controller 3 includes a processor (CPU) 3A and a memory 3B, storing the control program, and is configured such that various controls for substrate processing are executed by the processor 3A executing the control program. In particular, the controller 3 is programmed to control the FFU 15, the exhaust apparatus 16, the spin motor 17, the first nozzle moving mechanism 21, the second nozzle moving mechanism 25, the shielding plate elevating/lowering mechanism 46, the guard elevating/lowering mechanism 74, and the valves 23, 27, 31, 35, 38, 39, 41, 42, 48, 51, and 83.

Figure 4:
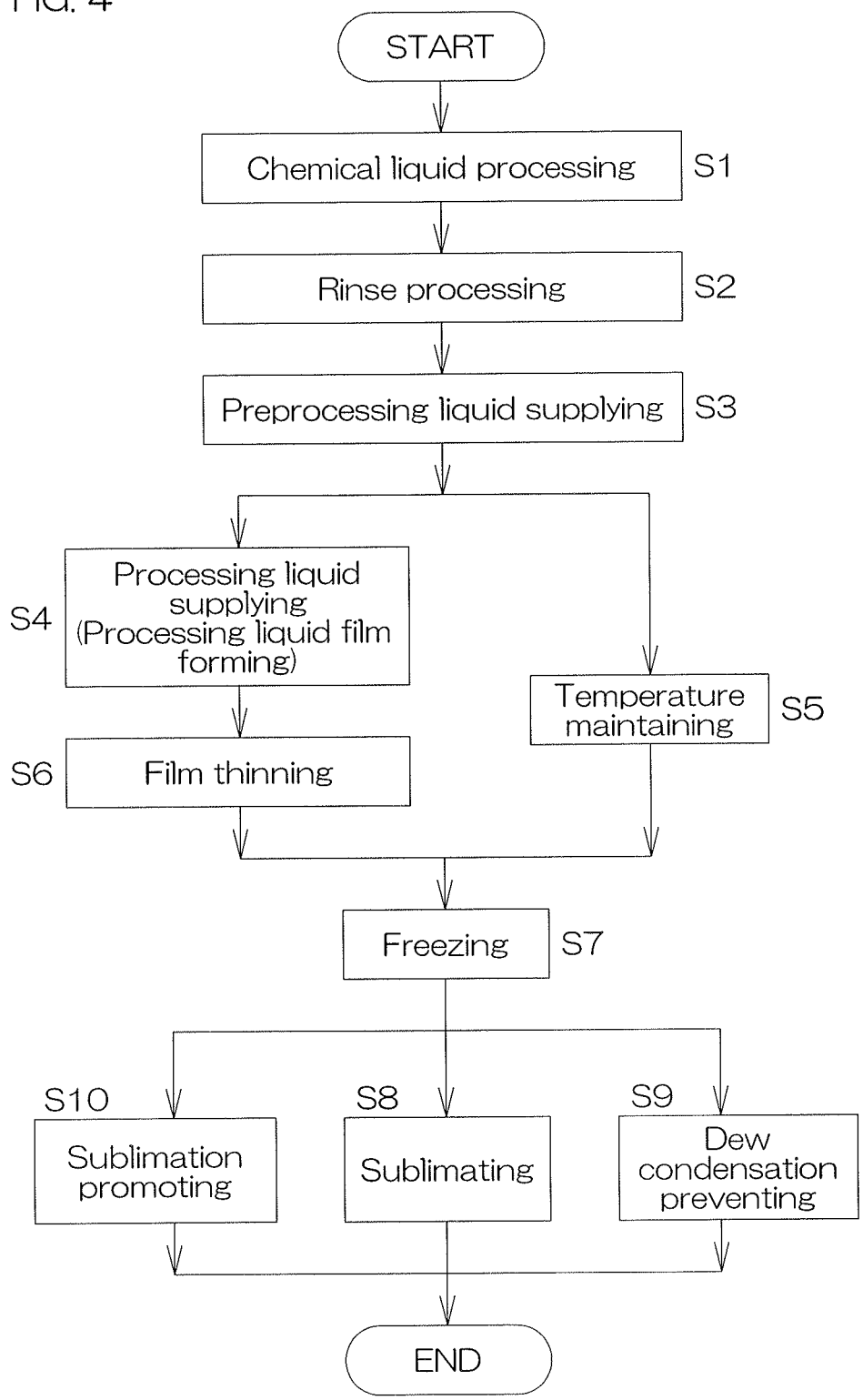
FIG. 4 is a flow diagram for describing an example of substrate processing by the processing unit.

FIG. 4 is a flow diagram for describing an example of substrate processing by the processing unit. FIG. 5A to FIG. 5H are illustrative sectional views for describing conditions of the substrate processing.

In the substrate processing by the processing unit 2, first, a chemical liquid processing step (step S1) is executed. In the chemical liquid processing step, first, the spin chuck 5 is made to hold the substrate W horizontally (substrate holding step). The controller 3 then drives the spin motor 17 to make the spin base 19 rotate and start rotation of the substrate W (substrate rotating step). In the chemical liquid processing step, the spin base 19 is rotated at a predetermined chemical liquid processing speed, which is a substrate rotational speed. The chemical liquid processing speed is, for example, 800 rpm to 1000 rpm. The substrate holding step and the substrate rotating step are continued until the substrate processing ends. In the chemical liquid processing step, the controller 3 controls the shielding plate elevating/lowering mechanism 46 to dispose the shielding plate 44 at the separated position.

Next, the controller 3 controls the first nozzle moving mechanism 21 to dispose the chemical liquid supply nozzle 20 at the central position above the substrate W. The controller 3 then opens the valve 23. The chemical liquid 53 is thereby supplied from the chemical liquid supply nozzle 20 toward the pattern forming surface that is the upper surface of the substrate W in the rotating state as shown in FIG. 5A. The supplied chemical liquid 53 spreads across substantially an entirety of the pattern forming surface of the substrate W by action of a centrifugal force.

After the chemical liquid processing of a fixed period, a rinse processing step (step S2) of replacing the chemical liquid on the pattern forming surface of the substrate W with the rinse liquid to eliminate the chemical liquid from the pattern forming surface of the substrate W is executed. In the rinse processing step, the controller 3 closes the valve 23 to stop the supply of the chemical liquid 53 from the chemical liquid supply nozzle 20. The controller 3 then makes the chemical liquid supply nozzle 20 be moved to the retracted position.

The controller 3 then controls the spin motor 17 to make the spin base 19 rotate at a predetermined rinse processing speed, which is a substrate rotational speed. The rinse processing speed is, for example, 800 rpm to 1000 rpm. In the rinse processing step, the controller 3 controls the shielding plate elevating/lowering mechanism 46 to maintain the shielding plate 44 at the separated position in continuation to the chemical liquid processing step.

Next, the controller 3 controls the second nozzle moving mechanism 25 to dispose the rinse liquid supply nozzle 24 at the central position above the substrate W. The controller 3 then opens the valve 27. The rinse liquid 54 is thereby supplied from the rinse liquid supply nozzle 24 toward the pattern forming surface of the substrate W in the rotating state as shown in FIG. 5B. The supplied rinse liquid 54 spreads across substantially the entirety of the pattern forming surface of the substrate W by the action of the centrifugal force and replaces the chemical liquid.

Figure 5C:
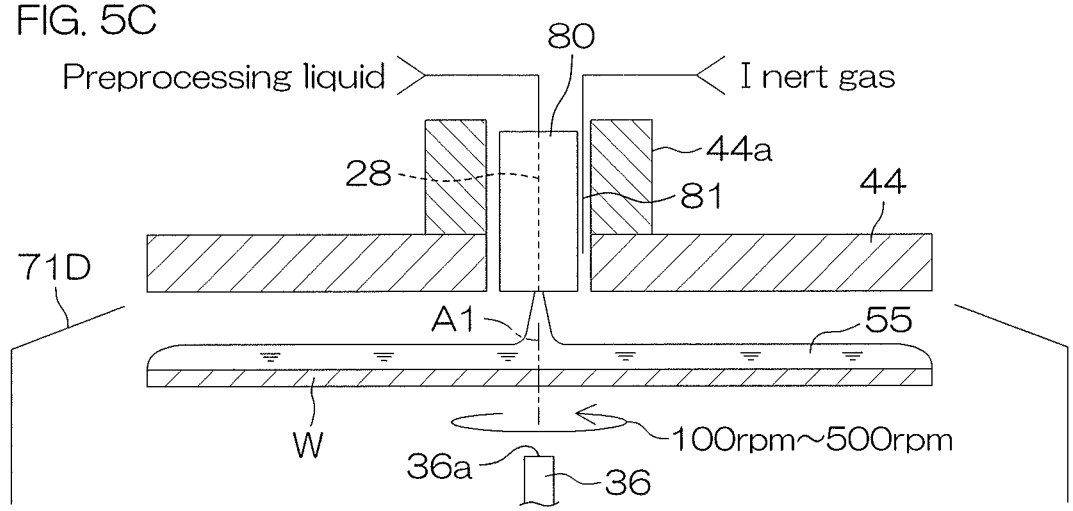

Referring to FIG. 5C, after the rinse processing of a fixed period, a preprocessing liquid supplying step (step S3) of replacing the rinse liquid on the pattern forming surface of the substrate W with the preprocessing liquid is executed. In the preprocessing liquid supplying step, the controller 3 closes the valve 27 to stop the supply of the rinse liquid 54 from the rinse liquid supply nozzle 24. The controller 3 then makes the rinse liquid supply nozzle 24 be moved to the retracted position.

The controller 3 then controls the spin motor 17 to make the spin base 19 rotate at a predetermined preprocessing liquid supplying speed, which is a substrate rotational speed. The preprocessing liquid supplying speed is, for example, 100 rpm to 500 rpm.

The controller 3 then controls the shielding plate elevating/lowering mechanism 46 to dispose the shielding plate 44 at the processing position. After the shielding plate 44 reaches the processing position, the controller 3 opens the valve 83. The inert gas, such as nitrogen gas, etc., is thereby supplied from the second inert gas nozzle 81. The inert gas supplied from the second inert gas nozzle 81 forms the gas stream that moves from the central region of the pattern forming surface of the substrate W toward the peripheral edge of the pattern forming surface of the substrate W.

The controller 3 then opens the valve 31. The preprocessing liquid 55 is thereby supplied from the preprocessing liquid supply nozzle 28 toward the pattern forming surface of the substrate W in the rotating state. The supplied preprocessing liquid 55 spreads across substantially the entirety of the pattern forming surface of the substrate W by the action of the centrifugal force and replaces the rinse liquid.

After the preprocessing liquid supply of a fixed period, the controller 3 closes the valve 31 to stop the supply of the preprocessing liquid from the preprocessing liquid supply nozzle 28.

Figure 5D:
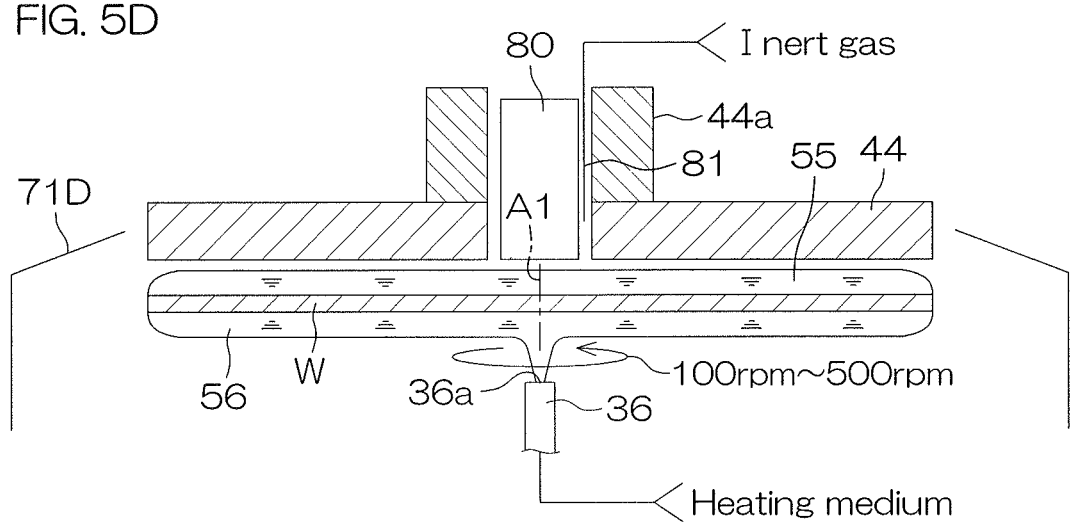
Figure 5E:
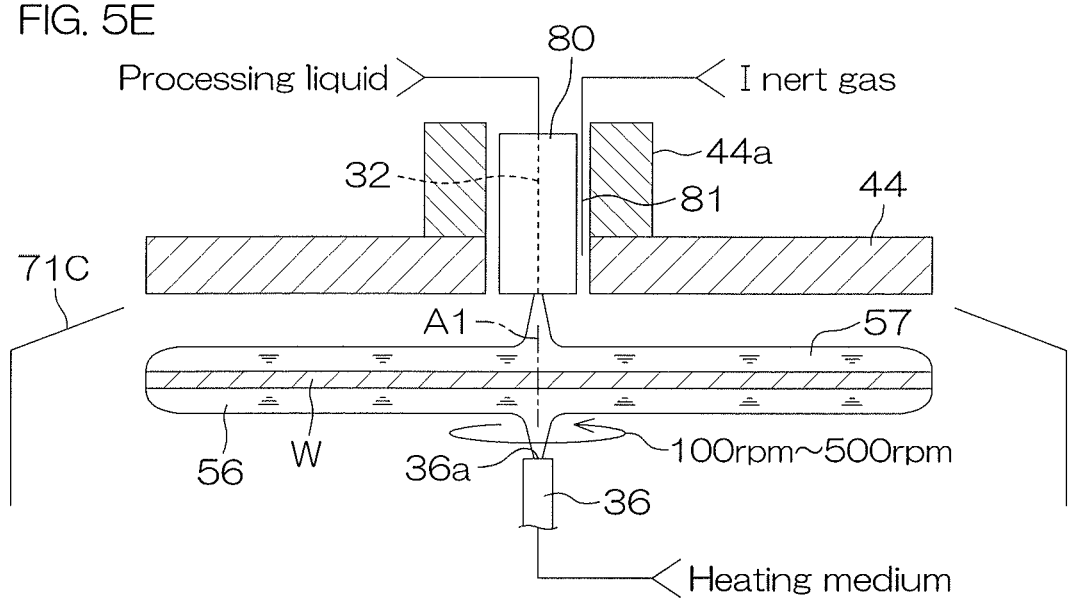

Next, referring to FIG. 5D and FIG. 5E, a processing liquid supplying step (step S4) of supplying the processing liquid onto the pattern forming surface of the substrate W and the temperature maintaining step (substrate temperature adjusting step; step S5) of maintaining the temperature of the supplied processing liquid in the melting temperature range are executed. In the present substrate processing, the temperature maintaining step is started earlier than a start of the processing liquid supplying step.

That is, the controller 3 controls the spin motor 17 to make the spin base 19 rotate at a predetermined processing liquid supplying speed, which is a substrate rotational speed. The processing liquid supplying speed is, for example, 100 rpm to 500 rpm.

The controller 3 then controls the shielding plate elevating/lowering mechanism 46 to dispose the shielding plate 44 at the proximity position. In the state where the shielding plate 44 is disposed at the proximity position, the controller 3 opens the valve 38. As shown in FIG. 5D, the heating medium 56 is thereby supplied through the heating medium supply pipe 37 and the rear surface supply nozzle 36, which constitute the heating medium path, and from the discharge port 36a at the upper end of the rear surface supply nozzle 36 toward the rear surface of the substrate W in the rotating state. By starting the supply of the heating medium 56 in the state where the shielding plate 44 is disposed at the proximity position, attachment of the heating medium 56, splashed back from the fourth guard 71D, to the pattern forming surface of the substrate W can be suppressed.

The supplied heating medium 56 spreads across substantially the entirety of the rear surface of the substrate W by the action of the centrifugal force and the substrate W and the preprocessing liquid 55 on the pattern forming surface of the substrate W are heated. The heating temperature sets the processing liquid, supplied in the next step, in the melting temperature range in consideration of a thickness of the substrate W, etc.

Next, while continuing to make the spin base 19 rotate at the processing liquid supplying speed and continuing to supply the heating medium 56 to the rear surface of the substrate W, the controller 3 supplies the processing liquid to the pattern forming surface of the substrate W.

Specifically, the controller 3 controls the shielding plate elevating/lowering mechanism 46 to dispose the shielding plate 44 at the processing position. In the state where the shielding plate 44 is disposed at the processing position, the controller 3 opens the valve 35. The processing liquid is thereby supplied from the processing liquid supply nozzle 32 toward the pattern forming surface of the substrate W in the rotating state as shown in FIG. 5E. By the action of the centrifugal force, the supplied processing liquid spreads across substantially the entirety of the pattern forming surface of the substrate W while mixing with the preprocessing liquid and replaces the preprocessing liquid. The processing liquid film 57 is then formed on the pattern forming surface of the substrate W (processing liquid film forming step).

Figure 5F:
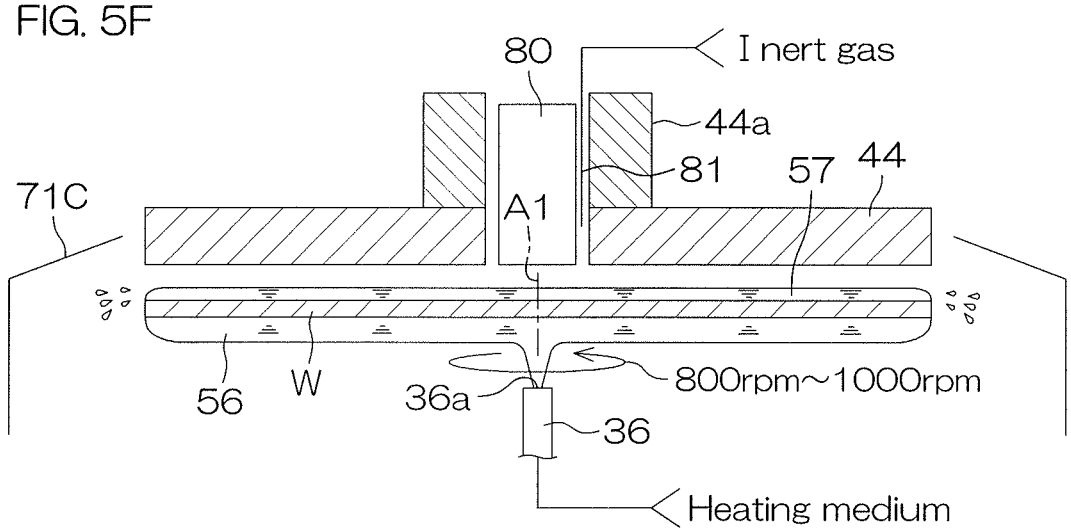

Next, referring to FIG. 5F, the film thinning step (step S6) of thinning the processing liquid film 57 formed on the pattern forming surface of the substrate W is executed while continuing the temperature maintaining step (step S5).

Specifically, first, the controller 3 controls the shielding plate elevating/lowering mechanism 46 to dispose the shielding plate 44 at the proximity position. In the state where the shielding plate 44 is disposed at the proximity position, the controller 3 closes the valve 35 to stop the supply of the processing liquid to the pattern forming surface of the substrate W. By stopping the supply of the processing liquid in the state where the shielding plate 44 is disposed at the proximity position, attachment of the heating medium 56, splashed back from the third guard 71C, to the pattern forming surface of the substrate W can be suppressed. Thereafter, the shielding plate 44 is maintained at the proximity position until a sublimating step (step S8), to be described below, ends.

Also, the controller 3 controls the spin motor 17 to make the spin base 19 rotate at a predetermined film thinning speed, which is a substrate rotational speed. The film thinning speed is, for example, 800 rpm to 1000 rpm.

Then, as described above, the centrifugal force due to the rotation of the substrate W acts on the processing liquid on the substrate W, a portion of the processing liquid on the substrate W is expelled from the peripheral edge of the substrate W, and the processing liquid film 57 is thinned (film removing thinning step). The processing liquid can thus be made to spread across the entirety of the pattern forming surface reliably and the processing liquid film 57 can be reduced in film thickness appropriately. The frozen body 59, formed in the freezing step to be described below, can consequently be reduced in film thickness appropriately. Also, the processing liquid film 57 can be thinned by a simple method of removing a portion of the processing liquid from the pattern forming surface by the centrifugal force due to the rotation of the substrate W.

Figure 5G:
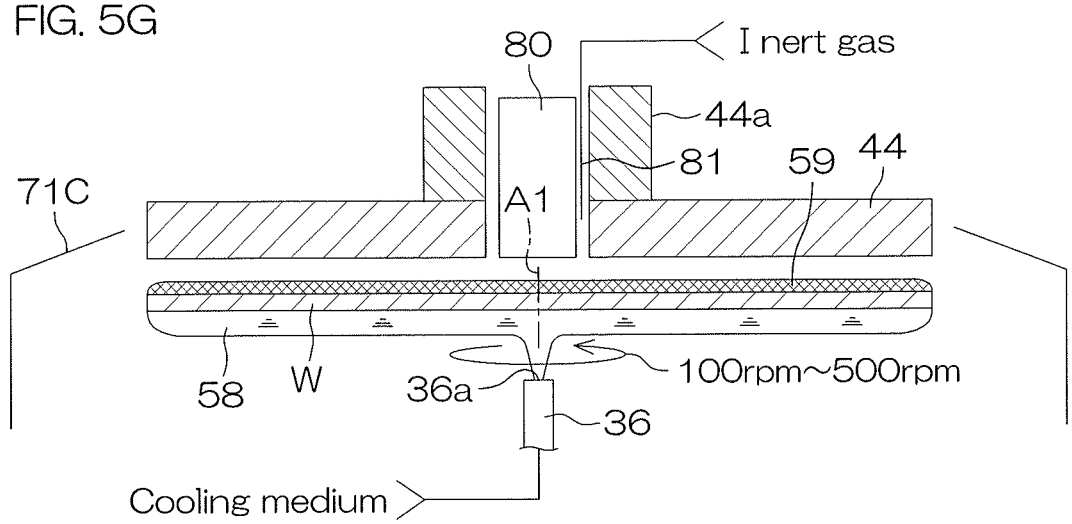

Next, the temperature maintaining step (step S5) is ended, and the freezing step (step S7) of supplying the cooling medium to the rear surface of the substrate W to freeze the thinned processing liquid film 57 and form the frozen body 59 as shown in FIG. 5G is executed.

Specifically, first, the controller 3 closes the valve 38 to stop the supply of the heating medium 56 to the heating medium path and end the temperature maintaining step (step S5).

Next, the controller 3 opens the valve 41 to start the supply of the cooling medium to the cooling medium supply pipe 40, a portion of the heating medium supply pipe 37 further downstream than the position of connection of the cooling medium supply pipe 40, and the rear surface supply nozzle 36 that constitute the cooling medium path. A timing at which the valve 41 is opened to start the supply of the cooling medium to the cooling medium path may be the same as or later than a timing of closing the valve 38 to stop the supply of the heating medium to the heating medium path.

The cooling medium is thereby supplied through the cooling medium path and from the discharge port 36a at the upper end of the rear surface supply nozzle 36 toward the rear surface of the substrate W in the rotating state.

The cooling medium supplied to the rear surface of the substrate W spreads across substantially the entirety of the rear surface of the substrate W by the action of the centrifugal force and replaces the heating medium. Cooling of the processing liquid film 57 formed on the pattern forming surface of the substrate W is thereby started.

While continuing the supply of the cooling medium 58 to the rear surface of the substrate W, the controller 3 controls the spin motor 17 to make the spin base 19 rotate at a predetermined freezing process speed, which is a substrate rotational speed. The freezing process speed is, for example, 100 rpm to 500 rpm. Thereby, the processing liquid film 57 formed on the pattern forming surface of the substrate W freezes and the frozen body 59 is formed.

However, the cooling medium is supplied gradually to the rear surface of the substrate W while forcing out the heating medium remaining in the portion shared by the cooling medium path and the heating medium path, that is, the common piping 43 and the rear surface supply nozzle 36. Also, the cooling medium replaces the heating medium on the rear surface of the substrate W gradually. In combination with the substrate W having a predetermined heat capacity, the temperature of the processing liquid film 57 formed on the pattern forming surface of the substrate W thereby decreases gradually.

Therefore, after the temperature maintaining step (step S5) ends, the freezing of the processing liquid film 57 formed on the pattern forming surface of the substrate W (freezing step; step S7) begins with a delay from a point at which the valve 41 is opened to start the supply of the cooling medium to the cooling medium path.

By making fixed the temperatures of the heating medium and the cooling medium, flow rates of the heating medium and the cooling medium, the heat capacity, etc., of the substrate W based on the thickness, etc., a period from the point at which the cooling of the processing liquid film 57 is started until the freezing of the processing liquid film 57 begins can be made fixed.

In this case, a length of a period (film thinning period) of thinning the processing liquid film 57 by expelling the processing liquid from the substrate W can be adjusted by controlling a timing of starting the cooling of the processing liquid film 57. In the present preferred embodiment, the timing of starting the cooling of the processing liquid film 57 is the timing at which the valve 35 is closed to stop the supply of the heating medium to the heating medium path and, instead, the valve 41 is opened to start the supply of the cooling medium to the cooling medium path.

By adjusting the length of the film thinning period, the film thickness of the processing liquid film 57 after the film thinning step can be adjusted. For example, the longer the film thinning period is made, the smaller the film thickness of the processing liquid film 57 can be made.

Figure 6:
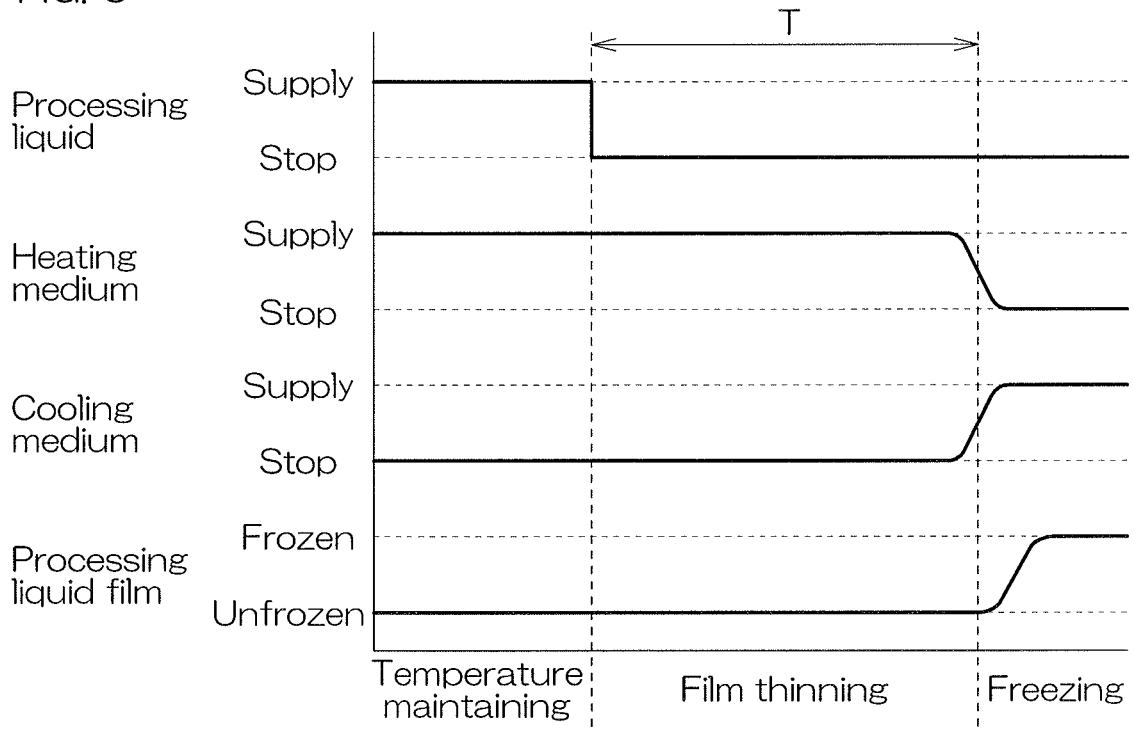
FIG. 6 is a time chart for describing a film thinning step of the substrate processing and steps before and after it.

FIG. 6 is a time chart for describing the film thinning portion of the substrate processing and the steps before and after it.

As shown in FIG. 6, when the timing of starting the cooling of the processing liquid film 57 is made later than the stopping of the supply of the processing liquid to the pattern forming surface of the substrate, the film thinning step starts before the cooling of the processing liquid film 57 is started.

Although not illustrated, when the timing of starting the cooling of the processing liquid film 57 is made the same in time as the point at which the supply of the processing liquid to the pattern forming surface of the substrate W is stopped, the film thinning step is started at that point and the film thinning step ends at the point at which the freezing of the processing liquid film begins.

Therefore, as shown in FIG. 6, in comparison to when the timing of starting the cooling of the processing liquid film 57 is made the same in time as the point at which the supply of the processing liquid to the pattern forming surface of the substrate is stopped, the period of the film thinning processing (film thinning period T) is made longer when the timing of starting the cooling of the processing liquid film 57 is made later than the point at which the supply of the processing liquid to the pattern forming surface of the substrate W is stopped. Consequently, the film thickness of the processing liquid film 57 is made even smaller.

Therefore, by selecting the timing of starting the cooling of the processing liquid film 57 to be at the same time as the stop of the supply of the processing liquid or later than when the supply of the processing liquid is stopped, a length of the thinning period T can be adjusted to control the film thickness of the processing liquid film 57.

However, the film thickness of the processing liquid film 57 after the film thinning must be kept within a range of being greater than a height of projections of a pattern on the pattern forming surface of the substrate W. This is because when the thickness of the processing liquid film 57 is smaller than the height of the projections of the pattern, pattern collapse may occur due to surface tension.

Figure 5H:
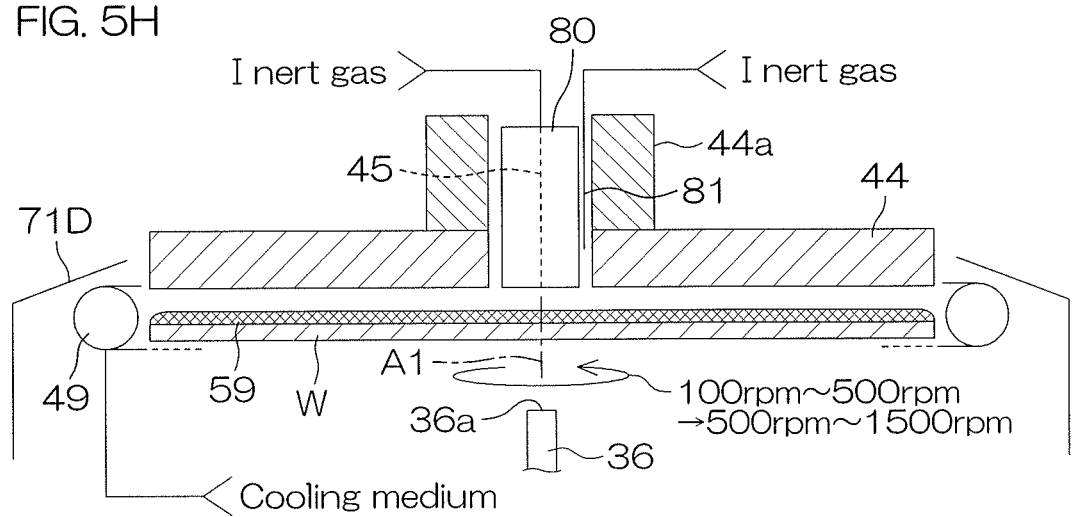

Next, referring to FIG. 5H, the sublimating step (step S8) of sublimating and thereby removing the formed frozen body 59 from the pattern forming surface of the substrate W is executed. Also, the dew condensation preventing step (step S9) of preventing the dew condensation on the pattern forming surface of the substrate W and the sublimation promoting step (step S10) of promoting the sublimation of the frozen body are executed in parallel to the sublimating step.

Specifically, the controller 3 closes the valve 41 to stop the supply of the cooling medium 58 to the rear surface of the substrate W. Also, the controller 3 drives the FFU 15 and the exhaust apparatus 16 to form the downflow inside the chamber 4 and depressurize the interior of the processing cup 11 from the bottom portion of the processing cup 11 via the exhaust duct 52. The sublimation of the frozen body 59 is thereby promoted and the dew condensation is prevented (sublimation promoting step and dew condensation preventing step).

As mentioned above, the controller 3 controls the shielding plate elevating/lowering mechanism 46 to keep the shielding plate 44 at the proximity position. The atmosphere in the vicinity of the pattern forming surface of the substrate W, specifically, the atmosphere between the shielding plate 44 and the substrate W is thereby shielded from the ambient atmosphere and the dew condensation is prevented (dew condensation preventing step).

Also, the controller 3 opens the valve 48 to supply the inert gas from the discharge port at the lower end of the first inert gas nozzle 45 to the central region of the pattern forming surface of the substrate W. By the supplied inert gas, the atmosphere between the lower surface of the shielding plate 44 and the pattern forming surface of the substrate W is dehumidified and the dew condensation is prevented (dew condensation preventing step). Especially when the high-temperature inert gas is supplied, the atmosphere in the vicinity of the pattern forming surface of the substrate W is warmed and the effect of preventing the dew condensation is improved.

Also, by the inert gas being made to flow on the front surface of the frozen body 59, the sublimation of the frozen body 59 is promoted (sublimation promoting step). Especially when the high-temperature inert gas is supplied, the atmosphere in the vicinity of the pattern forming surface of the substrate W is warmed and the sublimation of the frozen body 59 is promoted further.

Further, the controller 3 opens the valve 51 to make the cooling medium circulate and cool the cooling pipe 49. The cooling pipe 49 is thereby made to function as a dew condensation trap and the moisture in the atmosphere can be dew-condensed on the front surface of the cooling pipe 49 and removed from inside the atmosphere. That is, the dew condensation is prevented (dew condensation preventing step).

In this state, the controller 3 controls the spin motor 17 to make the spin base 19 rotate at a predetermined first sublimating speed, which is a substrate rotational speed. The first sublimating speed is, for example, 100 rpm to 500 rpm. Next, the controller 3 controls the spin motor 17 to make the spin base 19 rotate at a predetermined second sublimating speed, which is a substrate rotational speed. The second sublimating speed is, for example, 500 rpm to 1500 rpm. The frozen body 59 formed on the pattern forming surface of the substrate W is thereby sublimated and removed and the pattern forming surface of the substrate W is dried (sublimating step and sublimation promoting step).

With the present preferred embodiment, by maintaining the temperature of the processing liquid film 57 in the melting temperature range in the temperature maintaining step, the processing liquid film 57 is suppressed from freezing. The processing liquid film 57 before the freezing step can thereby be maintained in the liquid phase. For example, even if the processing liquid film 57 undergoes partial freezing in the processing liquid supplying step (processing liquid film forming step), it can be remelted and put in the liquid state in the temperature maintaining step.

Also, in the subsequent film thinning step, by thinning the processing liquid film 57 while the temperature of the processing liquid film 57 is in the melting temperature range and the freezing of the processing liquid film is not occurring, the film thickness of the frozen body 59 formed in the freezing step can be reduced.

The frozen body 59, which is made as low as possible in internal stress and moreover is adjusted appropriately in film thickness, can thus be formed on the pattern forming surface of the substrate W in the freezing step.

Consequently, the influence of surface tension of a liquid can be eliminated and therefore the pattern forming surface of the substrate W can be dried while suppressing pattern collapse.

Also, with the present preferred embodiment, the temperature maintaining step can be executed by a simple method of supplying the heating medium to the rear surface of the substrate W. Also, the freezing step can be executed by a simple method of supplying the cooling medium to the rear surface of the substrate W. The configuration of the substrate processing apparatus configured to perform the substrate processing method can thus be simplified.

Also, with the present preferred embodiment, the substrate temperature adjusting step is started earlier than the start of the processing liquid supplying step. Therefore, by executing the processing liquid supplying step in the state where the substrate W is heated in advance by supplying the heating medium to the rear surface of the substrate W, the freezing of the processing liquid film 57 in the processing liquid supplying step can be suppressed further. Also, because the freezing of the processing liquid film 57 in the processing liquid supplying step is suppressed, there is no need to remelt the frozen processing liquid film 57 in the temperature maintaining step. The period of the temperature maintaining step can thus also be shortened.

Figure 7:
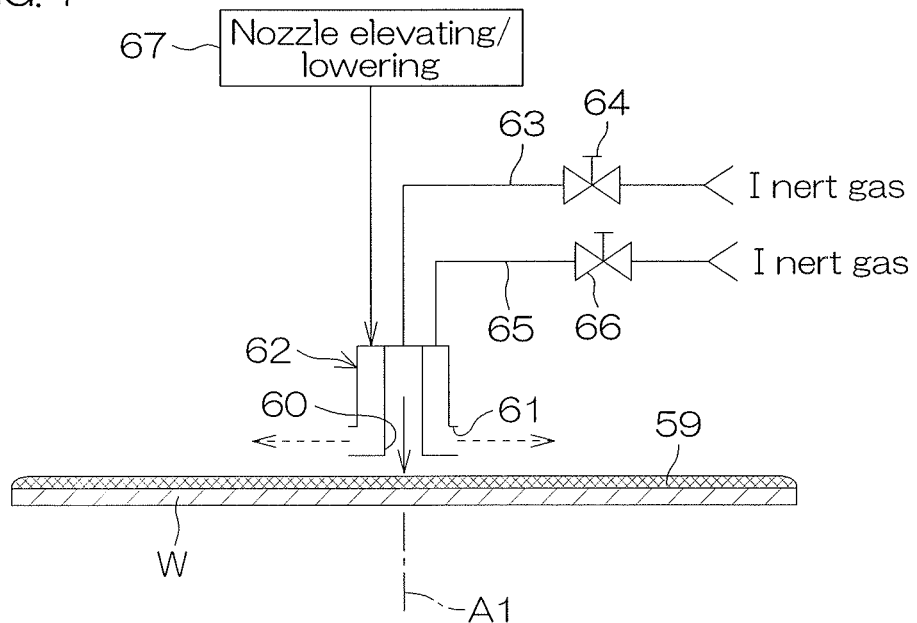
FIG. 7 is an enlarged illustrative sectional view of a principal portion of a modification example of the processing unit included in the substrate processing apparatus.

FIG. 7 is an enlarged illustrative sectional view of a principal portion of a modification example of the processing unit 2 included in the substrate processing apparatus 1 according to the first preferred embodiment.

The processing unit 2 of the example of FIG. 7 differs from the preferred embodiment described using the example of the respective prior figures in the point that an inert gas nozzle 62, including a first discharge port 60 and a second discharge port 61 that are configured to discharge the inert gas, is used in place of the shielding plate 44 and the first inert gas nozzle 45. However, the configurations other than the above and the respective steps using the processing unit are the same as those of the example of the respective prior figures and therefore the changed parts shall be described, in particular, with reference to the processing unit 2 of FIG. 2 as well.

As with the discharge port 45a of the former first inert gas nozzle 45, the first discharge port 60 is provided at a lower end of the inert gas nozzle 62 to face the pattern forming surface of the substrate W. As indicated by a solid line arrow in the figure, the first discharge port 60 discharges the inert gas to the central region of the pattern forming surface of the substrate W in the substantially vertical direction along the rotational axis A1. An inert gas supply pipe 63 is connected to the first discharge port 60. The inert gas supply pipe 63 has interposed therein a valve 64 that opens and closes its flow passage.

The second discharge port 61 opens annularly to an outer peripheral surface of the lower end of the inert gas nozzle 62. The second discharge port 61 discharges the inert gas laterally and radially along the pattern forming surface of the substrate W as indicated by broken line arrows in the figure. An inert gas supply pipe 65 is connected to the second discharge port 61. The inert gas supply pipe 65 has interposed therein a valve 66 that opens and closes its flow passage.

A nozzle elevating/lowering mechanism 67 that elevates and lowers the inert gas nozzle 62 along the vertical direction is connected to the inert gas nozzle 62. By the nozzle elevating/lowering mechanism 67, the inert gas nozzle 62 is elevated and lowered between a proximity position (see FIG. 7), at which the first discharge port 60 is put in proximity to the pattern forming surface of the substrate W, and a separated position, at which the first discharge port 60 is separated further upward than the proximity position.

At the proximity position, at which the inert gas nozzle 62 is lowered to put the first discharge port 60 in proximity to the pattern forming surface of the substrate W, the first discharge port 60 of the inert gas nozzle 62 faces the rotation center position of the pattern forming surface of the substrate W.

When in this state, the inert gas is discharged laterally and radially along the pattern forming surface of the substrate W from the second discharge port 61 of the inert gas nozzle 62, a gas flow of the inert gas, directed from the rotation center position toward the peripheral edge of the substrate W is formed on the pattern forming surface of the substrate W. The atmosphere in the vicinity of the pattern forming surface of the substrate W is thereby shielded from the atmosphere of the periphery.

Also, by the inert gas being discharged from the first discharge port 60 of the inert gas nozzle 62, the inert gas is supplied to the central region of the pattern forming surface of the substrate W. The supplied inert gas spreads outward on the pattern forming surface of the substrate W from the central region of the pattern forming surface of the substrate W and is exhausted out of the atmosphere from the peripheral edge of the pattern forming surface of the substrate W. The atmosphere in the vicinity of the pattern forming surface of the substrate W is thereby dehumidified. The moisture in the atmosphere can thus be prevented from dew-condensing on the frozen body 59 and the pattern forming surface of the substrate W when sublimating the frozen body 59 formed on the pattern forming surface of the substrate W (dew condensation preventing step). Also, the sublimation of the frozen body is promoted by the inert gas being made to flow on the front surface of the frozen body 59 (sublimation promoting step).

Especially when the high-temperature inert gas of higher temperature than room temperature is supplied, the atmosphere in the vicinity of the pattern forming surface of the substrate W is warmed and the effect of preventing the dew condensation is improved and the sublimation of the frozen body 59 is promoted further.

Second Preferred Embodiment

Figure 8:
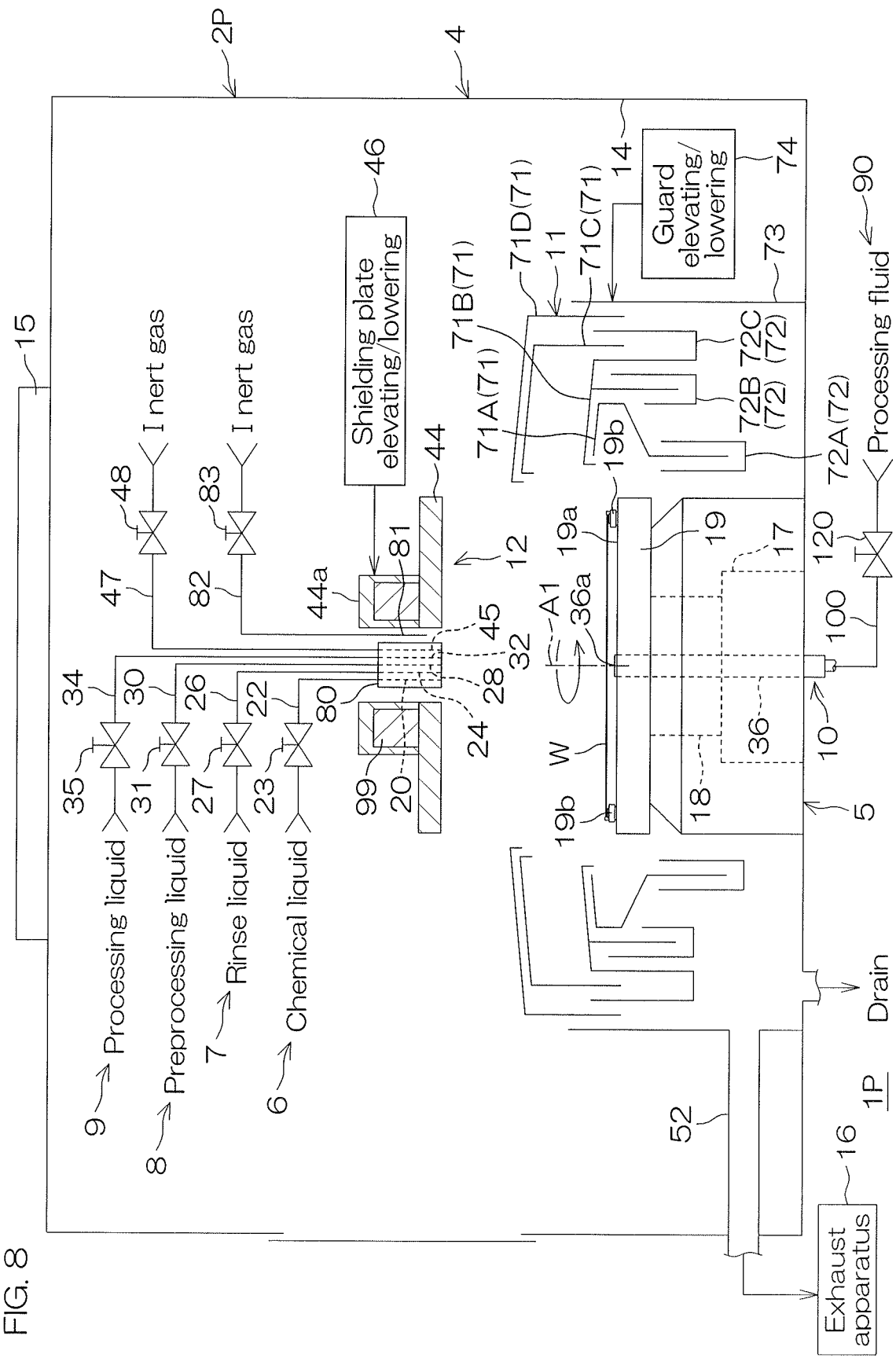
FIG. 8 is a schematic sectional view of the general configuration of a processing unit included in a substrate processing apparatus according to a second preferred embodiment.

FIG. 8 is a schematic sectional view of the general arrangement of a processing unit 2P included in a substrate processing apparatus 1P according to a second preferred embodiment. In FIG. 8, members that are the same as the members described up to now are provided with the same reference symbols and description thereof shall be omitted (the same applies to FIG. 9 to FIG. 11H described below).

Main points of difference of the processing unit 2P according to the second preferred embodiment with respect to the processing unit 2 according to the first preferred embodiment are the point that the chemical liquid supply nozzle 20 and the rinse liquid supply nozzle 24 are housed in the nozzle housing member 80 together with the preprocessing liquid supply nozzle 28, the processing liquid supply nozzle 32, and the first inert gas nozzle 45 and the point that a processing fluid supply pipe 90 is connected, in place of the heating medium supply pipe 37, to the rear surface supply nozzle 36.

In the second preferred embodiment, the processing unit 2P is not provided with the nozzle moving mechanisms 21 and 22 because the chemical liquid supply nozzle 20 and the rinse liquid supply nozzle 24 are housed in the nozzle housing member 80.

Also, the processing unit 2P includes a heater 99 that heats at least one of either of the processing liquid supply nozzle 32 and the processing liquid supply pipe 34 to maintain the temperature of the processing liquid inside the processing liquid supply nozzle 32 and the processing liquid supply pipe 34 at not lower than the melting point of the sublimable substance. The heater 99 is, for example, incorporated in the hollow shaft 44a.

The heater 99 can heat the processing liquid remaining inside the processing liquid supply nozzle 32 and the processing liquid supply pipe 34. Further, by the heat of the heater 99 being transmitted from the processing liquid supply nozzle 32 and the processing liquid supply pipe 34 to the discharge port 32a of the processing liquid supply nozzle 32, the discharge port 32a is heated. A heat amount of the processing liquid remaining inside the processing liquid supply pipe 34 and on the discharge port 32a of the processing liquid supply nozzle 32 can thus be compensated. Solidification of the processing liquid remaining inside the processing liquid supply pipe 34 and on the discharge port 32a of the processing liquid supply nozzle 32 can thus be suppressed or prevented.

Figure 9:
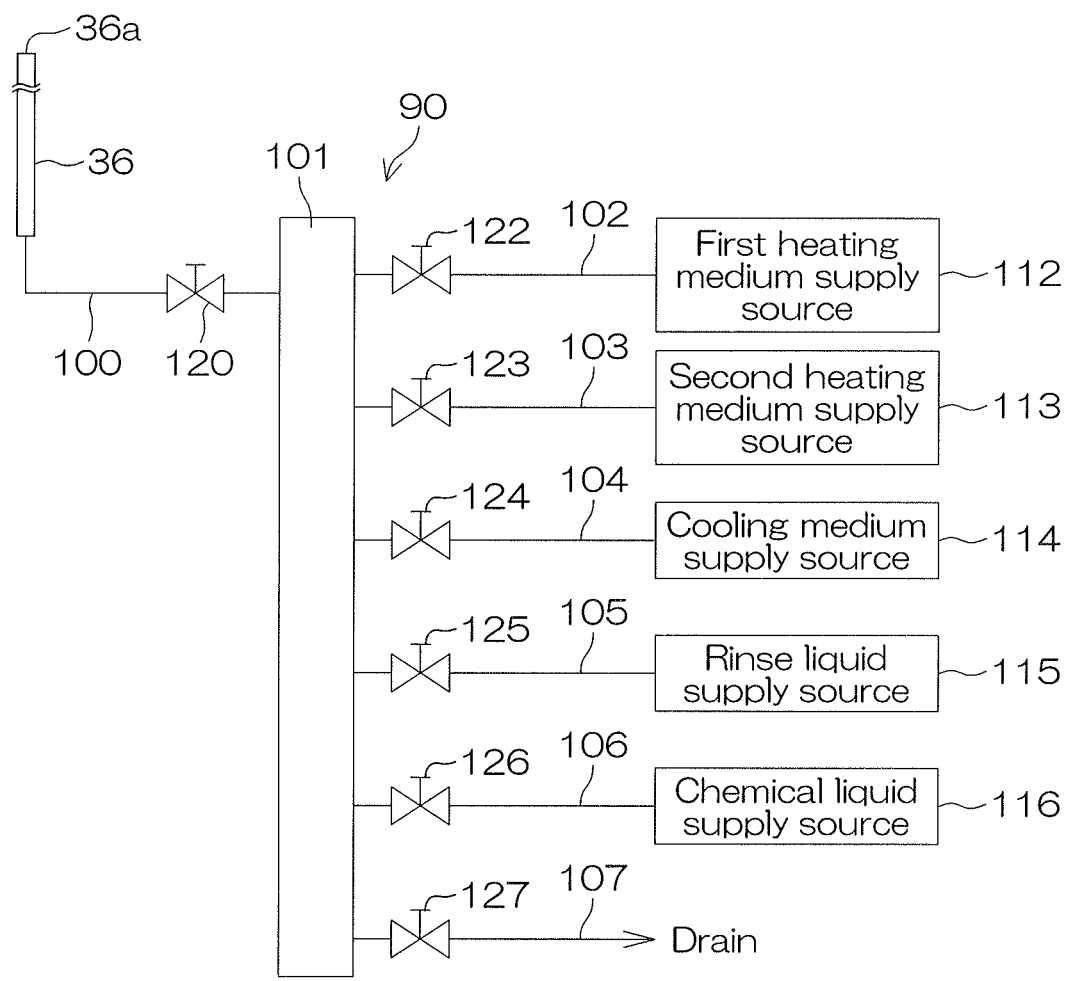
FIG. 9 is a schematic view of a processing fluid supply piping included in the substrate processing apparatus.

FIG. 9 is a schematic view of the processing fluid supply pipe 90. A processing fluid supplied to the rear surface supply nozzle 36 according to the second preferred embodiment includes not only a temperature adjusting fluid but also a chemical liquid and a rinse liquid. The processing fluid supply pipe 90 includes a processing fluid feed pipe 100, a processing fluid common pipe 101, a first heating medium feed pipe 102, a second heating medium feed pipe 103, a cooling medium feed pipe 104, a rinse liquid feed pipe 105, and a chemical liquid feed pipe 106.

The processing fluid feed pipe 100 feeds the processing fluid from the processing fluid common pipe 101 to the discharge port 36a of the rear surface supply nozzle 36. The first heating medium feed pipe 102 feeds a first heating medium from a first heating medium supply source 112 to the processing fluid common pipe 101. The second heating medium feed pipe 103 feeds a second heating medium from a second heating medium supply source 113 to the processing fluid common pipe 101. The cooling medium feed pipe 104 feeds a cooling medium from a cooling medium supply source 114 to the processing fluid common pipe 101. The rinse liquid feed pipe 105 feeds the rinse liquid from a rinse liquid supply source 115 to the processing fluid common pipe 101. The chemical liquid feed pipe 106 feeds the chemical liquid from a chemical liquid supply source 116 to the processing fluid common pipe 101. A drain pipe 107, draining the processing fluid inside the processing fluid common pipe 101, is connected to the processing fluid common pipe 101.

A valve 120 that opens and closes a flow passage inside the processing fluid feed pipe 100 is interposed in the processing fluid feed pipe 100. A valve 122 that opens and closes a flow passage inside the first heating medium feed pipe 102 is interposed in the first heating medium feed pipe 102. A valve 123 that opens and closes a flow passage inside the second heating medium feed pipe 103 is interposed in the second heating medium feed pipe 103. A valve 124 that opens and closes a flow passage inside the cooling medium feed pipe 104 is interposed in the cooling medium feed pipe 104. A valve 125 that opens and closes a flow passage inside the rinse liquid feed pipe 105 is interposed in the rinse liquid feed pipe 105. A valve 126 that opens and closes a flow passage inside the chemical liquid feed pipe 106 is interposed in the chemical liquid feed pipe 106. A valve 127 that opens and closes a flow passage inside the drain pipe 107 is interposed in the drain pipe 107.

The first heating medium discharged from the discharge port 36a of the rear surface supply nozzle 36 is a fluid (for example, DIW) that heats the substrate W and is maintained at a first temperature (for example, of 60° C. to 80° C.) within the melting temperature range. The second heating medium discharged from the discharge port 36a of the rear surface supply nozzle 36 is a fluid (for example, DIW) that heats the substrate W and is maintained at a second temperature (for example, of 25° C.) that is a temperature within the melting temperature range and lower than the first temperature. The cooling medium is a fluid (for example, DIW) that cools the substrate W and is maintained at a temperature (for example, of 4° C. to 19° C.) within the freezing temperature range.

Figure 10:
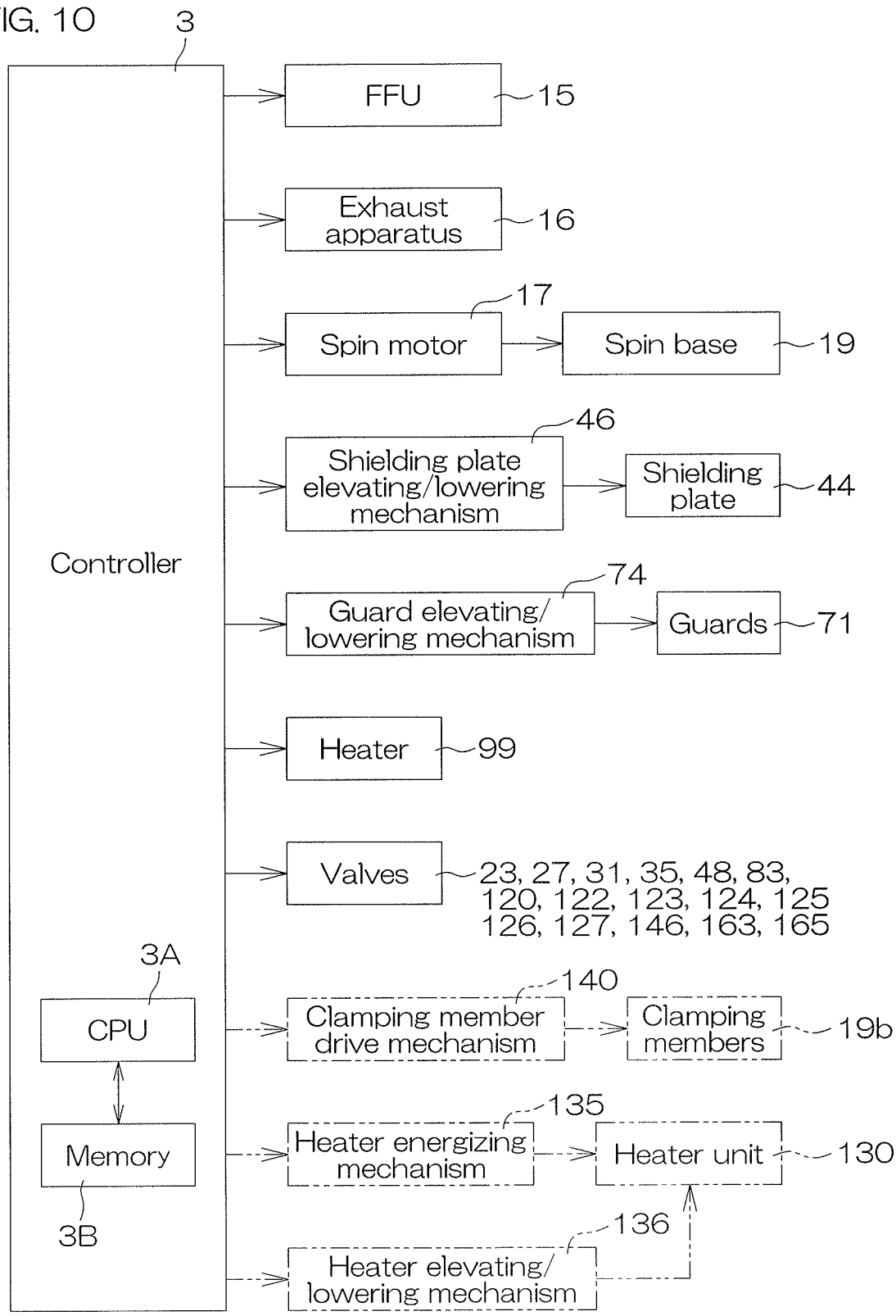
FIG. 10 is a block diagram of the electrical configuration of a main portion of the substrate processing apparatus according to the second preferred embodiment.

FIG. 10 is a block diagram of the electrical configuration of a main portion of the substrate processing apparatus 1P according to the second preferred embodiment. The controller 3 of the substrate processing apparatus 1P is programmed to control the FFU 15, the exhaust apparatus 16, the spin motor 17, the shielding plate elevating/lowering mechanism 46, the guard elevating/lowering mechanism 74, the heater 99, and the valves 23, 27, 31, 35, 48, 83, 120, 122, 123, 124, 125, 126, and 127.

With the processing unit 2P according to the second preferred embodiment, a substrate processing similar to that of the flow diagram of FIG. 4 is made possible. FIG. 11A to FIG. 11H are illustrative sectional views for describing conditions of substrate processing executed by the processing unit 2P.

In the substrate processing by the processing unit 2P, first, the chemical liquid processing step (step S1) is executed. In the chemical liquid processing step, first, the spin chuck 5 is made to hold the substrate W horizontally (substrate holding step). The controller 3 drives the spin motor 17 to make the spin base 19 rotate and start the rotation of the substrate W (substrate rotating step). In the chemical liquid processing step, the spin base 19 is rotated at the predetermined chemical liquid processing speed. The chemical liquid processing speed is, for example, 800 rpm to 1000 rpm. The substrate holding step and the substrate rotating step are continued until the substrate processing ends. In the chemical liquid processing step, the controller 3 controls the shielding plate elevating/lowering mechanism 46 to dispose the shielding plate 44 at the separated position.

Figure 11A:
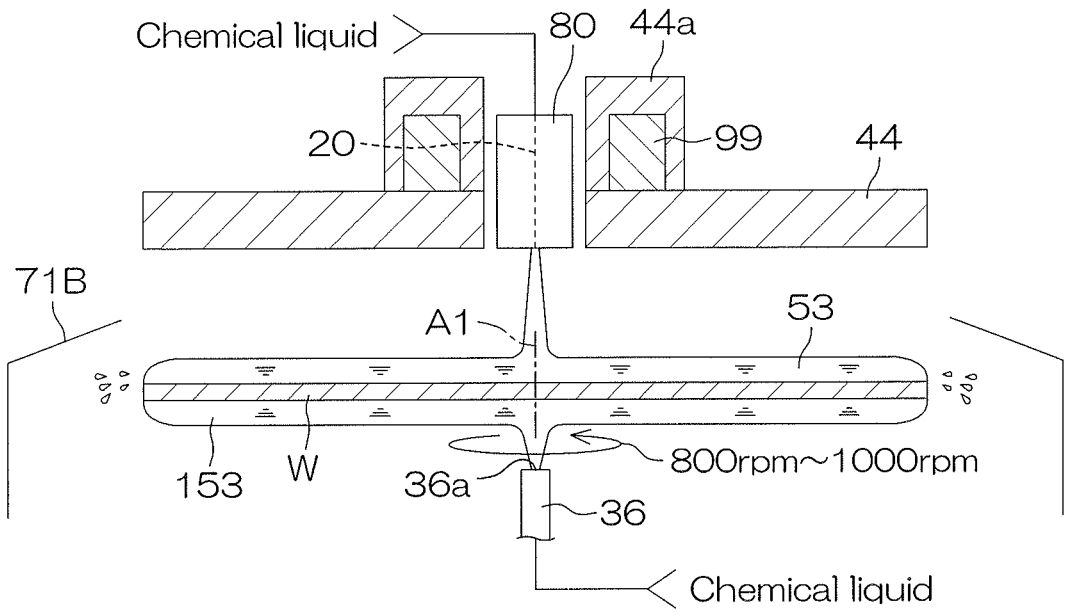
FIG. 11A to FIG. 11H are illustrative sectional views for describing conditions of substrate processing by the processing unit according to the second preferred embodiment.

Next, the controller 3 opens the valve 23. The chemical liquid 53 is thereby supplied from the chemical liquid supply nozzle 20 toward the pattern forming surface that is the upper surface of the substrate W in the rotating state as shown in FIG. 11A. The supplied chemical liquid 53 spreads across substantially the entirety of the pattern forming surface of the substrate W by the action of the centrifugal force.

The controller 3 then opens the valves 120 and 126. The chemical liquid 153 is thereby supplied from the rear surface supply nozzle 36 toward the rear surface that is the lower surface of the substrate W in the rotating state. The supplied chemical liquid 153 spreads across substantially the entirety of the rear surface of the substrate W by the action of the centrifugal force.

After the chemical liquid processing of the fixed period, the rinse processing step (step S2) of replacing the chemical liquid on the pattern forming surface of the substrate W with the rinse liquid to eliminate the chemical liquid from the pattern forming surface of the substrate W is executed.

Figure 11B:
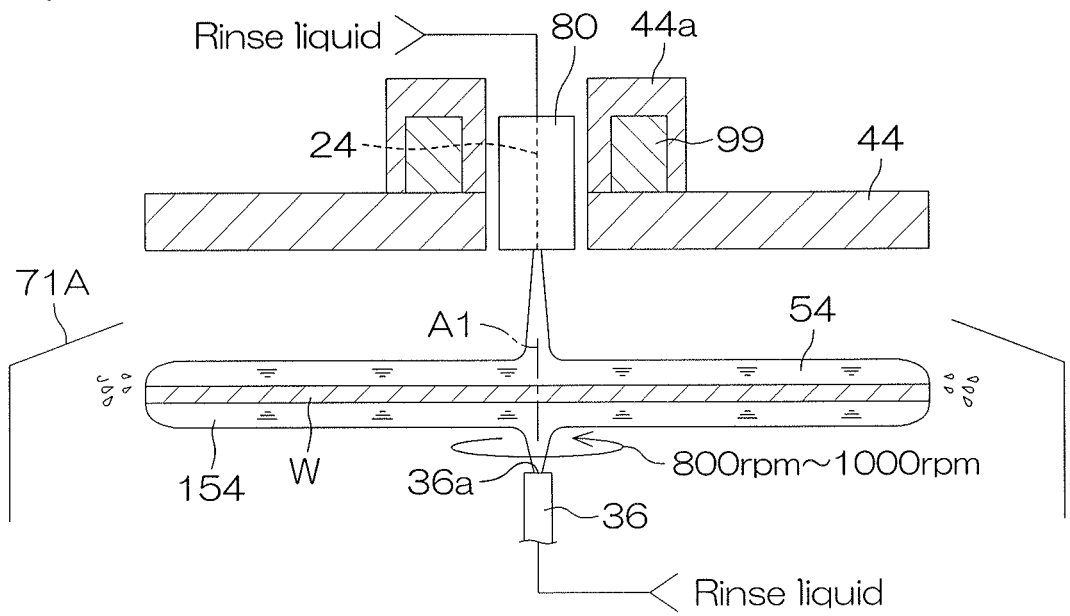

In the rinse processing step, the controller 3 closes the valve 23 to stop the supply of the chemical liquid 53 from the chemical liquid supply nozzle 20. The controller 3 then opens the valve 27. The rinse liquid 54 is thereby supplied from the rinse liquid supply nozzle 24 toward the pattern forming surface of the substrate W in the rotating state as shown in FIG. 11B. The supplied rinse liquid 54 spreads across substantially the entirety of the pattern forming surface of the substrate W by the action of the centrifugal force and replaces the chemical liquid 53.

The controller 3 then closes the valve 126 and opens the valve 125. Thereby, in place of the chemical liquid 153, the rinse liquid 154 is supplied from the rear surface supply nozzle 36 toward the rear surface that is the lower surface of the substrate W in the rotating state. The supplied rinse liquid 154 spreads across substantially the entirety of the rear surface of the substrate W by the action of the centrifugal force and replaces the chemical liquid 153.

In the rinse processing step, the controller 3 controls the spin motor 17 to make the spin base 19 rotate at the predetermined rinse processing speed, which is a substrate rotational speed. The rinse processing speed is, for example, 800 rpm to 1000 rpm. In the rinse processing step, the controller 3 controls the shielding plate elevating/lowering mechanism 46 to maintain the shielding plate 44 at the separated position in continuation to the chemical liquid processing step.

After the rinse processing of the fixed period, the preprocessing liquid supplying step (step S3) of replacing the rinse liquid on the pattern forming surface of the substrate W with the preprocessing liquid is executed.

In the preprocessing liquid supplying step, the controller 3 closes the valve 27 to stop the supply of the rinse liquid 54 from the rinse liquid supply nozzle 24. The controller 3 then controls the spin motor 17 to make the spin base 19 rotate at the predetermined preprocessing liquid supplying speed, which is a substrate rotational speed. The preprocessing liquid supplying speed is, for example, 300 rpm to 500 rpm. The controller 3 then controls the shielding plate elevating/lowering mechanism 46 to move the shielding plate 44 from the separated position to the processing position. The controller 3 then opens the valve 83. The inert gas is thereby supplied from the second inert gas nozzle 81 to the space between the substrate W and the shielding plate 44.

Figure 11C:
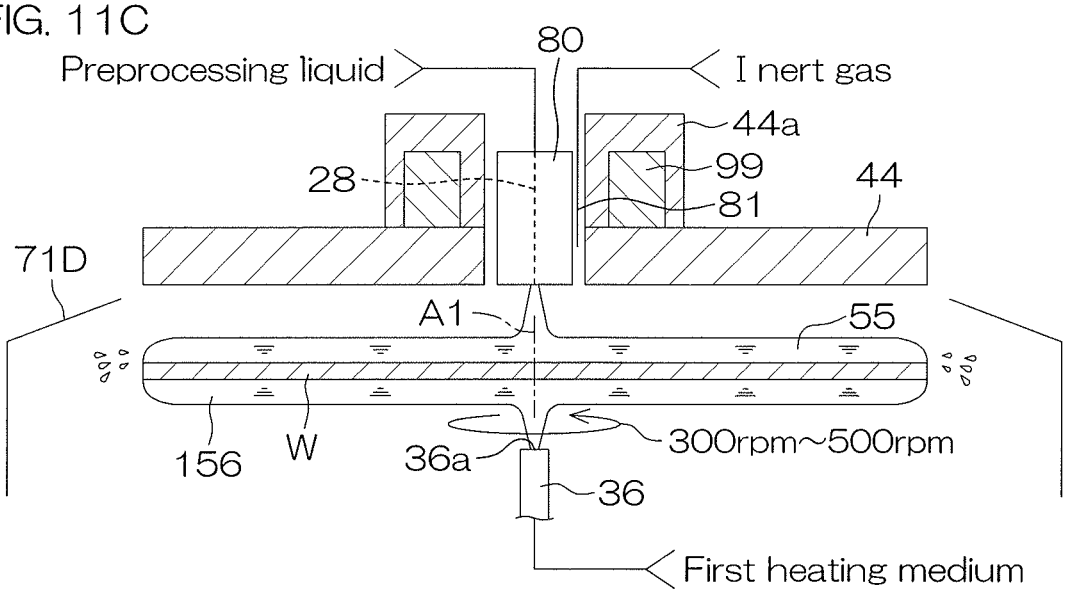

The controller 3 then opens the valve 31. The preprocessing liquid 55 is thereby supplied from the preprocessing liquid supply nozzle 28 toward the pattern forming surface of the substrate W in the rotating state as shown in FIG. 11C. The supplied preprocessing liquid 55 spreads across substantially the entirety of the pattern forming surface of the substrate W by the action of the centrifugal force and replaces the rinse liquid. The controller 3 then closes the valve 125 and opens the valve 122. Thereby, in place of the rinse liquid 154, the first heating medium 156 is supplied from the rear surface supply nozzle 36 toward the rear surface that is the lower surface of the substrate W in the rotating state (first heating medium supplying step). The supplied first heating medium 156 spreads across substantially the entirety of the rear surface of the substrate W by the action of the centrifugal force. By the supply of the first heating medium 156, the temperature of the substrate W is adjusted to a temperature within the melting temperature range. By setting the temperature of the preprocessing liquid 55, supplied from the preprocessing liquid supply nozzle 28, at a temperature within the melting temperature range, the temperature adjustment of the substrate W can be executed even more rapidly.

After the preprocessing liquid supply of the fixed period, the controller 3 closes the valve 31 to stop the supply of the preprocessing liquid from the preprocessing liquid supply nozzle 28.

Next, the processing liquid supplying step (step S4) of supplying the processing liquid onto the pattern forming surface of the substrate W and the temperature maintaining step (temperature adjusting medium supplying step; step S5) of supplying the temperature adjusting medium to the rear surface of the substrate W to maintain the temperature of the supplied processing liquid in a predetermined temperature range are executed. In the second preferred embodiment, the temperature maintaining step is started earlier than the start of the processing liquid supplying step (processing liquid film forming step).

Figure 11D:
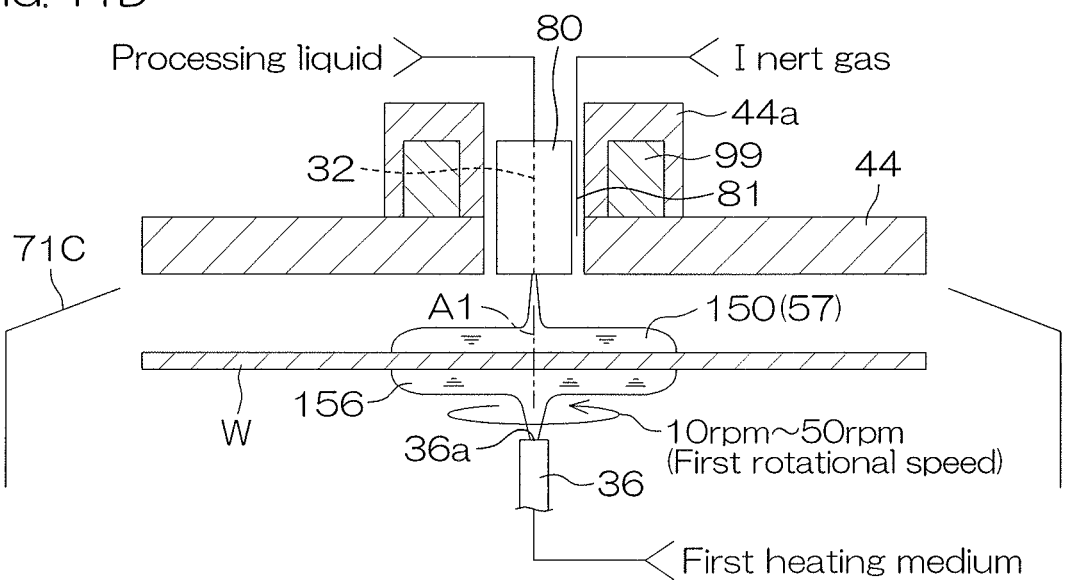

In the processing liquid supplying step, the processing liquid is supplied onto the pattern forming surface of the substrate W to form the processing liquid film 57 on the pattern forming surface of the substrate W (processing liquid film forming step). In the processing liquid film forming step, first, as shown in FIG. 11D, a processing liquid core (processing liquid puddle) 150, smaller than the diameter of the substrate W, is formed as the processing liquid film 57 in the central region that includes the center of the pattern forming surface (core forming step). The processing liquid core 150 formed in the core forming step may spread to a predetermined region broader than the central region as long as it does not reach the peripheral edge of the substrate W, that is, as long as it is smaller than the diameter of the substrate W. A discharge amount of the processing liquid from the processing liquid supply nozzle 32 in the core forming step is set to be smaller than a discharge amount of the processing liquid in the case of supplying the processing liquid film 57 to the entirety of the pattern forming surface of the substrate W.

Specifically, in the core forming step, the controller 3 controls the spin motor 17 to make the spin base 19 rotate at a predetermined core forming speed (first rotational speed) (first substrate rotating step). As the core forming speed, for example, 10 rpm to 50 rpm is favorable. The core forming speed may be less than 10 rpm and the rotation of the substrate W may be stopped (that is, 0 rpm). In the core forming step, the substrate W is rotated at a comparatively low speed and therefore the processing liquid core 150 that spreads uniformly in the predetermined region (stays in the central region) can be formed while suppressing the processing liquid from spreading toward the peripheral edge of the substrate W. The supply of the first heating medium 156 to the rear surface of the substrate W is continued even during the execution of the core forming step. The substrate W is rotated at a comparatively low speed and therefore the first heating medium 156 supplied to the rear surface of the substrate W drops downward from the rear surface before reaching a peripheral edge of the rear surface of the substrate W by the centrifugal force.

Next, the film thinning step (step S6) of thinning the processing liquid film 57 formed on the pattern forming surface of the substrate W is executed while continuing the temperature maintaining step (step S5).

Figure 11E:
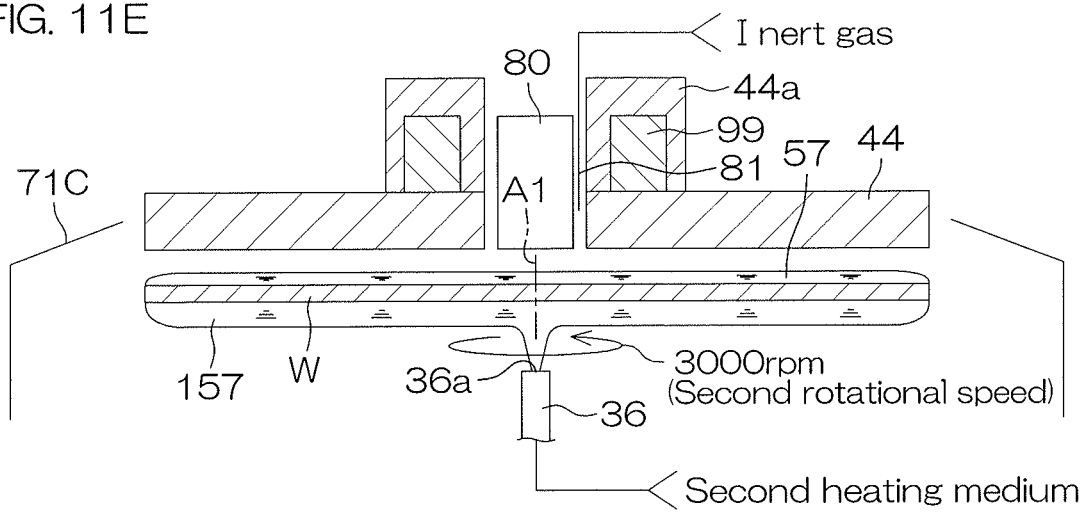

Specifically, referring to FIG. 11E, first, the controller 3 controls the shielding plate elevating/lowering mechanism 46 to lower the shielding plate 44 from the processing position and dispose it at the proximity position. In the state where the shielding plate 44 is disposed at the proximity position, the controller 3 closes the valve 35 to stop the supply of the processing liquid to the pattern forming surface of the substrate W (processing liquid supply stopping step). By stopping the supply of the processing liquid in the state where the shielding plate 44 is disposed at the proximity position, attachment of the temperature adjusting medium, splashed back from the third guard 71C, to the pattern forming surface of the substrate W can be suppressed.

Also, the controller 3 controls the spin motor 17 to make the spin base 19 rotate at a predetermined film enlarging thinning speed (second rotational speed) (second substrate rotating step). The film enlarging thinning speed is, for example, 3000 rpm. In the film thinning step, the substrate W is rotated at a comparatively high speed and therefore the processing liquid core 150, formed in the central region of the pattern forming surface, spreads and thins rapidly to the peripheral edge of the substrate W (film enlarging thinning step).

In the film enlarging thinning step, the controller 3 closes the valve 122 and opens the valve 123. Thereby, the supply of the first heating medium 156 from the rear surface supply nozzle 36 to the rear surface of the substrate W is stopped and the supply of the second heating medium 157 from the rear surface supply nozzle 36 to the rear surface of the substrate W is started (second heating medium supplying step). In the film enlarging thinning step, the substrate W is rotated at a comparatively high speed and therefore the second heating medium 157, supplied to the rear surface of the substrate W, spreads to the peripheral edge of the rear surface of the substrate W.

The thin processing liquid film 57 that spreads to the peripheral edge of the pattern forming surface is formed by the simple method of spreading the processing liquid core 150 to the peripheral edge of the pattern forming surface by the centrifugal force due to the rotation of the substrate W. The film thickness of the frozen body 59 formed in the freezing step, executed after the film thinning step, can thus be reduced appropriately. Further, it suffices to supply, to the pattern forming surface, the processing liquid of an amount such that it spreads thinly to the peripheral edge of the pattern forming surface, and therefore the amount of processing liquid used to form the frozen body 59 can be reduced.

Also, in the present substrate processing, the processing liquid supply stopping step is executed before the start of the film enlarging thinning step and therefore an amount of the processing liquid expelled outside the substrate W in the film thinning step can be reduced. The usage amount of the processing liquid can thereby be reduced further.

Figure 12:
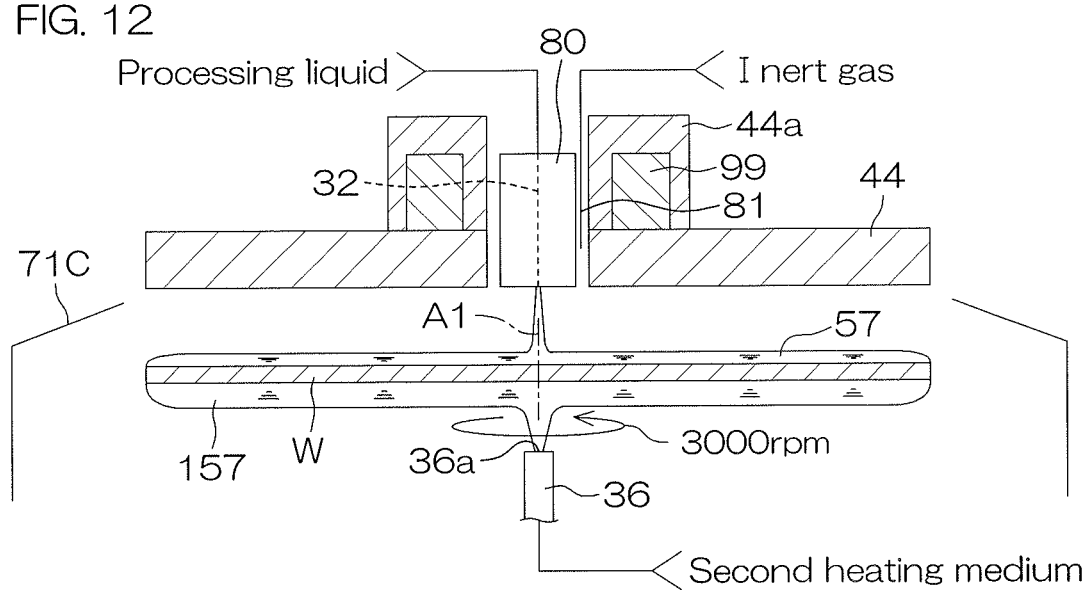
FIG. 12 is an illustrative sectional view for describing a modification example of the substrate processing by the processing unit according to the second preferred embodiment.

Although with the film enlarging thinning step shown in FIG. 11E, the processing liquid supply stopping step is executed, as shown in FIG. 12, the supply of the processing liquid to the pattern forming surface of the substrate W may be continued during the film enlarging thinning step without executing the processing liquid supply stopping step. The processing liquid is thereby replenished to the processing liquid film 57 on the pattern forming surface of the substrate W (processing liquid replenishing step). The processing liquid can thus be spread evenly across the entirety of the pattern forming surface. When, as shown in FIG. 12, the supply of the processing liquid to the pattern forming surface of the substrate W is continued during the film enlarging thinning step without executing the processing liquid supply stopping step, the shielding plate 44 is disposed at the processing position.

Next, the temperature maintaining step (step S5) is ended, and the freezing step (step S7) of freezing the thinned processing liquid film 57 to form the frozen body 59 is executed.

Specifically, first, if the supply of the processing liquid was continued during the film enlarging thinning step, the controller 3 closes the valve 35 to stop the supply of the processing liquid to the pattern forming surface and controls the shielding plate elevating/lowering mechanism 46 to dispose the shielding plate 44 at the proximity position. If the supply of the processing liquid was stopped during the film enlarging thinning step, the shielding plate 44 is kept at the proximity position.

Figure 11F:
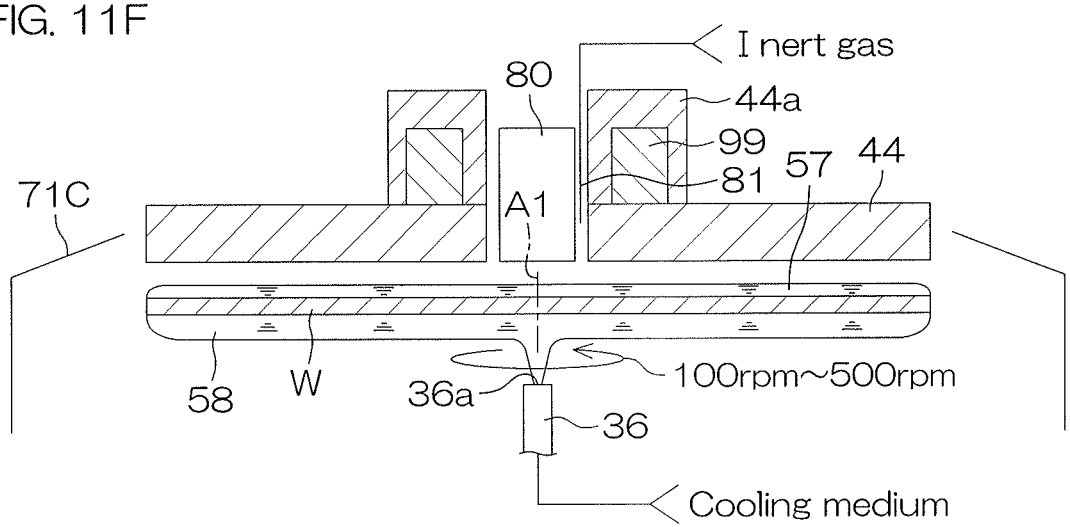

The controller 3 then closes the valve 123 to stop the supply of the second heating medium 157 to the rear surface of the substrate W. The temperature maintaining step (step S5) is thereby ended. Then, as shown in FIG. 11F, the controller 3 opens the valve 124 to start the supply of the cooling medium 58 to the rear surface of the substrate W.

Figure 11G:
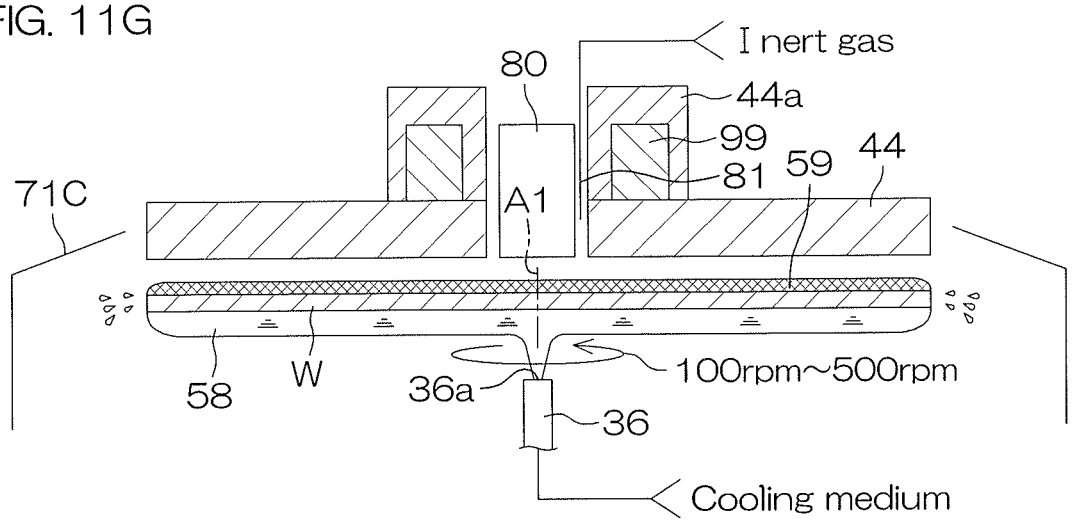

Then, while continuing the supply of the cooling medium 58 to the rear surface of the substrate W, the controller 3 controls the spin motor 17 to make the spin base 19 rotate at the predetermined freezing process speed. The freezing process speed is, for example, 100 rpm to 500 rpm. Thereby, the processing liquid film 57 formed on the pattern forming surface of the substrate W freezes and the frozen body 59 is formed as shown in FIG. 11G.

Next, the sublimating step (step S8) of sublimating and thereby removing the formed frozen body 59 from the pattern forming surface of the substrate W is executed. Also, the dew condensation preventing step (step S9) of preventing the dew condensation on the pattern forming surface of the substrate and the sublimation promoting step (step S10) of promoting the sublimation of the frozen body are executed in parallel to the sublimating step.

Specifically, the controller 3 closes the valve 124 to stop the supply of the cooling medium 58 to the rear surface of the substrate W. Also, the controller 3 drives the FFU 15 and the exhaust apparatus 16 to form the downflow inside the chamber 4 and depressurize the interior of the processing cup 11 from the bottom portion of the processing cup 11 via the exhaust duct 52. The sublimation of the frozen body 59 is thereby promoted and the dew condensation is prevented (sublimation promoting step and dew condensation preventing step).

Figure 11H:
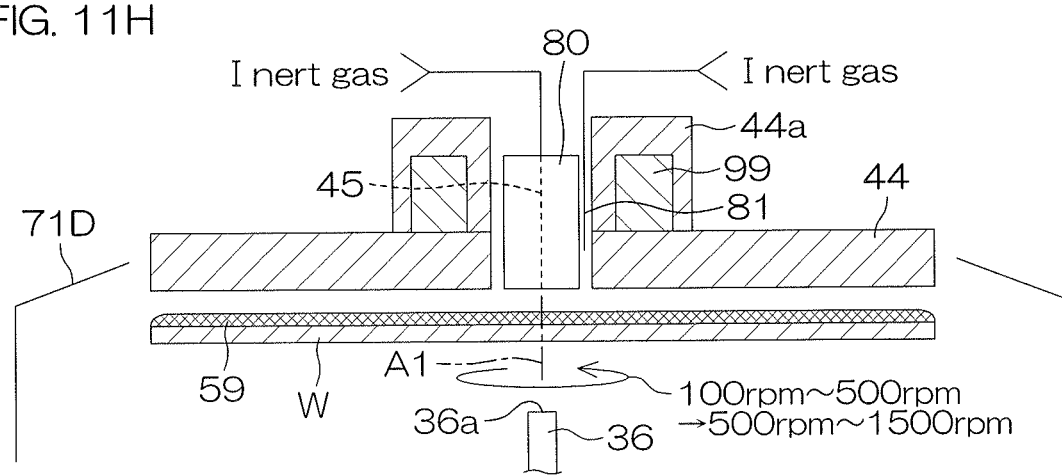

Next, the controller 3 controls the shielding plate elevating/lowering mechanism 46 to keep the shielding plate 44 at the proximity position as shown in FIG. 11H. The atmosphere in the vicinity of the pattern forming surface of the substrate W, specifically, the atmosphere between the shielding plate 44 and the substrate W is thereby shielded from the ambient atmosphere and the dew condensation is prevented (dew condensation preventing step).

Also, the controller 3 opens the valve 48 to supply the inert gas from the discharge port 45*a* at the lower end of the first inert gas nozzle 45 to the central region of the pattern forming surface of the substrate W. By the supplied inert gas, the atmosphere between the lower surface of the shielding plate 44 and the pattern forming surface of the substrate W is dehumidified and the dew condensation is prevented (dew condensation preventing step). Especially when the high-temperature inert gas is supplied, the atmosphere in the vicinity of the pattern forming surface of the substrate W is warmed and the effect of preventing the dew condensation is improved.

Also, by the inert gas being made to flow on the front surface of the frozen body, the sublimation of the frozen body is promoted (sublimation promoting step). Especially when the high-temperature inert gas is supplied, the atmosphere in the vicinity of the pattern forming surface of the substrate W is warmed and the sublimation of the frozen body 59 is promoted further.

In this state, the controller 3 controls the spin motor 17 to make the spin base 19 rotate at the predetermined first sublimating speed, which is a substrate rotational speed. The first sublimating speed is, for example, 100 rpm to 500 rpm. Next, the controller 3 controls the spin motor 17 to make the spin base 19 rotate at the predetermined second sublimating speed, which is a substrate rotational speed. The second sublimating speed is, for example, 500 rpm to 1500 rpm. The frozen body 59 formed on the pattern forming surface of the substrate W is thereby sublimated and removed and the pattern forming surface of the substrate W is dried (sublimating step and sublimation promoting step).

Consequently, as with the first preferred embodiment, the influence of surface tension of a liquid can be eliminated and therefore the pattern forming surface of the substrate W can be dried while suppressing pattern collapse.

Also, with the second preferred embodiment, in the temperature maintaining step, the second heating medium supplying step is executed after the first heating medium supplying step, and in the subsequent freezing step, the substrate cooling step is executed. That is, the processing liquid film 57 is not cooled rapidly from the first temperature within the melting temperature range (temperature range not lower than the melting point of the sublimable substance and lower than the boiling point of the sublimable substance) to the temperature within the freezing temperature range (temperature range not higher than the freezing point (melting point) of the sublimable substance) in the freezing step but is cooled once from the first temperature to the second temperature within the melting temperature range and lower than the first temperature in the temperature maintaining step and thereafter cooled to the temperature within the freezing temperature range in the freezing step. The processing liquid film 57 is thus cooled stepwise and therefore occurrence of a temperature non-uniformity in the processing liquid film 57 in the process of cooling can be suppressed. Forming of a portion in the processing liquid film 57 that does not freeze in the freezing step can thus be suppressed, and occurrence of non-uniformity of sublimation rate of the frozen body 59 in the sublimating step after the freezing step can be suppressed.

Figure 13A:
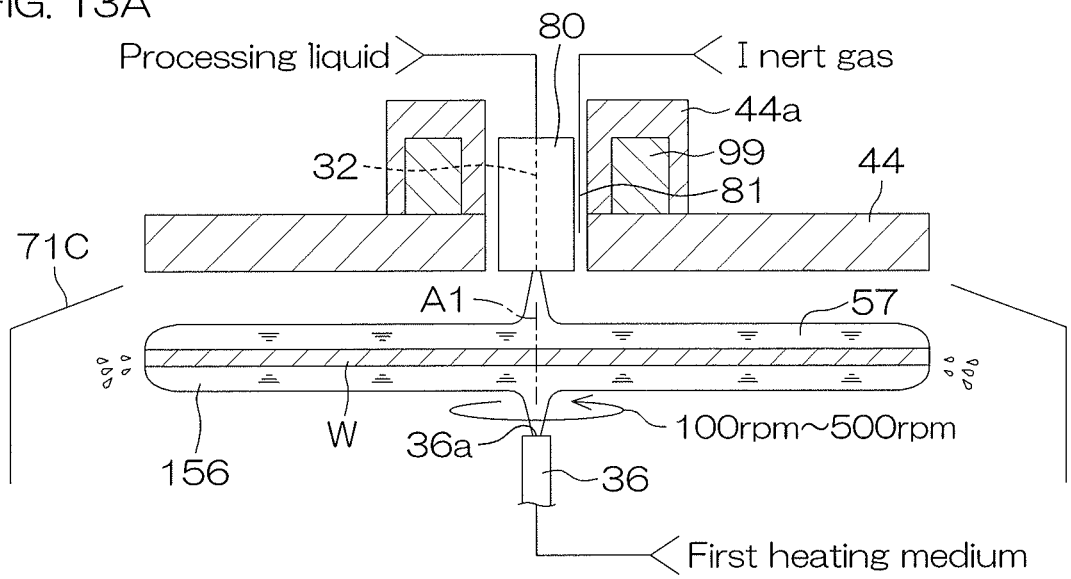
FIG. 13A and FIG. 13B are illustrative sectional views for describing another modification example of the substrate processing by the processing unit according to the second preferred embodiment.
Figure 13B:
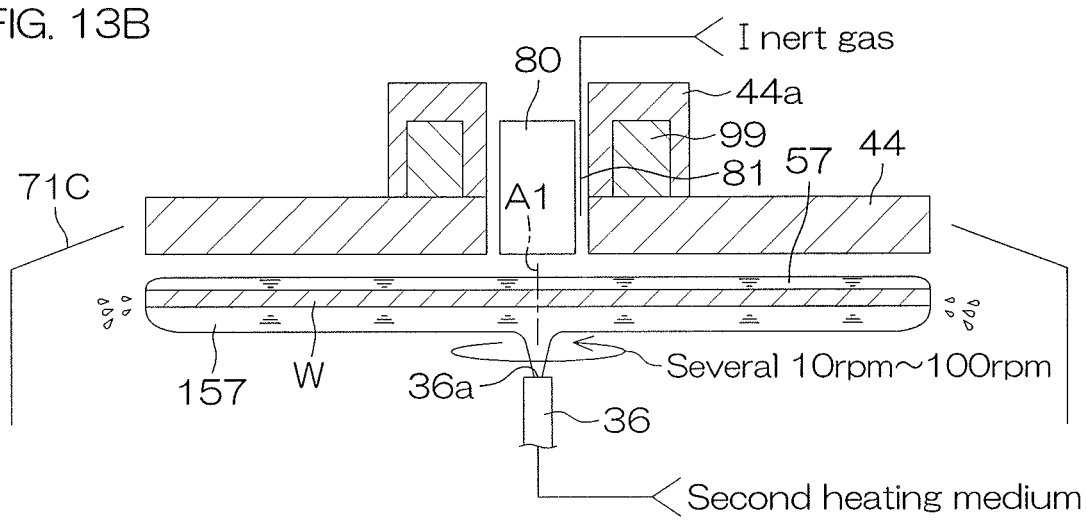

FIG. 13A and FIG. 13B are illustrative sectional views for describing a modification example of the substrate processing by the processing unit 2P.

With the substrate processing described with FIG. 11A to FIG. 11H, the processing liquid core 150 as the processing liquid film 57 is spread and thinned (film enlarging thinning step) in the film thinning step. However, substrate processing with which the processing core 150 is not formed may be executed instead.

Specifically, with the modification example of the substrate processing by the processing unit 2P, the processing liquid film 57 that spreads to the peripheral edge of the pattern forming surface of the substrate W is formed, without forming the processing liquid core 150 (see FIG. 11D), in the processing liquid film forming step (processing liquid supplying step) of step S4 as shown in FIG. 13A. In this process, the supply of the first heating medium 156 to the rear surface of the substrate W (see FIG. 11C), which was started in the preprocessing liquid supplying step, is continued. The controller 3 controls the spin motor 17 to make the spin base 19 rotate at the predetermined processing liquid supplying speed, which is a substrate rotational speed. The processing liquid supplying speed is, for example, 100 rpm to 500 rpm.

Thereafter, as shown in FIG. 13B, in the film thinning step of step S6, the supply of the processing liquid to the pattern forming surface is stopped. The supply of the first heating medium 156 to the rear surface of the substrate W is then stopped and in its place, the second heating medium 157 is supplied to the rear surface of the substrate W. The processing liquid film 57 is thereby cooled stepwise as in the substrate processing described with FIG. 11A to FIG. 11H.

The controller 3 controls the spin motor 17 to make the spin base 19 rotate at a predetermined film removing thinning speed, which is a substrate rotational speed. The film thinning speed is, for example, several 10 rpm to 100 rpm. A portion of the processing liquid on the pattern forming surface is removed from the pattern forming surface by the centrifugal force due to the rotation of the substrate W. The processing liquid film 57 is thereby thinned (film removing thinning step). The processing liquid can thus be made to spread across the entirety of the pattern forming surface reliably and the frozen body 59, formed in the freezing step, can be reduced in film thickness appropriately.

Third Preferred Embodiment

Figure 14:
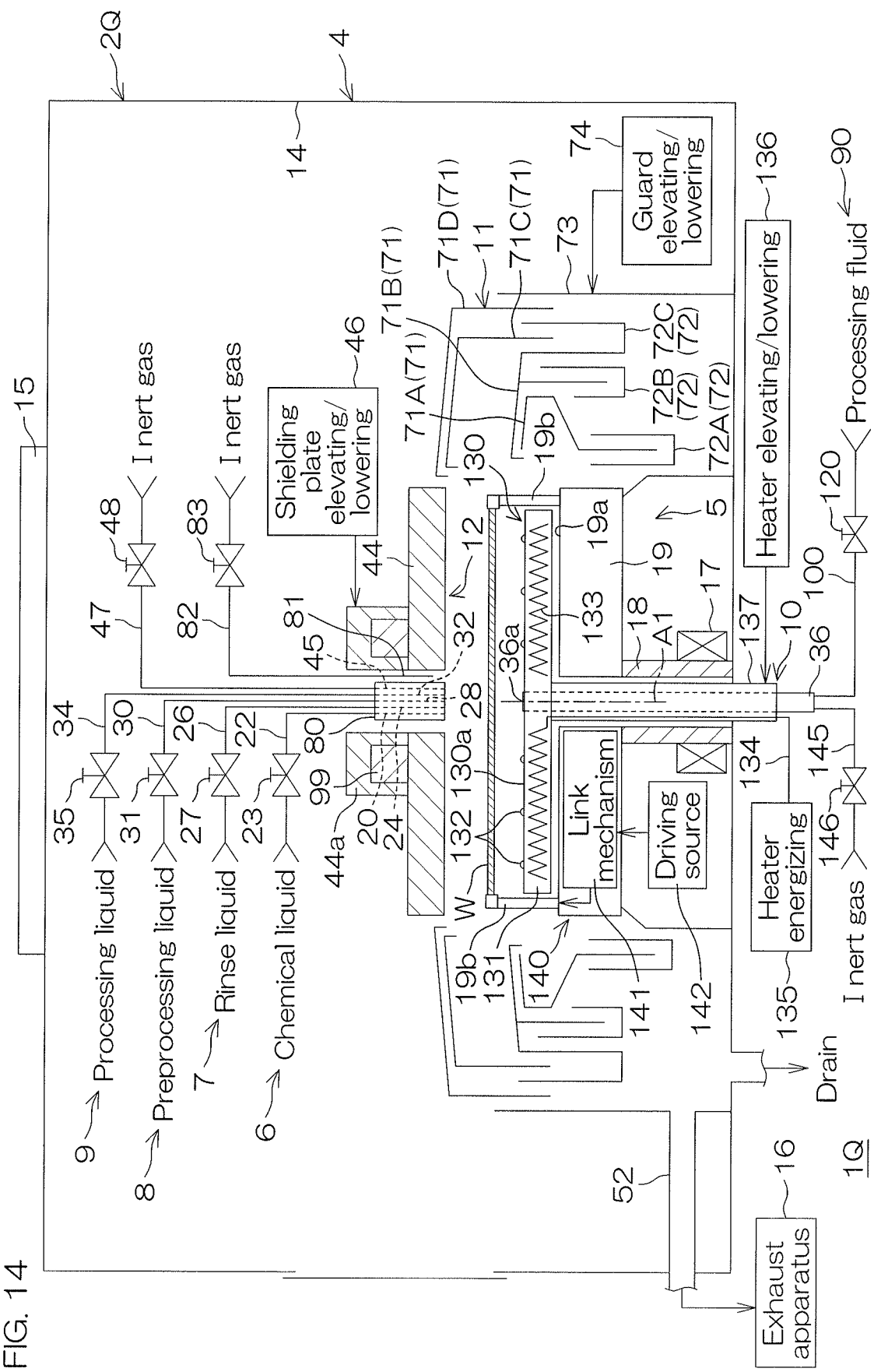
FIG. 14 is a schematic sectional view of the general configuration of a processing unit included in a substrate processing apparatus according to a third preferred embodiment.

FIG. 14 is a schematic sectional view of the general configuration of a processing unit 2Q included in a substrate processing apparatus 1Q according to a third preferred embodiment. In FIG. 14, members that are the same as the members described up to now are provided with the same reference symbols and description thereof shall be omitted (the same applies to FIG. 15A to FIG. 15D described below).

A main point of difference of the processing unit 2Q according to the third preferred embodiment with respect to the processing unit 2P according to the second preferred embodiment is the point that a heater unit 130, which is capable of being elevated and lowered, is provided between the spin base 19 and the substrate W.

The heater unit 130 has a form of a disk-shaped hot plate. The heater unit 130 has a facing surface 130a facing the lower surface of the substrate W from below.

The heater unit 130 includes a plate main body 131, a plurality of support pins 132, and a heater 133. The plate main body 131 is slightly smaller than the substrate W in plan view. The plurality of support pins 132 project from an upper surface of the plate main body 131. The facing surface 130a is constituted of the upper surface of the plate main body 131 and front surfaces of the plurality of support pins 132. The heater 133 may be a resistor body incorporated in the plate main body 131. By energizing the heater 133, the facing surface 130a is heated. Also, electric power from a heater energizing mechanism 135 is supplied via a feeder 134 to the heater 133.

The heater unit 130 is disposed above the spin base 19. The processing unit 2Q includes a heater elevating/lowering mechanism 136 that elevates and lowers the heater unit 130 relative to the spin base 19. The heater elevating/lowering mechanism 136 includes, for example, a ball-screw mechanism and an electric motor that applies a driving force thereto.

An elevating/lowering shaft 137, extending in the vertical direction along the rotational axis A1, is coupled to a lower surface of the heater unit 130. The elevating/lowering shaft 137 is inserted through a penetrating hole, formed in a central portion of the spin base 19, and the hollow spin shaft 18. The feeder 134 is passed through inside the elevating/lowering shaft 137. The heater elevating/lowering mechanism 136 can dispose the heater unit 130 at any intermediate position between a lower position and an upper position by elevating and lowering the heater unit 130 via the elevating/lowering shaft 137.

The heater unit 130 is elevated and lowered (moved) relative to the spin base 19 and a distance between the lower surface of the substrate W and the upper surface of the heater unit 130 is thus changed. That is, the heater elevating/lowering mechanism 136 functions as a distance changing unit.

The rear surface supply nozzle 36 is inserted through the hollow elevating/lowering shaft 137 and further penetrates through the heater unit 130. The discharge port 36a of the rear surface supply nozzle 36 faces the center of the rear surface of the substrate W. The processing fluid supply pipe 90 and a third inert gas supply pipe 145 are connected to the rear surface supply nozzle 36. The third inert gas supply pipe 145 has interposed therein a valve 146 that opens and closes its flow passage. The valve 146 is opened and closed by the controller 3 (see FIG. 10). By the valve 146 being opened, an inert gas is supplied from the discharge port 36a of the rear surface supply nozzle 36 to a central region of the rear surface of the substrate W. The supplied inert gas spreads outward in an atmosphere between the rear surface of the substrate W and the facing surface 130a of the heater unit 130 from the central region of the rear surface of the substrate W and is exhausted out of the atmosphere from the peripheral edge of the rear surface of the substrate W.

The heater unit 130 may be arranged such that, in a process of being elevated to the upper position, it lifts up the substrate W from the clamping members 19b and supports the substrate W by the facing surface 130a. For this purpose, the plurality of clamping members 19b need to be configured such as to be capable of being opened and closed between a closed state of contacting a peripheral end of the substrate W and gripping the substrate W and an open state of being retracted from the peripheral end of the substrate W and such as to separate from the peripheral end of the substrate W to release the grip and meanwhile contact a lower surface of a peripheral edge portion of the substrate W to support the substrate W from below in the open state.

As an configuration that opens and closes the plurality of clamping members 19b, the processing unit 2Q further includes a clamping member drive mechanism 140 that drives the plurality of clamping members 19b to open and close. The clamping member drive mechanism 140 includes, for example, a link mechanism 141, incorporated in the spin base 19, and a driving source 142, disposed outside the spin base 19. The driving source 142 includes, for example, a ball-screw mechanism and an electric motor that applies a driving force thereto.

Referring to a portion indicated by alternate long and two short dashed line in FIG. 10, the controller 3 according to the third preferred embodiment controls, in addition to objects controlled by the controller 3 according to the second preferred embodiment, the heater energizing mechanism 135, the heater elevating/lowering mechanism 136, and the clamping member drive mechanism 140.

With the processing unit 2Q according to the third preferred embodiment, the same substrate processing as that of the flow diagram of FIG. 4 is made possible. In detail, with the exception of the point that the temperature adjustment (heating) of the substrate W in the temperature maintaining step (step S5) is performed using the heater unit 130, the substrate processing by the processing unit 2Q is substantially similar to the substrate processing by the processing unit 2P according to the second preferred embodiment.

FIG. 15A to FIG. 15D are illustrative sectional views for describing conditions of the substrate processing executed by the processing unit 2Q.

In the temperature maintaining step of the substrate processing by the processing unit 2Q, in place of supplying the first heating medium and the second heating medium to the rear surface of the substrate W, the temperature of the substrate W is adjusted by changing a relative position of the heater unit 130 with respect to the substrate W (heater temperature adjusting step).

Figure 15A:
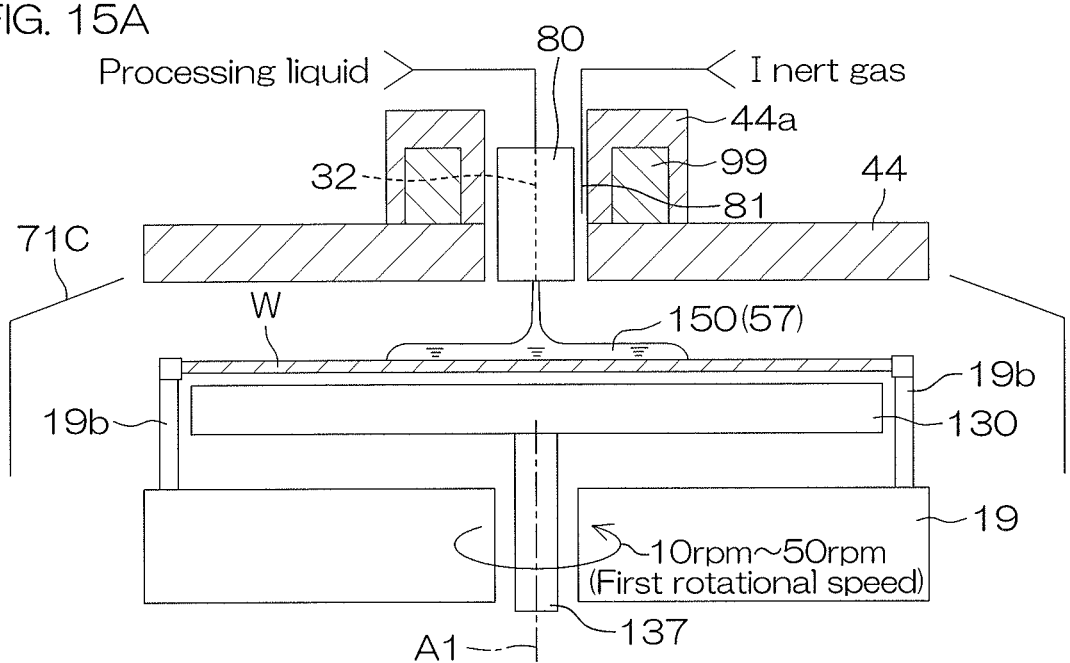
FIG. 15A to FIG. 15D are illustrative sectional views for describing conditions of substrate processing by the processing unit according to the third preferred embodiment.

Specifically, as shown in FIG. 15A, in the core forming step, the controller 3 controls the heater elevating/lowering mechanism 136 to position the heater unit 130 at a first heating position of being in contactless proximity to the rear surface of the substrate W. The entirety of the substrate W is thereby heated uniformly. If there is no need to rotate the substrate W in the core forming step, the first heating position may be a position at which the heater unit 130 lifts up the substrate W. In this case, the clamping members 19b must be in the open state.

Although not illustrated, the temperature maintaining step may be started earlier than the start of the processing liquid supplying step (processing liquid film forming step) by disposing the heater unit 130 at the first heating position even in the preprocessing liquid supplying step.

Figure 15B:
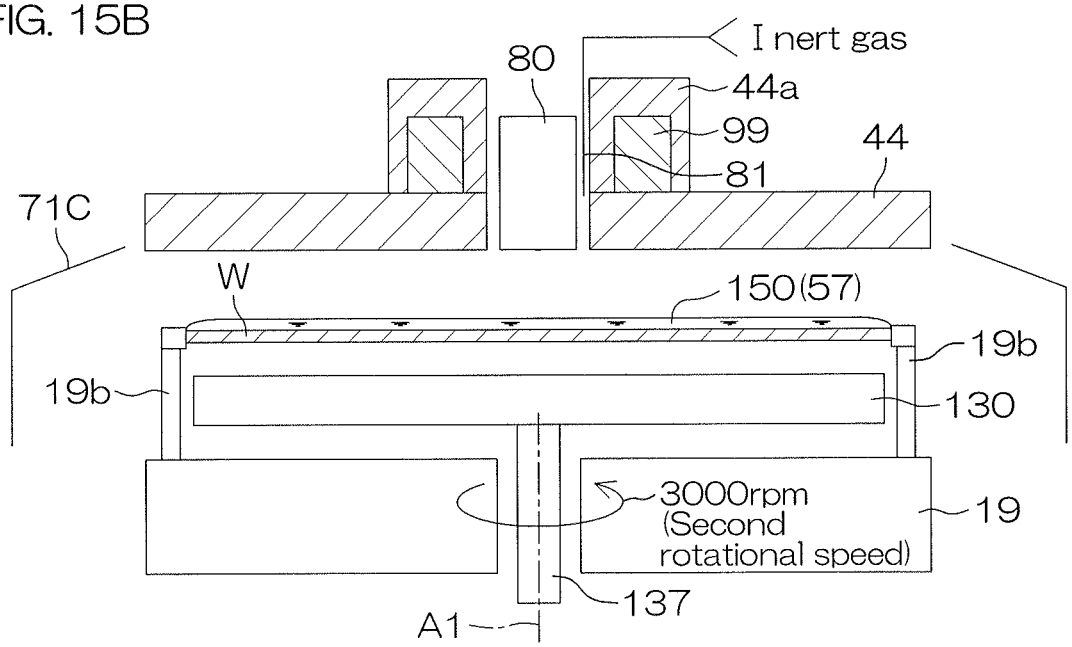

Then, as shown in FIG. 15B, in the film enlarging thinning step, the controller 3 controls the heater elevating/lowering mechanism 136 to move the heater unit 130 to a second heating position of being separated further from the rear surface of the substrate W than the first heating position.

Figure 15C:
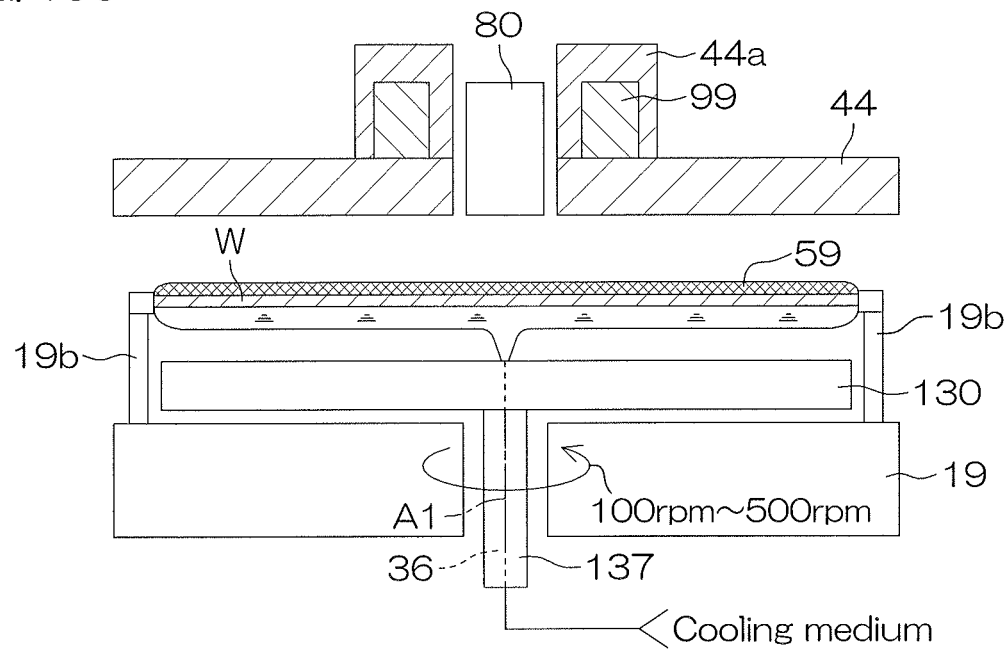

Then, as shown in FIG. 15C, in the freezing step after the end of the temperature maintaining step, the controller 3 controls the heater elevating/lowering mechanism 136 to move the heater unit 130 to the lower position. The controller 3 then opens the valves 120 and 124. Thereby, as in the substrate processing in the second preferred embodiment, the supply of the cooling medium 58 from the rear surface supply nozzle 36 to the rear surface of the substrate W is started. The processing liquid film 57 formed on the pattern forming surface of the substrate W then freezes and the frozen body 59 is formed.

Figure 15D:
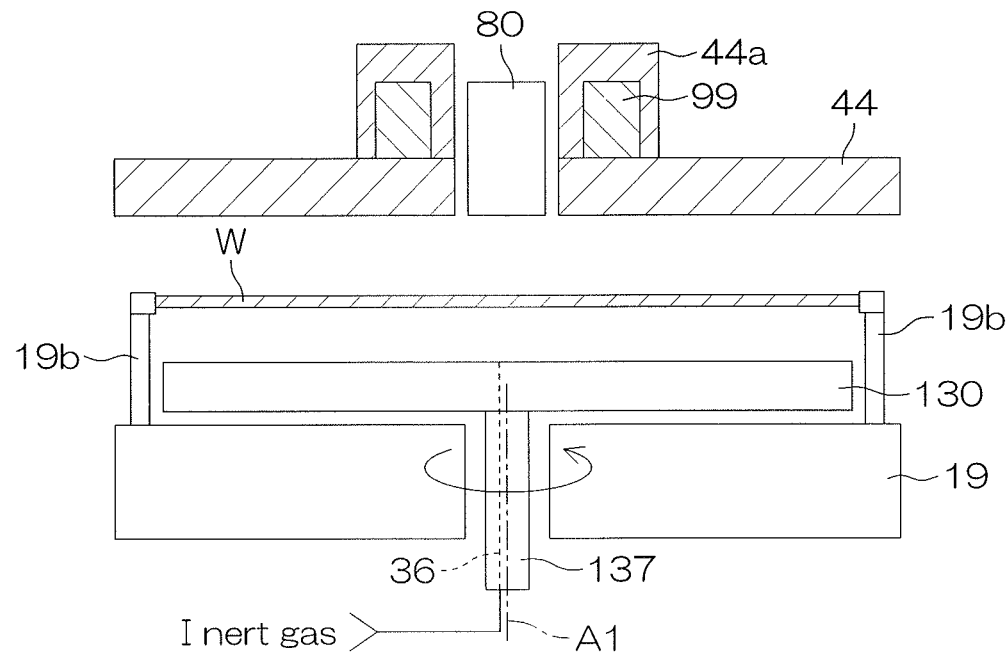

Also, when the heating of the substrate W by the heater unit 130 is not performed, the controller 3 controls the heater elevating/lowering mechanism 136 to dispose the heater unit 130 at the lower position as shown in FIG. 15D. The controller 3 then opens the valve 146. The inert gas is thereby supplied from the rear surface supply nozzle 36 to between the rear surface of the substrate W and the facing surface 130a of the heater unit 130. The atmosphere between the rear surface of the substrate W and the facing surface 130a of the heater unit 130 and the substrate W are thereby cooled and the heating of the substrate W by the heater unit 130 can thus be stopped.

In the substrate processing of the third preferred embodiment, the controller 3 preferably controls the heater energizing mechanism 135 such that the temperature of the heater unit 130 is maintained fixed.

In detail, a time required for temperature change of the heater unit 130 is long in comparison to a time required for temperature change of the substrate W. Therefore if, in a heating step, the substrate W is to be heated upon changing the temperature of the heater unit 130, the substrate W would not reach a desired temperature unless waiting is performed until the heater unit 130 changes to a desired temperature. Time required for the substrate processing may thus become long.

A heat amount transmitted from the heater unit 130 to the substrate W changes in accordance with the distance between the lower surface of the substrate W and the heater unit 130. The temperature of the substrate can thus be changed to a desired temperature by changing the distance between the lower surface of the substrate W and the heater unit 130 in a state where the temperature of the heater unit 130 is maintained fixed. The time required for temperature change of the heater unit 130 can thereby be reduced. And, the time required for the substrate processing can therefore be reduced.

Fourth Preferred Embodiment

Figure 16:
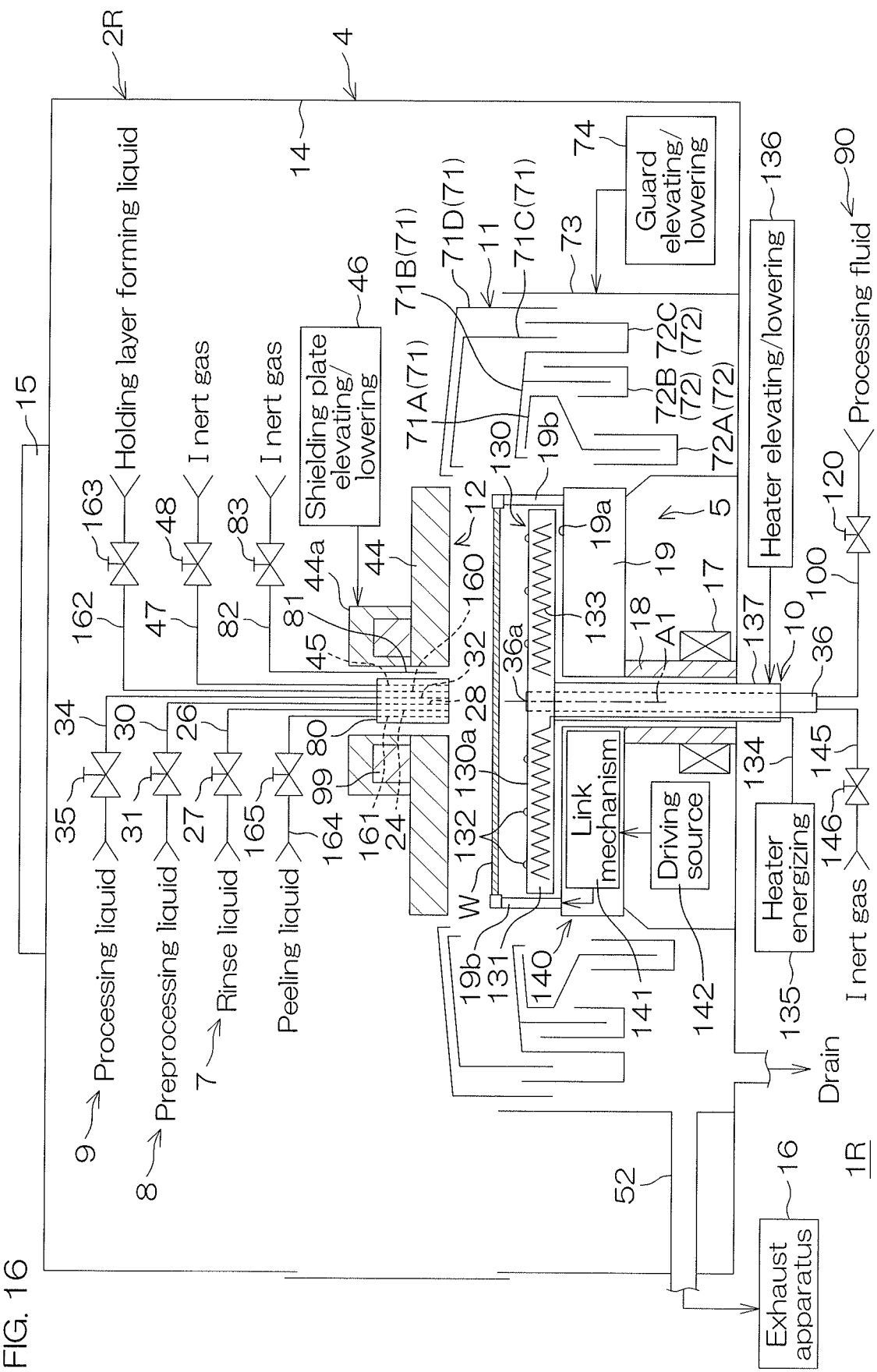
FIG. 16 is a schematic sectional view of the general configuration of a processing unit included in a substrate processing apparatus according to a fourth preferred embodiment.

FIG. 16 is a schematic sectional view of the general arrangement of a processing unit 2R included in a substrate processing apparatus 1R according to a fourth preferred embodiment. In FIG. 16, members that are the same as the members described up to now are provided with the same reference symbols and description thereof shall be omitted (the same applies to FIG. 17 to FIG. 19B described below).

A main point of difference of the processing unit 2R according to the fourth preferred embodiment with respect to the processing unit 2Q according to the third preferred embodiment is the point that the processing unit 2R includes, in place of the chemical liquid supply nozzle 20, a holding layer forming liquid supply nozzle 160 and a peeling liquid supply nozzle 161. The holding layer forming liquid supply nozzle 160 is included in a holding layer forming liquid supplying unit that supplies a holding layer forming liquid to the pattern forming surface of the substrate W. The peeling liquid supply nozzle 161 is included in a peeling liquid supplying unit that supplies a peeling liquid to the pattern forming surface of the substrate W.

The holding layer forming liquid supply nozzle 160 and the peeling liquid supply nozzle 161 are housed in the nozzle housing member 80 together with the rinse liquid supply nozzle 24, the preprocessing liquid supply nozzle 28, the processing liquid supply nozzle 32, and the first inert gas nozzle 45.

The holding layer forming liquid supply nozzle 160 supplies (discharges) the holding layer forming liquid toward the central region of the upper surface of the substrate W. A holding layer forming liquid supply pipe 162 is connected to the holding layer forming liquid supply nozzle 160. The holding layer forming liquid supply pipe 162 has interposed therein a valve 163 that opens and closes its flow passage. The valve 163 is opened and closed by the controller 3 (see FIG. 10).

The holding layer forming liquid contains a solute and a solvent, which has volatility. By solidifying or curing due to volatilization of at least a portion of the solvent, the holding layer forming liquid forms a particle holding layer, by which particles, attached to the pattern forming surface of the substrate W, are separated and held away from the substrate W.

Here, "solidifying" refers, for example, to hardening of the solute due to forces acting between molecules or between atoms, etc., in accompaniment with the volatilization of the solvent. "Curing" refers, for example, to hardening of the solute due to a chemical change, such as polymerization, crosslinking, etc. "Solidifying or curing" thus expresses the "hardening" of the solute due to various causes.

A resin used as the solute of the holding layer forming liquid is, for example, a resin (may hereinafter be referred to as a "thermosensitive water-soluble resin"), having properties of being poorly soluble or insoluble in water before being heated to not lower than a predetermined alteration temperature and altering and becoming water soluble by being heated to not lower than the alteration temperature.

The thermosensitive water-soluble resin expresses water solubility, for example, by decomposing and exposing a functional group with polarity upon being heated to not less than the predetermined alteration temperature (for example, of not lower than 200° C.)

As the solvent of the holding layer forming liquid, a solvent, having a dissolving ability with respect to the thermosensitive water-soluble resin before alteration and having volatility, may be used. Here, "having volatility" means being high in volatility in comparison to water. As the solvent of the holding layer forming liquid, for example, PGEE (propylene glycol monoethyl ether) is used.

The peeling liquid supply nozzle 161 supplies (discharges) the peeling liquid toward the central region of the upper surface of the substrate W. The peeling liquid is a liquid for peeling the particle holding layer, formed by the holding layer forming liquid, from the pattern forming surface of the substrate W. A liquid having compatibility with the solvent contained in the holding layer forming liquid is preferably used as the peeling liquid.

The peeling liquid is, for example, a water-based peeling liquid. As a water-based peeling liquid, the peeling liquid is not restricted to DIW, and carbonated water, electrolyzed ion water, hydrogen water, ozone water, as well as aqueous hydrochloric acid solution of dilute concentration (for example, of approximately 10 ppm to 100 ppm) and aqueous alkaline solution, etc., can be cited. As an aqueous alkaline solution, SC1 solution (ammonia-hydrogen peroxide mixture), aqueous ammonia solution, aqueous solution of a quaternary ammonium hydroxide, such as tetramethylammonium hydroxide, etc., aqueous choline solution, etc., can be cited.

A peeling liquid supply pipe 164 is connected to the peeling liquid supply nozzle 161. The peeling liquid supply pipe 164 has interposed therein a valve 165 that opens and closes its flow passage. The valve 165 is opened and closed by the controller 3 (see FIG. 10).

Figure 17:
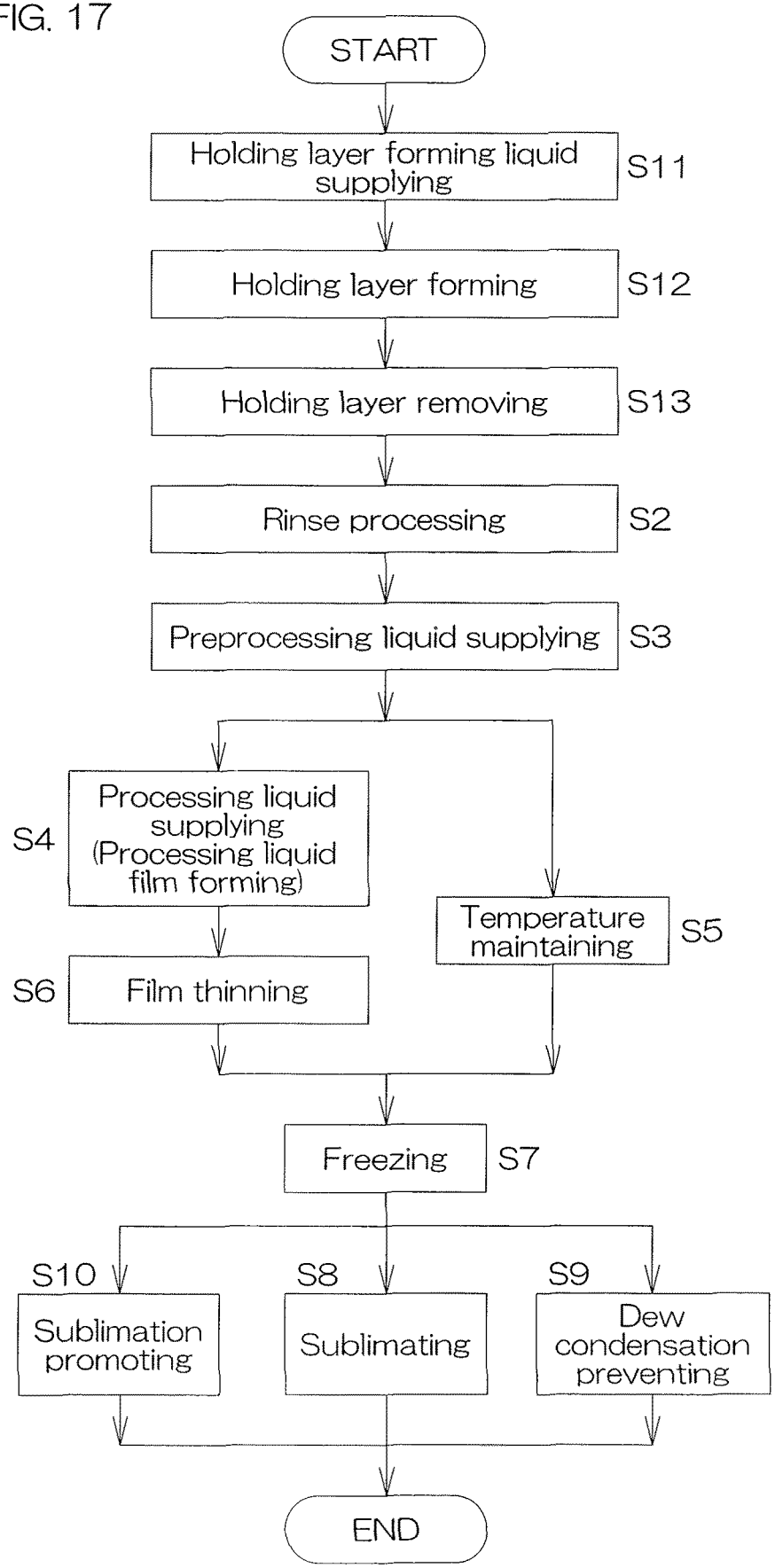
FIG. 17 is a flow diagram for describing substrate processing by the processing unit according to the fourth preferred embodiment.

FIG. 17 is a flow diagram for describing an example of substrate processing by the processing unit 2R according to the fourth preferred embodiment. FIG. 18A to FIG. 18E are illustrative sectional views for describing conditions of the substrate processing by the processing unit 2R. A point of difference of the substrate processing shown in FIG. 17 with respect to the substrate processing shown in FIG. 4 is the point that, in place of the chemical liquid processing step (step S1), a holding layer forming liquid supplying step (step S11), a holding layer forming step (step S12), and a holding layer removing step (step S13) are executed in that order.

Figure 18A:
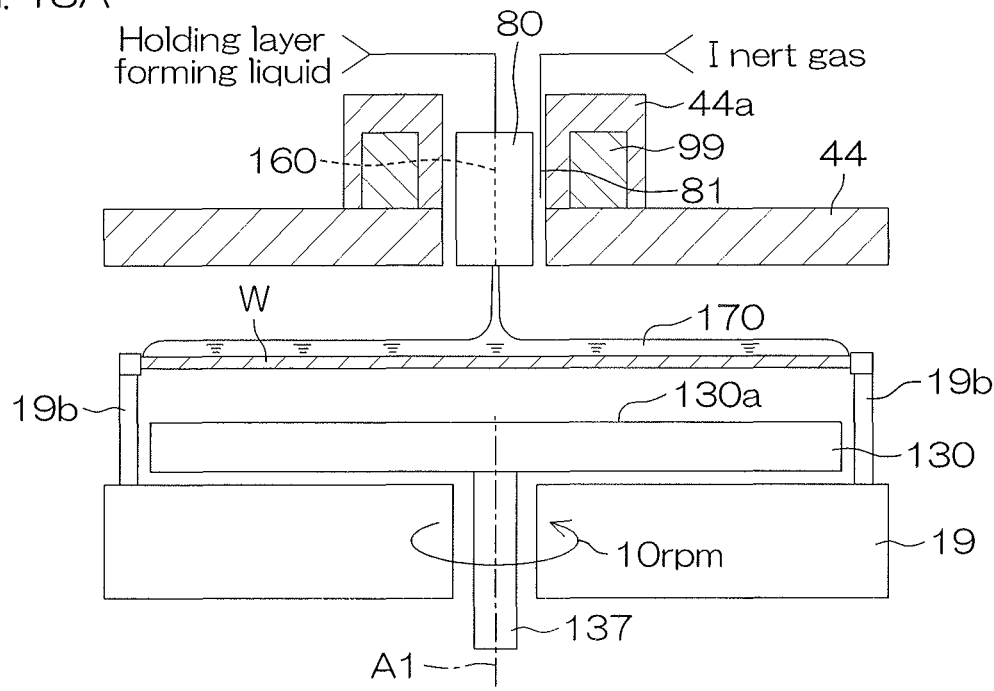
FIG. 18A to FIG. 18E are illustrative sectional views for describing the substrate processing by the processing unit according to the fourth preferred embodiment.

In the substrate processing by the processing unit 2R, the holding layer forming liquid supplying step (step S11) is executed as shown in FIG. 18A. In the holding layer forming liquid supplying step, first, the spin chuck 5 is made to hold the substrate W horizontally (substrate holding step). The controller 3 then drives the spin motor 17 to make the spin base 19 rotate and start rotation of the substrate W (substrate rotating step).

In the holding layer forming liquid supplying step, the spin base 19 is rotated at a predetermined holding layer forming liquid supplying speed, which is a substrate rotational speed. The holding layer forming liquid supplying speed is, for example, 10 rpm.

In the holding layer forming liquid supplying step, the controller 3 controls the shielding plate elevating/lowering mechanism 46 to dispose the shielding plate 44, for example, at the processing position. In the holding layer forming liquid supplying step, the controller 3 controls the heater elevating/lowering mechanism 136 to dispose the heater unit 130 at the lower position.

The substrate holding step and the substrate rotating step are continued until the substrate processing ends. However, if the heater unit 130 lifts up the substrate W, the rotation of the substrate W is stopped.

After the shielding plate 44 is disposed at the processing position, the controller 3 opens the valve 163. The holding layer forming liquid 170 is thereby supplied from the holding layer forming liquid supply nozzle 160 toward the pattern forming surface that is the upper surface of the substrate W in the rotating state. The supplied holding layer forming liquid 170 spreads across substantially the entirety of the pattern forming surface of the substrate W by the action of the centrifugal force.

Figure 18B:
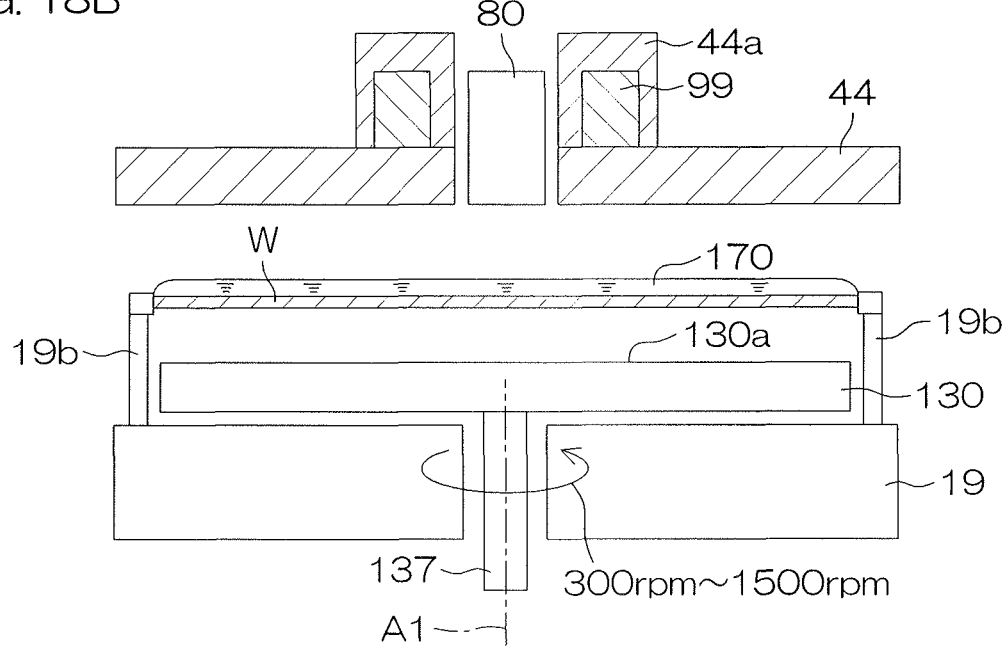
Figure 18C:
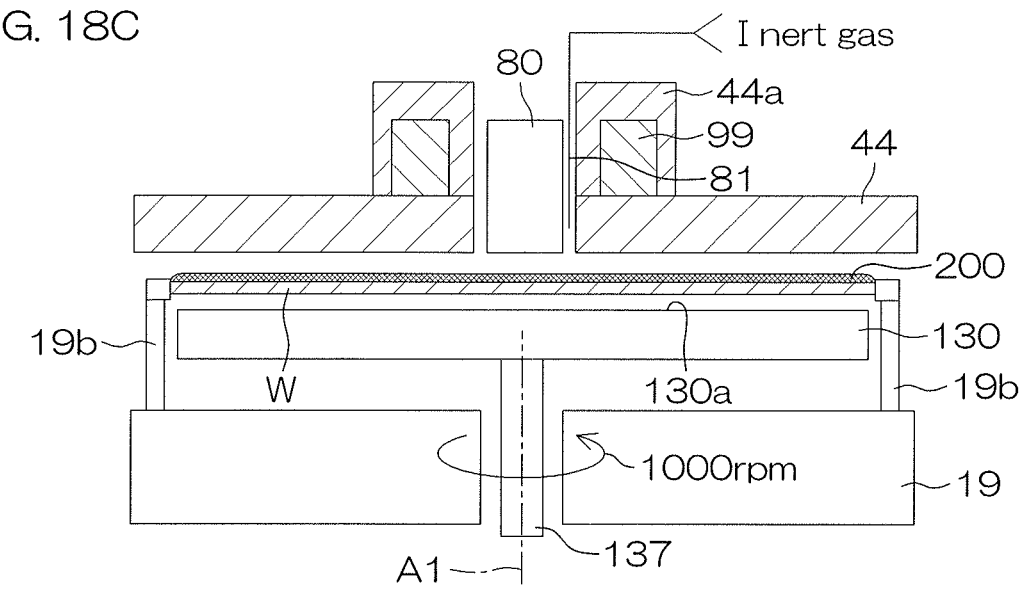

As shown in FIG. 18B and FIG. 18C, after the holding layer forming liquid is supplied to the substrate W for a fixed time, the holding layer forming step (step S12) of solidifying or curing the holding layer forming liquid to form the particle holding layer 200 (see FIG. 18C) on the pattern forming surface of the substrate W is executed. In the holding layer forming step, first, the valve 163 is closed. The supply of the holding layer forming liquid from the holding layer forming liquid 170 supply nozzle 160 is thereby stopped.

Referring to FIG. 18B, in the holding layer forming step, first, a spin-off step of eliminating a portion of the holding layer forming liquid from the pattern forming surface of the substrate W by a centrifugal force to make a thickness of a liquid film of the holding layer forming liquid on the substrate W an appropriate thickness is executed. In the spin-off step, the controller 3 controls the spin motor 17 to make the spin base 19 rotate at a predetermined spin-off speed, which is a substrate rotational speed. The spin-off speed is, for example, 300 rpm to 1500 rpm. In the spin-off step, the shielding plate 44 is kept at the processing position and the heart unit 130 is kept at the lower position.

Referring to FIG. 18C, in the holding layer forming step, a substrate heating step of heating the substrate W (strengthening the heating of the substrate W) to make a portion of the solvent of the holding layer forming liquid on the substrate W volatilize is executed after the spin-off step.

In the substrate heating step, the heater elevating/lowering mechanism 136 disposes the heater unit 130 at a third heating position. The third heating position is, for example, the same position as the first heating position described with the third preferred embodiment. The holding layer forming liquid on the substrate W is thereby heated. In the substrate heating step, the controller 3 controls the shielding plate elevating/lowering mechanism 46 to dispose the shielding plate 44 at the proximity position. In the substrate heating step, the controller 3 controls the spin motor 17 to make the spin base 19 rotate at a predetermined substrate heating process speed, which is a substrate rotational speed. The substrate heating process speed is, for example, 1000 rpm.

In the substrate heating step, the substrate W is preferably heated such that a temperature of the holding layer forming liquid on the substrate W is lower than a boiling point of the solvent. By heating the holding layer forming liquid to the temperature lower than the boiling point of the solvent, the solvent can be made to remain in the particle holding layer 200 as described above. The particle holding layer 200 can then be made readily peelable from the pattern forming surface of the substrate W by interaction of the solvent remaining in the particle holding layer 200 and the peeling liquid.

In the substrate heating step, the substrate W is preferably heated such that the temperature of the holding layer forming liquid on the substrate W is lower than the alteration temperature of the thermosensitive water-soluble resin in addition to the temperature of the holding layer forming liquid on the substrate W being lower than a boiling point of the solvent. By heating the holding layer forming liquid to the temperature lower than the alteration temperature, the particle holding layer 200 that is poorly soluble or insoluble in the water-based peeling liquid can be formed on the pattern forming surface of the substrate W without altering the thermosensitive water-soluble resin to become water-soluble.

Figure 19A:
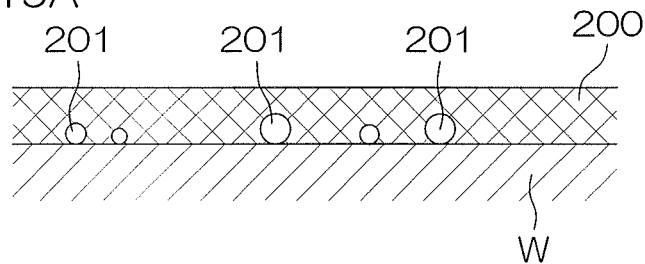
FIG. 19A and FIG. 19B are illustrative sectional views for describing conditions of a particle holding layer in the substrate processing by the processing unit according to the fourth preferred embodiment.

By executing the substrate heating step, the holding layer forming liquid is solidified or cured and the particle holding layer 200 is formed on the substrate W. As shown in FIG. 19A, as the particle holding layer 200 is formed, the particles 201, attached to the pattern forming surface of the substrate W, are separated away from the substrate W and become held in the particle holding layer 200.

It suffices that the holding layer forming liquid be solidified or cured to a degree at which it can hold the particles 201. There is no need for the solvent in the holding layer forming liquid to volatilize completely. Also, a "solute component" that forms the particle holding layer 200 may be the solute itself that is contained in the holding layer forming liquid or may be a component that is derived from the solute, for example, a component obtained as a result of a chemical change.

Figure 18D:
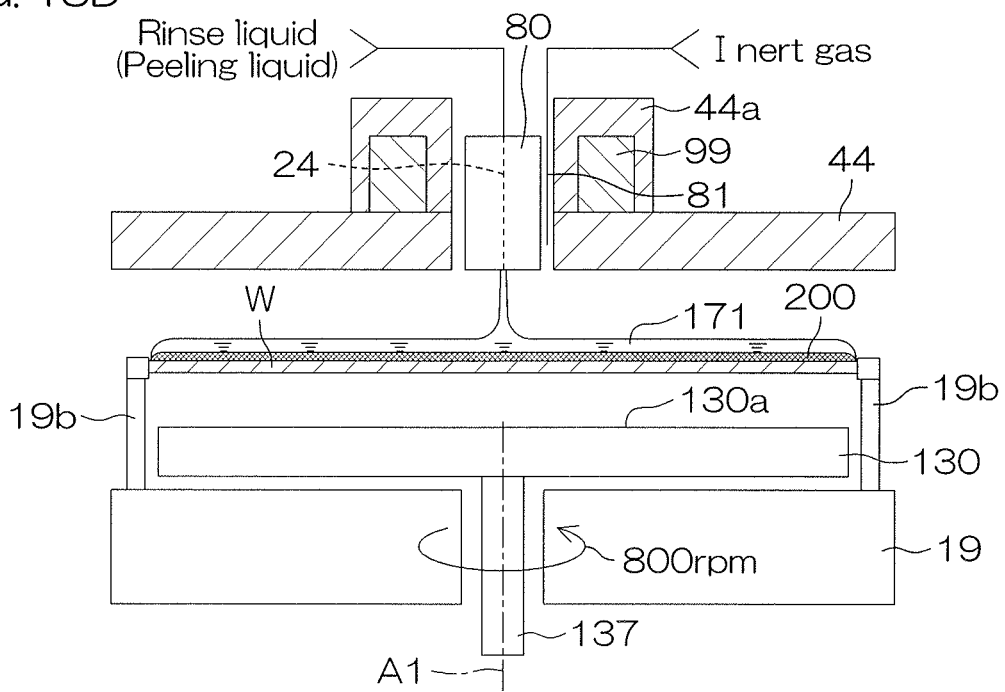
Figure 18E:
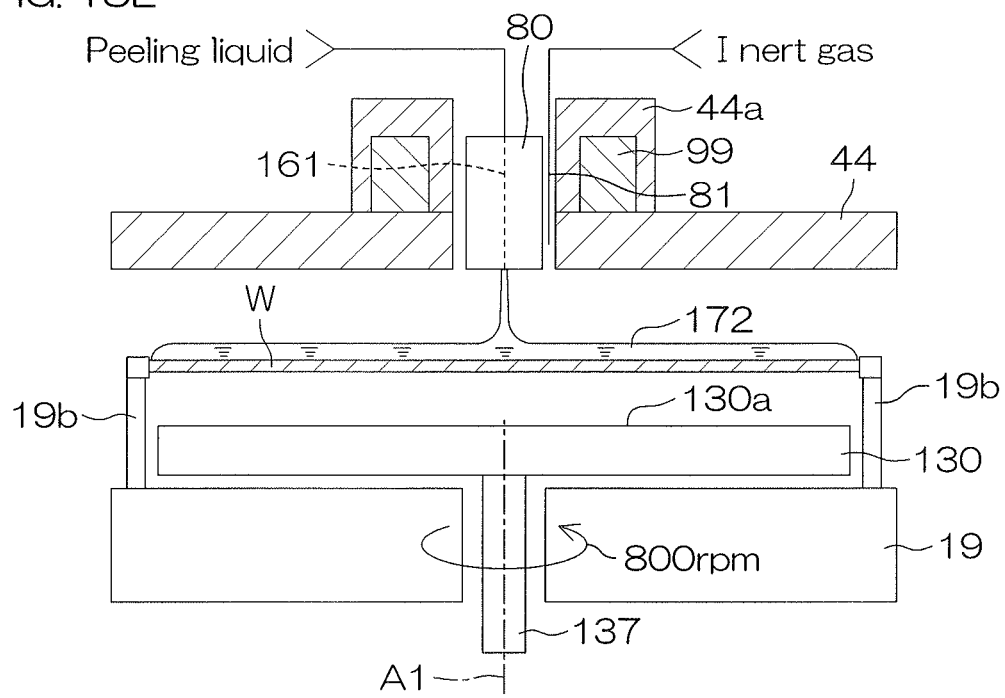

As shown in FIG. 18D and FIG. 18E, after the holding layer forming step, a holding layer removing step (step S13) of supplying the peeling liquid to the pattern forming surface of the substrate W to peel and remove the particle holding layer 200 from the pattern forming surface of the substrate W is executed.

In the holding layer removing step, a first peeling liquid supplying step of supplying the rinse liquid, such as DIW, etc., that also functions as a peeling liquid to the pattern forming surface of the substrate W and a second peeling liquid supplying step of supplying a peeling liquid, such as the SC1, etc., to the pattern forming surface are executed.

Referring to FIG. 18D, in the first peeling liquid supplying step, the controller 3 controls the spin motor 17 to make the spin base 19 rotate at a predetermined first peeling liquid speed, which is a substrate rotational speed. The first peeling liquid speed is, for example, 800 rpm. In the first peeling liquid supplying step, the controller 3 controls the shielding plate elevating/lowering mechanism 46 to move the shielding plate 44 to the processing position. In the first peeling liquid supplying step, the controller 3 controls the heater elevating/lowering mechanism 136 to move the heater unit 130 to the lower position. The controller 3 then opens the valve 27. The rinse liquid is thereby supplied from the rinse liquid supply nozzle 24 toward the pattern forming surface of the substrate W in the rotating state. The rinse liquid 171 supplied to the pattern forming surface of the substrate W spreads across the entirety of the pattern forming surface of the substrate W by the centrifugal force. The rinse liquid 171 supplied to the pattern forming surface of the substrate W is eliminated to a radially outer side from the substrate W by the centrifugal force.

Referring to FIG. 18E, in the second peeling liquid supplying step, the spin motor 17 changes the rotational speed of the spin base 19 to a predetermined second peeling liquid speed. The second peeling liquid speed is, for example, 800 rpm. Therefore, in the second peeling liquid supplying step, the rotational speed of the substrate W in the first peeling liquid supplying step is kept. The controller 3 then closes the valve 23 and opens the valve 166. The peeling liquid, such as the SC1 solution, etc., is thereby supplied from the peeling liquid supply nozzle 161 toward the pattern forming surface of the substrate W. The peeling liquid 172 supplied to the pattern forming surface spreads across the entirety of the pattern forming surface of the substrate W by the centrifugal force and replaces the rinse liquid 171 on the substrate W. The peeling liquid supplied to the pattern forming surface is eliminated to a radially outer side from the substrate W by the centrifugal force. In the second peeling liquid supplying step, the heater unit 130 is kept at the lower position.

Figure 19B:
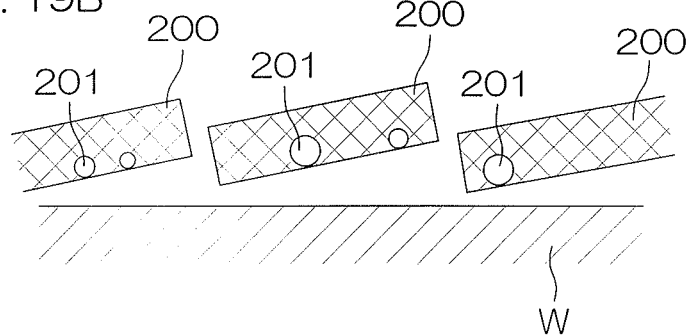

The water-based peeling liquid, such as DIW and the SC1 solution, etc., that is used as the peeling liquid has compatibility with the PGEE serving as the solvent. Moreover, the particle holding layer 200, formed by heating the thermosensitive water-soluble resin to lower than its alteration temperature, is, as mentioned above, poorly soluble or insoluble in DIW and the SC1 solution that are water-based peeling liquids. Therefore, by the interaction with PGEE remaining in the particle holding layer 200, these peeling liquids permeate into the particle holding layer 200 without dissolving the solute component forming the particle holding layer 200. The peeling liquids then reach an interface with the substrate W. The particle holding layer 200 that still holds the particles 201 is thereby lifted and peeled from the pattern forming surface of the substrate W as shown in FIG. 19B.

The particle holding layer 200 peeled from the pattern forming surface of the substrate W is expelled, by the action of the centrifugal force due to the rotation of the substrate W, from the peripheral edge of the pattern forming surface of the substrate W together with the rinse liquid and the peeling liquid. That is, the peeled particle holding layer 200 is removed from the pattern forming surface of the substrate W.

The rinse liquid is lower in effect as a peeling liquid than the SC1 solution. However, by being supplied and permeating into the particle holding layer 200 ahead of the SC1 solution, the rinse liquid replaces at least a portion of the PGEE remaining in the particle holding layer 200. Also, DIW acts to assist the permeation of the SC1 solution, which is supplied in the next step, into the particle holding layer 200. Although it is thus preferable to supply the rinse liquid ahead of supplying the peeling liquid, the supply of the rinse liquid (first peeling liquid supplying step) may be omitted.

After the holding layer removing step (step S13), the rinse liquid processing step (step S2) to the sublimation promoting step (step S10) are executed as in the substrate processing shown in FIG. 4.

In the preprocessing liquid supplying step after the holding layer removing step, for example, IPA is supplied as the preprocessing liquid to the pattern forming surface of the substrate W. IPA has a property of dissolving the solute component forming the particle holding layer 200. IPA thus functions as a residue removing liquid (preprocessing liquid), with which a residue of the particle holding layer 200 (the particle holding layer 200 that was not peeled by the peeling liquid) is dissolved to remove the residue from the pattern forming surface of the substrate W before supplying the processing liquid to the pattern forming surface of the substrate W. The pattern forming surface of the substrate W can thereby be dried in a state where an amount of the particles 201 on the pattern forming surface of the substrate W are reduced further.

With the fourth preferred embodiment, the holding layer forming liquid on the substrate W is heated via the substrate W by the heater unit 130 in the holding layer forming step. By the holding layer forming liquid 170 thereby being solidified or cured, the particle holding layer 200 is formed on the pattern forming surface of the substrate W. As the holding layer forming liquid is solidified or cured, the particles 201 are separated away from the substrate W. The separated particles 201 are held inside the particle holding layer 200. Therefore, by supplying the peeling liquid to the pattern forming surface of the substrate W in the holding layer removing step, the particle holding layer 200 in the state of holding the particles 201 can be peeled and removed from the pattern forming surface of the substrate W.

By the above, the particles 201 can be removed satisfactorily from the pattern forming surface of the substrate W and the front surface of the substrate W can be dried satisfactorily.

In the holding layer forming step, the substrate W is heated such that the temperature of the holding layer forming liquid 170, supplied to the pattern forming surface of the substrate W, becomes the temperature lower than the alteration temperature.

With the present method, in the holding layer forming step, the substrate W is heated such that the temperature of the holding layer forming liquid becomes the temperature lower than the alteration temperature to form the particle holding layer 200. The particle holding layer 200 is thus poorly soluble or insoluble in the peeling liquid and yet peelable by the peeling liquid. Therefore, in the holding layer removing step, the particle holding layer 200, formed on the pattern forming surface of the substrate W, can be peeled and removed, without being dissolved and in the state of holding the particles 201, from the pattern forming surface of the substrate W.

Consequently, by peeling the particle holding layer 200, in the state of holding the particles 201, from the pattern forming surface of the substrate W, the particles 201 can be removed at a high removal rate. Further, a residue due to dissolution of the particle holding layer 200 in the peeling liquid 172 can be suppressed from remaining on or reattaching to the pattern forming surface of the substrate W.

With the fourth preferred embodiment, a thermosensitive water-soluble resin was deemed to be used as the solute of the holding layer forming liquid. However, the resin used as the solute of the holding layer forming liquid may be a resin other than a thermosensitive water-soluble resin.

As examples of a resin, other than a thermosensitive water-soluble resin, to be used as the solute contained in the holding layer forming liquid, acrylic resins, phenol resins, epoxy resins, melamine resins, urea resins, unsaturated polyester resins, alkyd resins, polyurethane, polyimide, polyethylene, polypropylene, polyvinyl chloride, polystyrene, polyvinyl acetate, polytetrafluoroethylene, acrylonitrile-butadiene-styrene resins, acrylonitrile-styrene resins, polyamide, polyacetal, polycarbonate, polyvinyl alcohol, modified polyphenylene ether, polybutylene terephthalate, polyethylene terephthalate, polyphenylene sulfide, polysulfone, polyether ether ketone, polyamide-imide, etc., can be cited. When any of these resins is used in the holding layer forming liquid, any solvent that can dissolve the resin used as the solute may be used.

As the solute of the holding layer forming liquid, a resin, other than a thermosensitive water-soluble resin, does not have an alteration temperature, and therefore in the substrate heating step in the holding layer forming step, there is no need, as in the case of using a thermosensitive water-soluble resin as the solute of the holding layer forming liquid, for the temperature of the holding layer forming liquid to be lower than the alteration temperature of the thermosensitive water-soluble resin and it suffices to heat the substrate W such that the temperature of the holding layer forming liquid on the substrate W is lower than the boiling point of the solvent.

When a resin, other than a thermosensitive water-soluble resin, is used as the solute of the holding layer forming liquid, any liquid having a dissolving ability with respect to the resins may be used as the residue removing liquid. When a resin, other than a thermosensitive water-soluble resin, is used as the solute of the holding layer forming liquid, for example, an organic solvent, such as a thinner, toluene, an acetate ester, an alcohol, a glycol, etc., or an acidic liquid, such as acetic acid, formic acid, hydroxyacetic acid, etc., may be used as the residue removing liquid.

Besides the various resins mentioned above, for example, an organic compound other than a resin or a mixture of an organic compound and another substance may be used as the solute of the holding layer forming liquid. Or, the solute may be a compound other than an organic compound.

As the peeling liquid, another peeling liquid that is not water-based may be used. In this case, a solute, which forms a particle holding layer 200 that is poorly soluble or insoluble in the peeling liquid, a solvent, which has compatibility with the peeling liquid and has a dissolving ability with respect to the solute, a residue removing liquid, having compatibility with the peeling liquid and has a dissolving ability with respect to the solute, etc., should be combined as appropriate.

Fifth Preferred Embodiment

Figure 20:
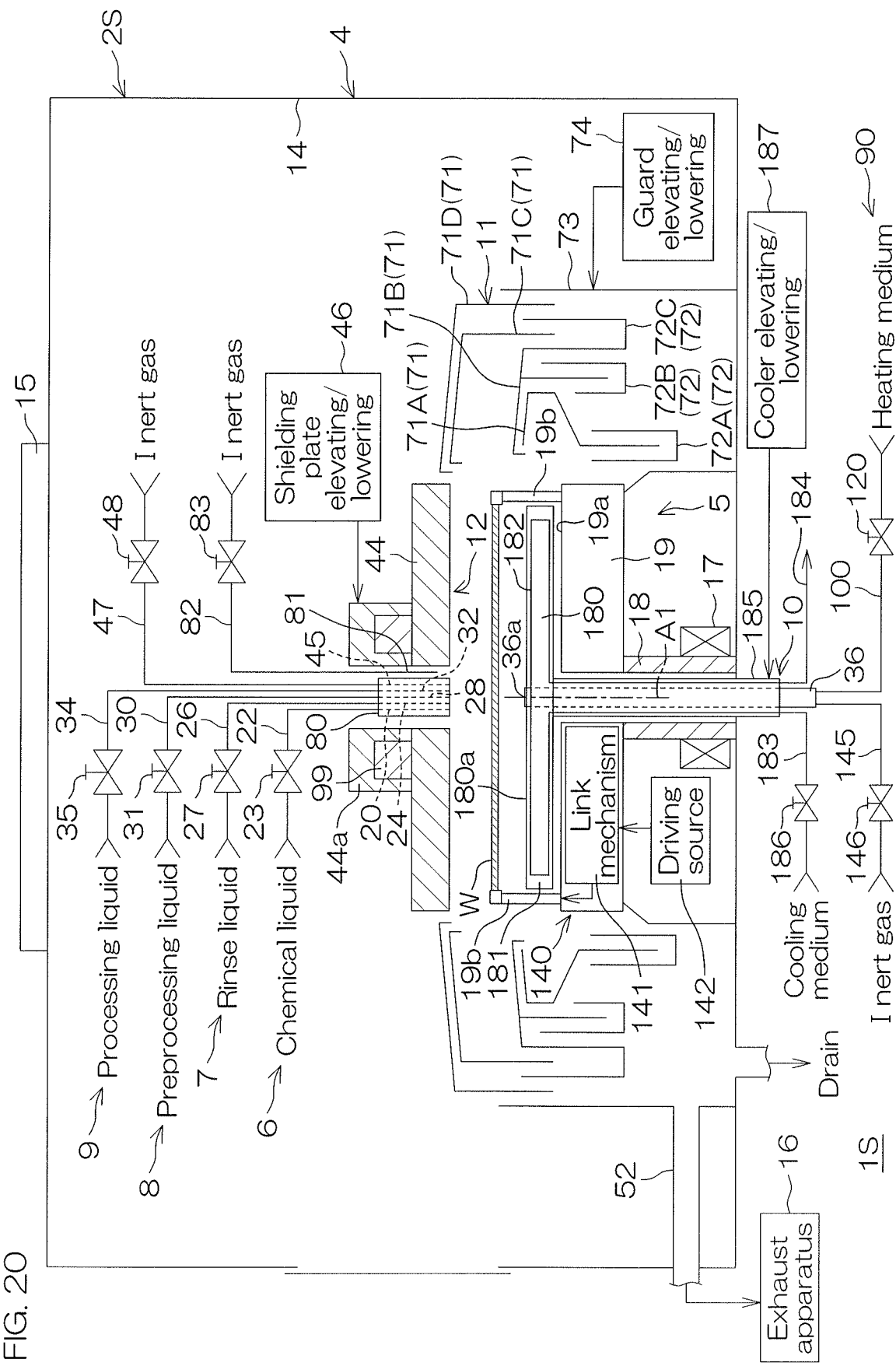
FIG. 20 is a schematic sectional view of the general configuration of a processing unit included in a substrate processing apparatus according to a fifth preferred embodiment.

FIG. 20 is a schematic sectional view of the general configuration of a processing unit 2S included in a substrate processing apparatus 1S according to a fifth preferred embodiment. In FIG. 20, members that are the same as the members described up to now are provided with the same reference symbols and description thereof shall be omitted (the same applies to FIG. 21 to FIG. 24 described below).

The processing unit 2S according to the fifth preferred embodiment differs from the processing unit 2Q according to the third preferred embodiment in the following point. A main point of difference of the processing unit 2S with respect to the processing unit 2Q is that the processing unit 2S includes a cooler unit 180 in place of the heater unit 130.

The cooler unit 180 has a form of a disk-shaped cooler plate. The cooler unit 180 has a facing surface 180*a* facing the lower surface of the substrate W from below.

The cooler unit 180 includes a plate main body 181 and an incorporated cooling medium pipe 182, incorporated in the plate main body 181. The plate main body 181 is slightly smaller than the substrate W in plan view. The facing surface 180*a* is constituted of an upper surface of the plate main body 181.

A cooling medium supply pipe 183, supplying a cooling medium to the incorporated cooling medium pipe 182, and a cooling medium drain pipe 184, draining the cooling medium from the incorporated cooling medium pipe 182, are connected to the incorporated cooling medium pipe 182. A hollow elevating/lowering shaft 185, extending in the vertical direction along the rotational axis A1, is coupled to a lower surface of the cooler unit 180. The elevating/lowering shaft 185 is inserted through a penetrating hole, formed in a central portion of the spin base 19, and the hollow spin shaft 18.

The cooling medium supply pipe 183 and the cooling medium drain pipe 184 are inserted through the elevating/lowering shaft 185. The cooling medium supply pipe 183 has a valve 186 interposed therein. The cooling medium is supplied to the incorporated cooling medium pipe 182 by the valve 186 being opened. The cooler unit 180 is cooled by the cooling medium being supplied to the incorporated cooling medium pipe 182.

The cooler unit 180 is disposed above the spin base 19. The processing unit 2S includes a cooler elevating/lowering mechanism 187 that elevates and lowers the cooler unit 180 relative to the spin base 19. The cooler elevating/lowering mechanism 187 includes, for example, a ball-screw mechanism and an electric motor that applies a driving force thereto.

The cooler elevating/lowering mechanism 187 can dispose the cooler unit 180 at any intermediate position between a lower position and an upper position by elevating and lowering the cooler unit 180 via the elevating/lowering shaft 185.

The cooler unit 180 may be configured such that, in a process of being elevated to the upper position, it lifts up the substrate W from the clamping members 19*b* and supports the substrate W by the facing surface 180*a*. When positioned at the lower position, the cooler unit 180 is separated furthest from the substrate W within a movable range of the cooler unit 180.

The rear surface supply nozzle 36 is inserted through the hollow elevating/lowering shaft 185 and further penetrates through the cooler unit 180. The discharge port 36*a* of the rear surface supply nozzle 36 faces the center of the rear surface of the substrate W. In the fifth preferred embodiment, the heating medium supplied to the rear surface of the substrate W from the rear surface supply nozzle 36 is a gas, such as nitrogen gas or air, etc.

Figure 21:
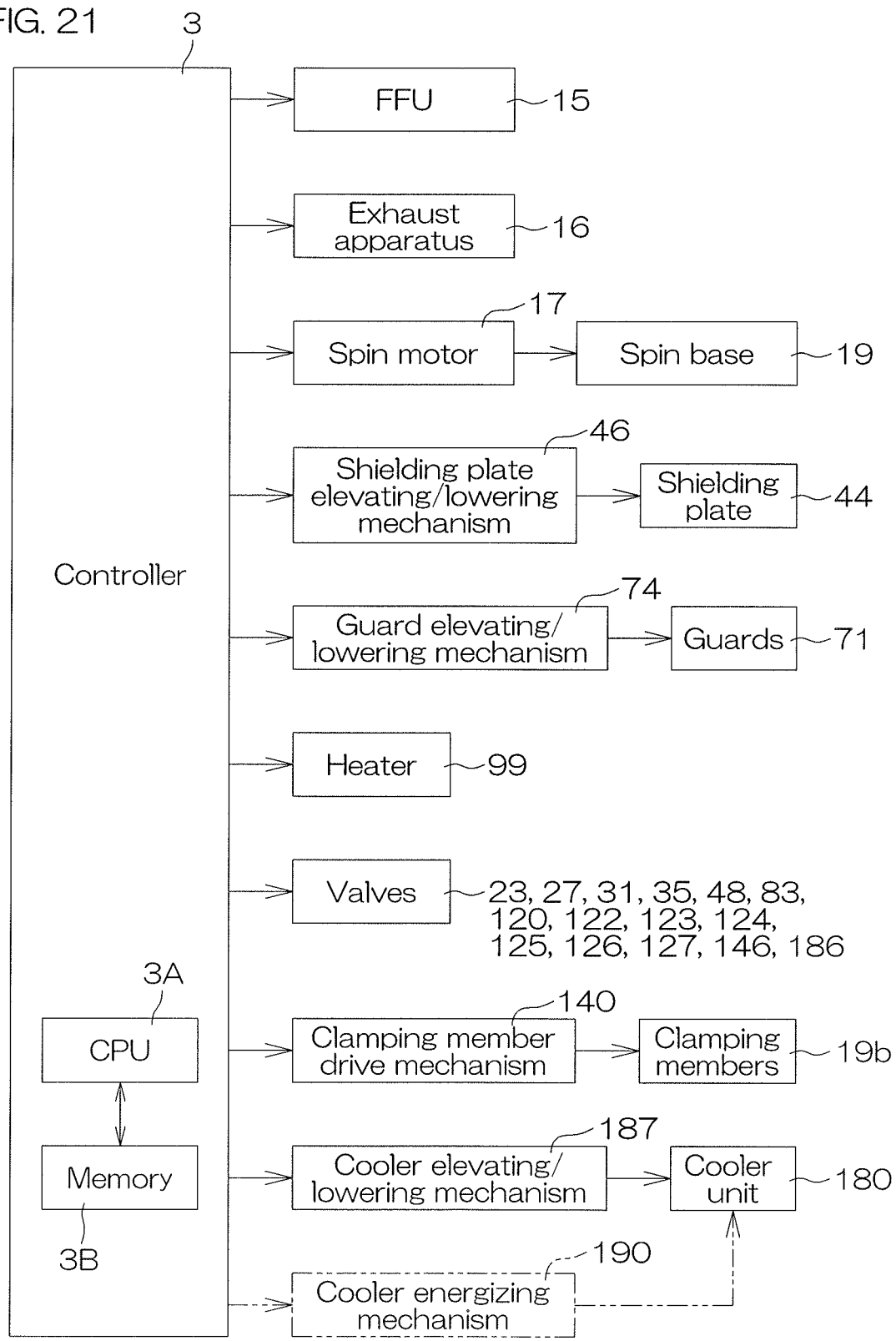
FIG. 21 is a block diagram of the electrical configuration of a main portion of the substrate processing apparatus according to the fifth preferred embodiment.

FIG. 21 is a block diagram of the electrical configuration of a main portion of the substrate processing apparatus 1S. The controller 3 of the substrate processing apparatus 1S is programmed to control the FFU 15, the exhaust apparatus 16, the spin motor 17, the shielding plate elevating/lowering mechanism 46, the guard elevating/lowering mechanism 74, the heater 99, the valves 23, 27, 31, 35, 48, 83, 146, and 186, the clamping member drive mechanism 140, and the cooler elevating/lowering mechanism 187.

With the processing unit 2S according to the fifth preferred embodiment, a substrate processing similar to that of the flow diagram of FIG. 4 is made possible. In detail, with the exception of the point that the cooling of the substrate W in the freezing step (step S7) is performed using the cooler unit 180, the substrate processing by the processing unit 2S is substantially the same as the substrate processing by the processing unit 2Q according to the third preferred embodiment.

Figure 22A:
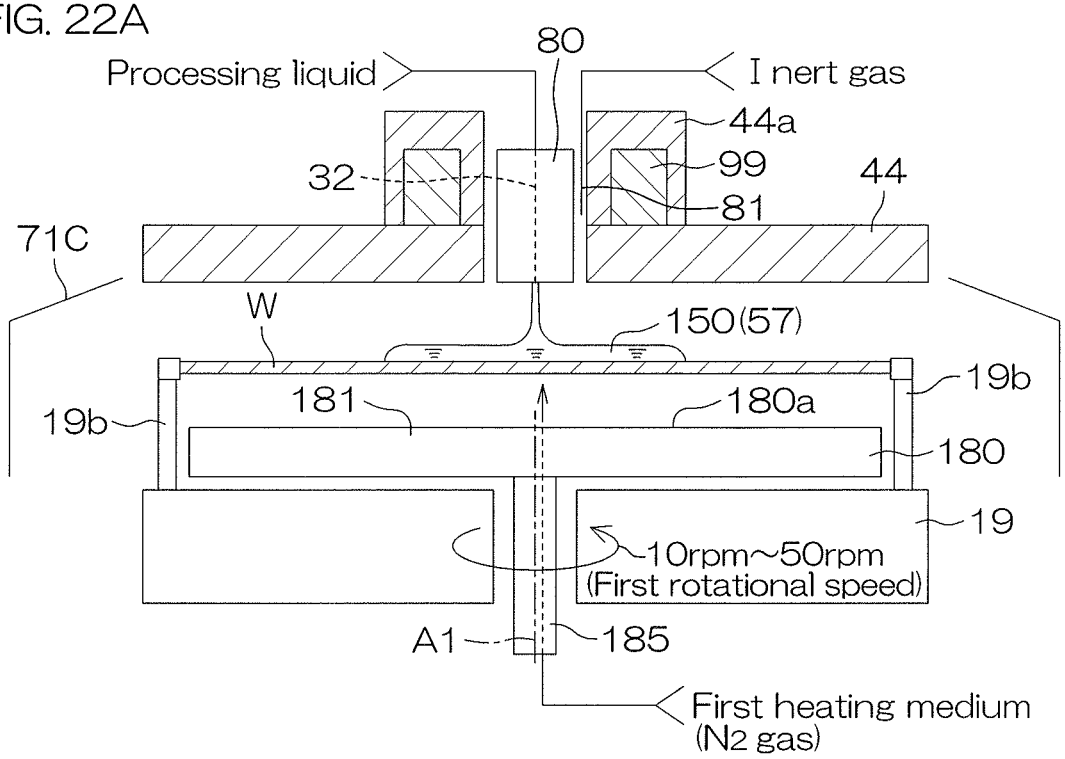
FIG. 22A to FIG. 22C are illustrative sectional views for describing substrate processing by the processing unit according to the fifth preferred embodiment.
Figure 22B:
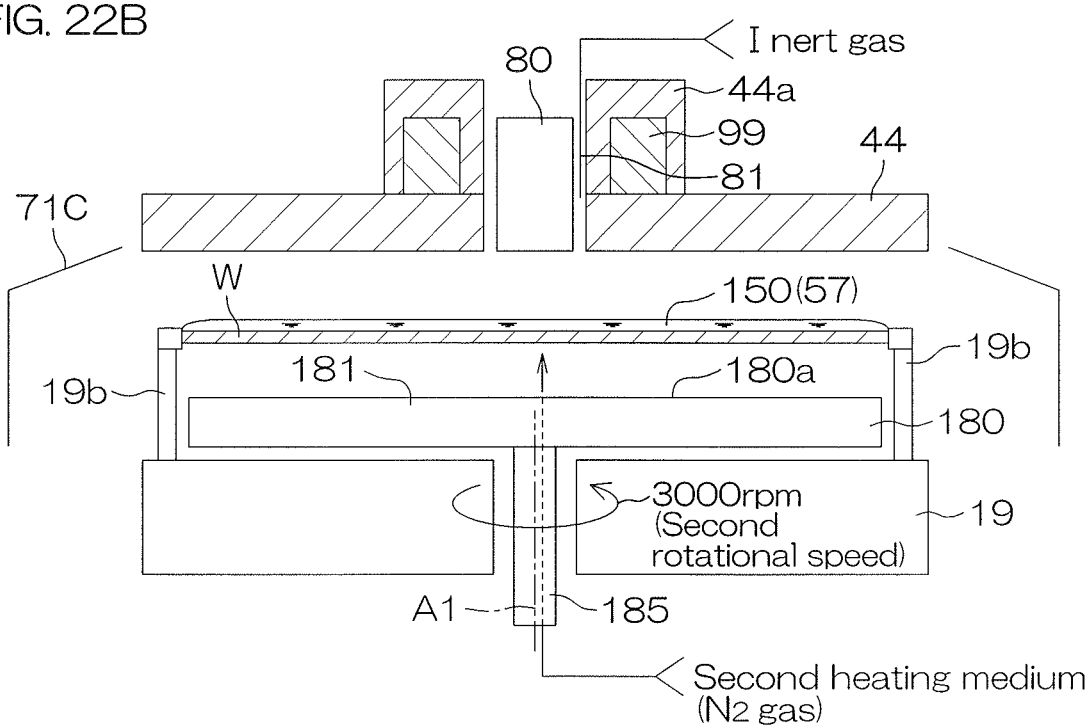
Figure 22C:
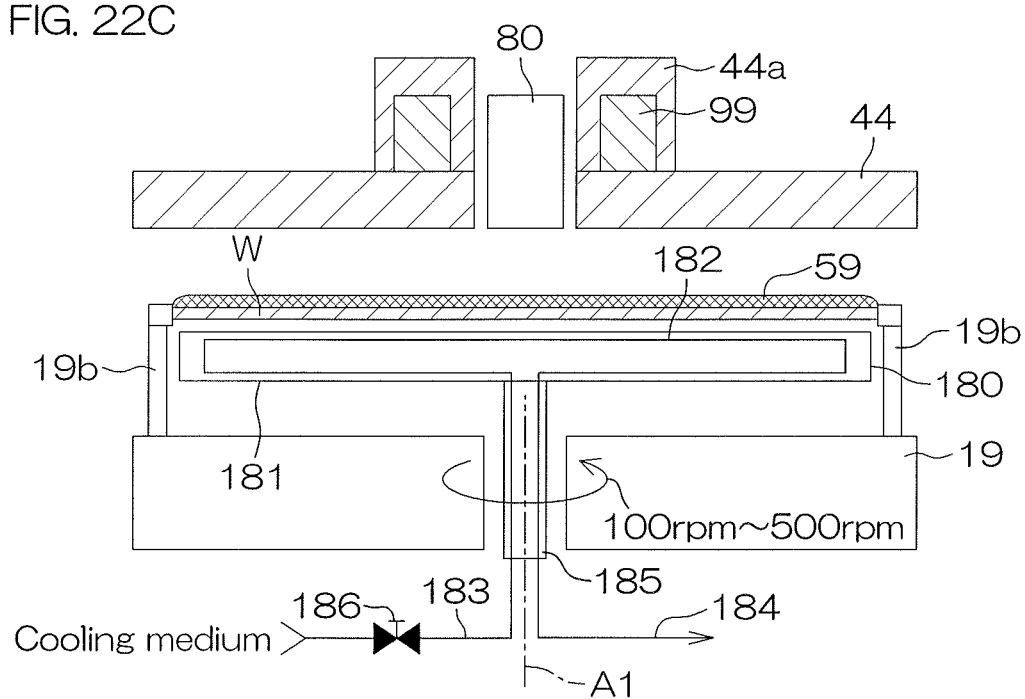

FIG. 22A to FIG. 22C are illustrative sectional views for describing conditions of the substrate processing executed by the processing unit 2S.

In the temperature maintaining step (step S5) of the substrate processing by the processing unit 2S, a gas, such as nitrogen gas, etc., of high temperature (for example, the first temperature) is used as the first heating medium (see FIG. 22A), and nitrogen gas of lower temperature (for example, the second temperature) than the first heating medium is used as the second heating medium (see FIG. 22B). In the temperature maintaining step, the controller 3 controls the cooler elevating/lowering mechanism 187 to dispose the cooler unit 180 at the lower position.

In the freezing step (step S7), the controller 3 opens the valve 186 to start the supply of the cooling medium to the incorporated cooling medium pipe 182. The controller 3 then controls the cooler elevating/lowering mechanism 187 to dispose the cooler unit 180 at a cooling position. The cooling position is a position between the lower position and the upper position.

When positioned at the cooling position, the cooler unit 180 is in contactless proximity to the rear surface of the substrate W. Heat is thereby transmitted to (taken away by) the cooler unit 180 from the substrate W and the substrate W is cooled (substrate cooling step). The processing liquid film 57 is thus cooled via the substrate W to the temperature not higher than the freezing point of the sublimable substance. Heat of a portion of the rear surface of the substrate that faces the facing surface of the cooler unit 180 is thus taken away uniformly by the cooler unit 180 and the processing liquid film 57 is cooled uniformly. Unlike in the fifth preferred embodiment, the cooler unit 180 may contact the substrate W when positioned at the cooling position.

Unlike in the fifth preferred embodiment, the cooling of the substrate W may be controlled just by supplying or not supplying the cooling medium (by switching of the valve 186) without elevating or lowering the cooler unit 180 in the substrate processing. Also, unlike in the fifth preferred embodiment, the valve 186 may be opened constantly during the execution of the substrate processing and the cooling of the substrate W may be controlled just by elevating and lowering the cooler unit 180.

Although unillustrated, when the cooling of the substrate W by the cooler unit 180 is not performed, the controller 3 may open the valve 146 to supply an inert gas of a temperature not lower than the first ordinary temperature from the rear surface supply nozzle 36 to between the rear surface of the substrate W and the facing surface 180*a* of the cooler unit 180. By the atmosphere between the rear surface of the substrate W and the facing surface 180*a* of the cooler unit 180 and the substrate W thereby being heated, the temperature of the substrate W is returned to the first ordinary temperature and the cooling of the substrate W is stopped.

Figure 23:
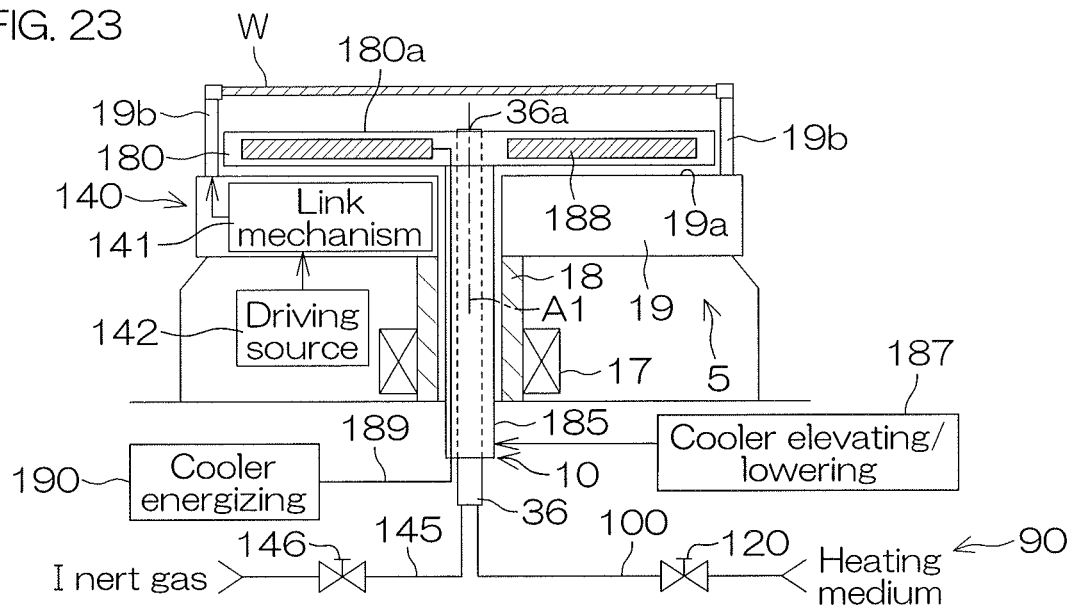
FIG. 23 is a schematic view of a cooler unit and a periphery thereof included in a processing unit according to a modification example of the fifth preferred embodiment.
Figure 24:
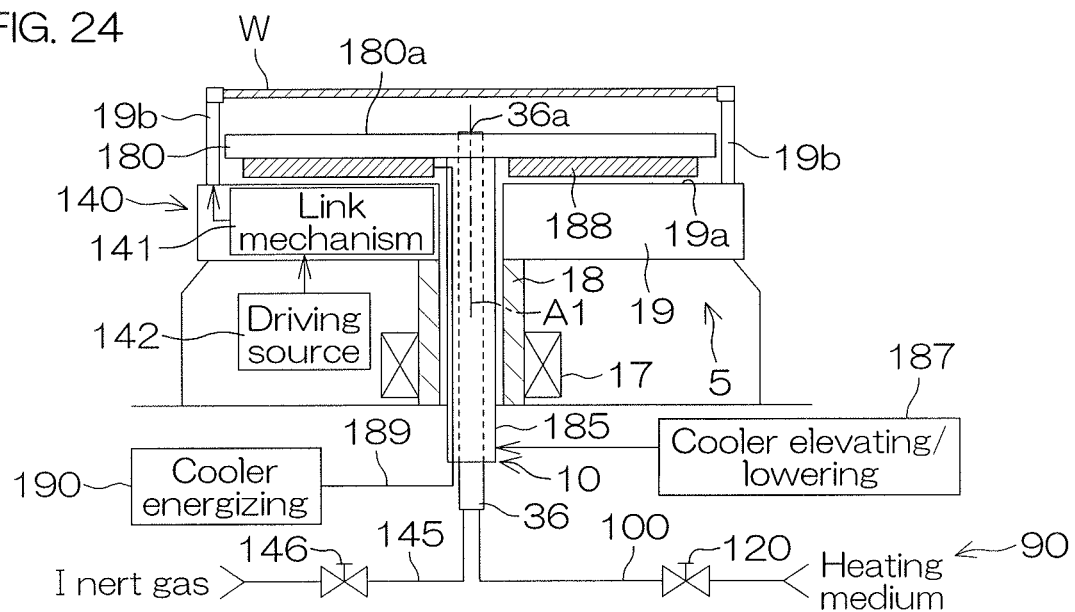
FIG. 24 is a schematic view of a cooler unit and a periphery thereof included in a processing unit according to another modification example of the fifth preferred embodiment.

With the fifth preferred embodiment, the cooler unit 180 includes the plate main body 181 and the incorporated cooling medium pipe 182. However, the cooler unit 180 may have a configuration differing from that of the fifth preferred embodiment. For example, as shown in FIG. 23, the cooler unit 180 may include the plate main body 181 and a Peltier element 188, incorporated in the plate main body 181. By energizing the Peltier element 188, the facing surface 180*a* is cooled. Also, electric power from a cooler energizing mechanism 190 is supplied via a feeder 189 to the Peltier element 188. The cooler energizing mechanism 190 is controlled by the controller 3 (see alternate long and two short dashed line in FIG. 21). The Peltier element 188 is not required to be incorporated in the plate main body 181 and may be mounted to a surface (for example, a lower surface) of the plate main body 181 as shown in FIG. 24.

Even with the arrangement provided with the Peltier element 188, a substrate processing similar to that of the fifth preferred embodiment is made possible. However, the cooling of the substrate W is performed by at least one of either of the elevating/lowering of the cooler unit 180 and the switching of the energization of the Peltier element 188.

When, as the processing liquid, a melt of the sublimable substance is used, there is no need to use a heating medium to maintain the molten state if the melting point of the sublimable substance is not higher than a temperature of an atmosphere inside the chamber 4 (see FIG. 1) and the use of the heating medium may be omitted. In this case, the substrate processing may be executed upon omitting the temperature maintaining step in the fifth preferred embodiment.

<Processing Liquid>

As the processing liquid used in each of the preferred embodiments (first preferred embodiment to fifth preferred embodiment) and the modifications thereof, that which contains the sublimable substance in the molten state, such as the melt of the sublimable substance, etc., or a solution, having the sublimable substance dissolved as a solute in a solvent, etc., may be used as described above.

As the sublimable substance, any of various substances that is high in vapor pressure at the first ordinary temperature (5° C. to 35° C.) and changes from the solid phase to the gas phase without passing through the liquid phase is used as mentioned above. As the sublimable substance, for example, hexamethylenetetramine, 1,3,5-trioxane, ammonium 1-pyrrolidine carbodithioate, metaldehyde, paraffin with approximately 20 to 48 carbon atoms, t-butanol, para-dichlorobenzene, naphthalene, L-menthol, or a fluorohydrocarbon compound, etc., is used. In particular, a fluorohydrocarbon compound may be used as the sublimable substance.

Compound (A): A fluoroalkane with 3 to 6 carbon atoms or a derivative thereof.

Compound (B): A fluorocycloalkane with 3 to 6 carbon atoms or a derivative thereof.

Compound (C): A fluorobicycloalkane with 10 carbon atoms or a derivative thereof.

Compound (D): Fluorotetracyanoquinodimethane or a derivative thereof.

Compound (E): Fluorocyclophosphazene with three or more phosphazene units or a derivative thereof.

<Compound (A)>

As the compound (A), a fluoroalkane with 3 to 6 carbon atoms, expressed by formula (1):

$$C_mH_nF_{2m+2-n} \quad (1)$$

[In the formula, m indicates a number from 3 to 6 and n indicates a number such that $0 \leq n \leq 2m+1$.]

or a derivative thereof can be cited.

Specifically, as examples of the fluoroalkane with 3 carbon atoms, $CF_3CF_2CF_3$, $CHF_2CF_2CF_3$, $CH_2FCF_2CF_3$, $CH_3CF_2CH_3$, $CHF_2CF_2CH_3$, $CH_2FCF_2CH_3$, $CH_2FCF_2CH_2F$, $CHF_2CF_2CHF_2$, $CF_3CHFCF_3$, $CH_2FCHFCF_3$, $CHF_2CHFCF_3$, $CH_2FCHFCH_2F$, $CHF_2CHFCHF_2$, $CH_3CHFCH_3$, $CH_2FCHFCH_3$, $CHF_2CHFCH_3$, $CF_3CH_2CF_3$, $CH_2FCH_2CF_3$, $CHF_2CH_2CF_3$, $CH_2FCH_2CH_2F$, $CH_2FCH_2CHF_2$, $CHF_2CH_2CHF_2$, $CH_3CH_2CH_2F$, $CH_3CH_2CHF_2$, etc., can be cited.

As examples of the fluoroalkane with 4 carbon atoms, $CF_3(CF_2)_2CF_3$, $CF_3(CF_2)_2CH_2F$, $CF_3CF_2CH_2CF_3$, $CHF_2(CF_2)_2CHF_2$, $CHF_2CHFCF_2CHF_2$, $CF_3CH_2CF_2CHF_2$, $CF_3CHFCH_2CF_3$, $CHF_2CHFCHFCHF_2$, $CF_3CH_2CF_2CH_3$, $CF_3CF_2CH_2CH_3$, $CF_3CHFCF_2CH_3$, $CHF_2CH_2CF_2CH_3$, etc., can be cited.

As examples of the fluoroalkane with 5 carbon atoms, $CF_3(CF_2)_3CF_3$, $CF_3CF_2CF_2CHFCF_3$, $CHF_2(CF_2)_3CF_3$, $CHF_2(CF_2)_3CHF_2$, $CF_3CH(CF_3)CH_2CF_3$, $CF_3CHFCF_2CH_2CF_3$, $CF_3CF(CF_3)CH_2CHF_2$, $CHF_2CHFCF_2CHFCHF_2$, $CF_3CH_2CF_2CH_2CF_3$, $CHF_2(CF_2)_2CHFCH_3$, $CHF_2CH_2CF_2CH_2CHF_2$, $CF_3(CH_2)_3CF_3$, $CF_3CHFCHFCF_2CF_3$, etc., can be cited.

As examples of the fluoroalkane with 6 carbon atoms, $CF_3(CF_2)_4CF_3$, $CF_3(CF_2)_4CHF_2$, $CF_3(CF_2)_4CH_2F$, $CF_3CH(CF_3)CHFCF_2CF_3$, $CHF_2(CF_2)_4CHF_2$, $CF_3CF_2CH_2CH(CF_3)CF_3$, $CF_3CF_2(CH_2)_2CF_2CF_3$, $CF_3CH_2(CF_2)_2CH_2CF_3$, $CF_3(CF_2)_3CH_2CF_3$, $CF_3CH(CF_3)(CH_2)_2CF_3$, $CHF_2CF_2(CH_2)_2CF_2CHF_2$, $CF_3(CF_2)_2(CH_2)_2CH_3$, etc., can be cited.

Also, as the derivative of the fluoroalkane with 3 to 6 carbon atoms, a compound, with which at least one type of substituent, selected from the group consisting of halogens other than fluorine (specifically, chlorine, bromine, and iodine), a hydroxyl group, an oxygen atom, alkyl groups, a carboxyl group, and perfluoroalkyl groups, is substituted in any of the fluoroalkanes mentioned above, etc., can be cited.

As examples of the alkyl group, a methyl group, ethyl group, n-propyl group, isopropyl group, n-butyl group, t-butyl group, etc., can be cited.

As examples of the perfluoroalkyl group, saturated perfluoroalkyl groups and unsaturated perfluoroalkyl groups can be cited. Also, the perfluoroalkyl group may be of either a straight-chain structure or a branched structure. As examples of the perfluoroalkyl group, a trifluoromethyl group, perfluoroethyl group, perfluoro-n-propyl group, perfluoroisopropyl group, perfluoro-n-butyl group, perfluoro-sec-butyl group, perfluoro-tert-butyl group, perfluoro-n-amyl group, perfluoro-sec-amyl group, perfluoro-tert-amyl group, perfluoroisoamyl group, perfluoro-n-hexyl group, perfluoroisohexyl group, perfluoroneohexyl group, perfluoro-n-heptyl group, perfluoroisoheptyl group, perfluoroneoheptyl group, perfluoro-n-octyl group, perfluoroisooctyl group, perfluoroneooctyl group, perfluoro-n-nonyl group, perfluoroneononyl group, perfluoroisononyl group, perfluoro-n-decyl group, perfluoroisodecyl group, perfluoroneodecyl group, perfluoro-sec-decyl group, perfluoro-tert-decyl group, etc., can be cited.

<Compound (B)>

As the compound (B), a fluorocycloalkane with 3 to 6 carbon atoms, expressed by formula (2):

$$C_mH_nF_{2m-n} \quad (2)$$

[In the formula, m indicates a number from 3 to 6 and n indicates a number such that $0 \leq n \leq 2m-1$.]

or a derivative thereof can be cited.

Specifically, as examples of the fluorocycloalkane with 3 to 6 carbon atoms, monofluorocyclohexane, dodecafluorocyclohexane, 1,1,4-trifluorocyclohexane, 1,1,2,2-tetrafluorocyclobutane, 1,1,2,2,3-pentafluorocyclobutane, 1,2,2,3,3,4-hexafluorocyclobutane, 1,1,2,2,3,3-hexafluorocyclobutane, 1,1,2,2,3,4-hexafluorocyclobutane, 1,1,2,2,3,3-hexafluorocyclopentane, 1,1,2,2,3,4-hexafluorocyclopentane, 1,1,2,2,3,3,4-heptafluorocyclopentane, 1,1,2,2,3,4,5-heptafluorocyclopentane, 1,1,2,2,3,3,4,4-octafluorocyclopentane, 1,1,2,2,3,3,4,5-octafluorocyclopentane, 1,1,2,2,3,4,5,6-octafluorocyclohexane, 1,1,2,2,3,3,4,4-octafluorocyclohexane, 1,1,2,2,3,3,4,5-octafluorocyclohexane, 1,1,2,2,3,3,4,4,5,6-nonafluorocyclohexane, 1,1,2,2,3,3,4,4,5-nonafluorocyclohexane, 1,1,2,2,3,3,4,5,6-nonafluorocyclohexane, 1,1,2,2,3,3,4,5,5,6-decafluorocyclohexane, 1,1,2,2,3,3,4,4,5,6-decafluorocyclohexane, 1,1,2,2,3,3,4,4,5,5-decafluorocyclohexane, 1,1,2,2,3,3,4,4,5,6-decafluorocyclohexane, perfluorocyclopropane, perfluorocyclobutane, perfluorocyclopentane, perfluorocyclohexane, etc., can be cited.

Also, as the derivative of the fluorocycloalkane with 3 to 6 carbon atoms, a compound, with which at least one type of substituent, disclosed for the compound (A), is substituted in any of the fluorocycloalkanes mentioned above, etc., can be cited.

As specific examples of the derivative of the fluorocycloalkane with 3 to 6 carbon atoms, for example, 1,2,2,3,3-tetrafluoro-1-trifluoromethylcyclobutane, 1,2,4,4-tetrafluoro-1-trifluoromethylcyclobutane, 2,2,3,3-tetrafluoro-1-trifluoromethylcyclobutane, 1,2,2-trifluoro-1-trimethylcyclobutane, 1,4,4,5,5-pentafluor-1,2,2,3,3-pentamethylcyclopentane, 1,2,5,5-tetrafluoro-1,2-dimethylcyclopentane, 3,3,4,4,5,5,6,6-octafluoro-1,2-dimethylcyclohexane, 1,1,2,2-tetrachloro-3,3,4,4-tetrafluorocyclobutane, 2-fluorohexanol, 4,4-difluorocyclohexanone, 4,4-difluorocyclohexanecarboxylic acid, 1,2,2,3,3,4,4,5,5,6,6-undecafluoro-1-(nonafluorobutyl)cyclohexane, perfluoromethylcyclopropane, perfluorodimethylcyclopropane, perfluorotrimethylcyclopropane, perfluoromethylcyclobutane, perfluorodimethylcyclobutane, perfluorotrimethylcyclobutane, perfluoromethylcyclopentane, perfluorodimethylcyclopentane, perfluorotrimethylcyclopentane, perfluoromethylcyclohexane, perfluorodimethylcyclohexane, perfluorotrimethylcyclohexane, etc., can be cited.

<Compound (C)>

As examples of the fluorobicycloalkane with 10 carbon atoms of the compound (C), fluorobicyclo[4.4.0]decane, fluorobicyclo[3.3.2]decane, perfluorobicyclo[4.4.0]decane, perfluorobicyclo[3.3.2]decane, etc., can be cited.

Also, as the compound (C), a derivative with which a substituent is bonded to the fluorobicycloalkane with 10 carbon atoms can be cited as well. As the substituent, a halogen other than fluorine (specifically, chlorine, bromine, or iodine), a cycloalkyl group that may have a halogen atom, or an alkyl group having a cycloalkyl group that may have a halogen atom can be cited.

In the cycloalkyl group that may have a halogen atom, fluorine, chlorine, bromine, or iodine can be cited as the halogen atom. Also, as the cycloalkyl group that may have a halogen atom, a cyclopropyl group, cyclobutyl group, cyclopentyl group, cyclohexyl group, cycloheptyl group, perfluorocyclopropyl group, perfluorocyclobutyl group, perfluorocyclopentyl group, perfluorocyclohexyl group, perfluorocycloheptyl group, etc., can be cited.

In the alkyl group having a cycloalkyl group that may have a halogen atom, fluorine, chlorine, bromine, or iodine can be cited as the halogen atom. Also, in the alkyl group having a cycloalkyl group that may have a halogen atom, a cyclopropyl group, cyclobutyl group, cyclopentyl group, cyclohexyl group, cycloheptyl group, perfluorocyclopropyl group, perfluorocyclobutyl group, perfluorocyclopentyl group, perfluorocyclohexyl group, perfluorocycloheptyl group, etc., can be cited as the cycloalkyl group that may have a halogen atom. As a specific example of the alkyl group having a cycloalkyl group that may have a halogen atom, a difluoro(undecafluorocyclohexyl)methyl group, etc., can be cited.

As specific examples of the compound (C) with which a substituent is bonded to the fluorobicycloalkane with 10 carbon atoms, for example, 2-[difluoro(undecafluorocyclohexyl)methyl]-1,1,2,3,3,4,4,4 a,5,5,6,6,7,7,8,8,8a-heptadecafluorodecahydronaphthalene, etc., can be cited.

<Compound (D)>

As the fluorotetracyanoquinodimethane of the compound (D), for example, tetrafluorotetracyanoquinodimethane, etc., can be cited.

Also, as the compound (D), a derivative with which at least one halogen other than fluorine (specifically, chlorine, bromine, or iodine) is bonded to the fluorotetracyanoquinodimethane can be cited as well.

<Compound (E)>

As the fluorocyclophosphazene of the compound (E), hexafluorocyclotriphosphazene, octafluorocyclotetraphosphazene, decafluorocyclopentaphosphazene, dodecafluorocyclohexaphosphazene, etc., can be cited.

Also, as the compound (E), a derivative with which a substituent is bonded to the fluorocyclophosphazene can be cited as well. As the substituent, a halogen other than fluorine (specifically, chlorine, bromine, or iodine), phenoxy group, alkoxy group (—OR group), etc., can be cited. As the R of the alkoxy group, for example, an alkyl group, such as a methyl group, ethyl group, etc., a fluoroalkyl group, such as a trifluoromethyl group, etc., an aromatic group, such as a phenyl group, etc., etc., can be cited.

As examples of the compound (E) with which a substituent is bonded to the fluorocyclophosphazene, hexachlorocyclotriphosphazene, octachlorocyclotetraphosphazene, decachlorocyclopentaphosphazene, dodecachlorocyclohexaphosphazene, hexaphenoxycyclotriphosphazene, etc., can be cited.

As the sublimable substance, 1,1,2,2,3,3,4-heptafluorocyclopentane is especially preferable. This compound has a vapor pressure at 20° C. of approximately 8266 Pa, a melting point (freezing point) of 20.5° C., and a boiling point of 82.5° C. The temperature of the heating medium used in the temperature maintaining step, the temperature of the cooling medium used in the freezing step, etc., should thus be set appropriately in accordance with these data.

<Solvent>

As a solvent in a case where the sublimable substance in the molten state is to be mixed, a solvent that exhibits compatibility with the sublimable substance in the molten state is preferable. Also, if the sublimable substance is to be dissolved as a solute, a solvent exhibiting a dissolving ability with respect to the sublimable substance is preferable.

As the solvent, for example, at least one type selected from the group consisting of DIW, pure water, aliphatic hydrocarbons, aromatic hydrocarbons, esters, alcohols, ethers, etc., can be cited.

Specifically, for example, at least one type selected from the group consisting of DIW, pure water, methanol, ethanol, IPA, butanol, ethylene glycol, propylene glycol, NMP (N-methyl-2-pyrrolidone), DMF (N,N-dimethylformamide), DMA (dimethylacetamide), DMSO (dimethylsulfoxide), hexane, toluene, PGMEA (propylene glycol monomethyl ether acetate), PGME (propylene glycol monomethyl ether), PGPE (propylene glycol monopropyl ether), PGEE (propylene glycol monoethyl ether), GBL (γ-butyrolactone), acetylacetone, 3-pentanone, 2-heptanone, ethyl lactate, cyclohexanone, dibutyl ether, HFE (hydrofluoroether), ethyl nonafluoroisobutyl ether, ethyl nonafluorobutyl ether, and m-xylene hexafluoride, can be cited.

The content of the sublimable substance in the processing liquid is not restricted in particular and may be set as appropriate.

Sixth Preferred Embodiment

Figure 25:
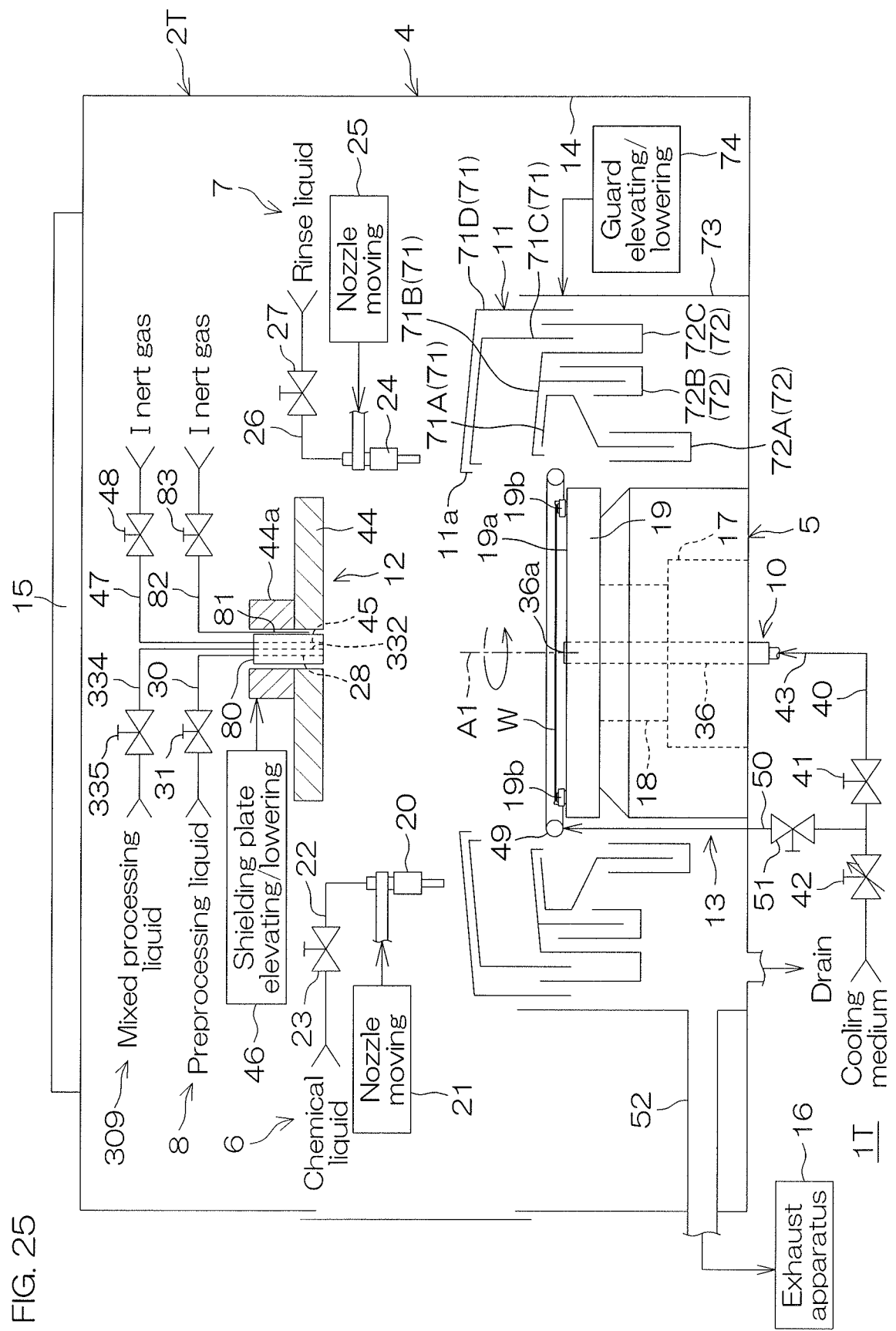
FIG. 25 is a schematic sectional view of the general configuration of a processing unit included in a substrate processing apparatus according to a sixth preferred embodiment.

FIG. 25 is a schematic sectional view of the general arrangement of a processing unit 2T included in a substrate processing apparatus 1T according to a sixth preferred embodiment of the present invention.

With the sixth preferred embodiment, portions corresponding to respective portions indicated with the first preferred embodiment to the fifth preferred embodiment and steps equivalent to those of the substrate processing examples of the first preferred embodiment to the fifth preferred embodiment are provided and indicated with the same reference symbols as in FIG. 1 to FIG. 24 and description thereof shall be omitted.

A point by which the processing unit 2T differs from the processing unit 2 according to the first preferred embodiment (see FIG. 1) is the point that, in place of the processing liquid supplying unit 9, a mixed processing liquid supplying unit 309 is included. Unlike with the processing unit 2, with the processing unit 2T, a heating medium is not included in the fluids supplied from the rear surface supplying unit 10 to the rear surface of the substrate W.

The mixed processing liquid supplying unit 309 supplies a mixed processing liquid, in which a sublimable substance (first sublimable substance) and a solvent as a first additive are mixed, to the front surface of the substrate W held by the spin chuck 5.

The mixed processing liquid supplying unit 309 includes a mixed processing liquid supply nozzle 332 housed in the nozzle housing member 80. The mixed processing liquid supply nozzle 332 can be moved between a central position of facing the rotation center position of the pattern forming surface (front surface) of the substrate W and a retracted position of not facing the pattern forming surface of the substrate W.

A mixed processing liquid supply pipe 334 is connected to the mixed processing liquid supply nozzle 332. The mixed processing liquid supply pipe 334 has interposed therein a valve 335 that opens and closes its flow passage.

The mixed processing liquid is a mixed liquid in which the sublimable substance (first sublimable substance) and the solvent (solvent without a sublimating property) as the first additive are mixed. The solvent of a small amount with respect to the sublimable substance is dispersed in the sublimable substance in the molten state. A mixing ratio of the solvent with respect to the mixed processing liquid is, for example, several % to 10-odd % as volume ratio. The sublimable substance has a freezing point slightly higher than a second ordinary temperature. The second ordinary temperature is a temperature inside the clean room according to the sixth preferred embodiment in a state where the temperature is not adjusted, and is a temperature inside the processing unit 2 according to the sixth preferred embodiment in a state where the temperature is not adjusted. The second ordinary temperature is, for example approximately 23° C. The sublimable substance is, for example, tertiary butyl alcohol (freezing point: approximately 25.6° C.). The solvent is, for example, an alcohol. As an example of the alcohol, IPA can be cited. The freezing point of IPA is lower than the freezing point of the sublimable substance (tertiary butyl alcohol).

Due to freezing point depression by the mixing of the sublimable substance (tertiary butyl alcohol) and IPA, the freezing point of the mixed processing liquid is lower than the second ordinary temperature (approximately 23° C.). That is, at the second ordinary temperature, the mixed processing liquid does not freeze and is maintained in a liquid state.

Figure 26:
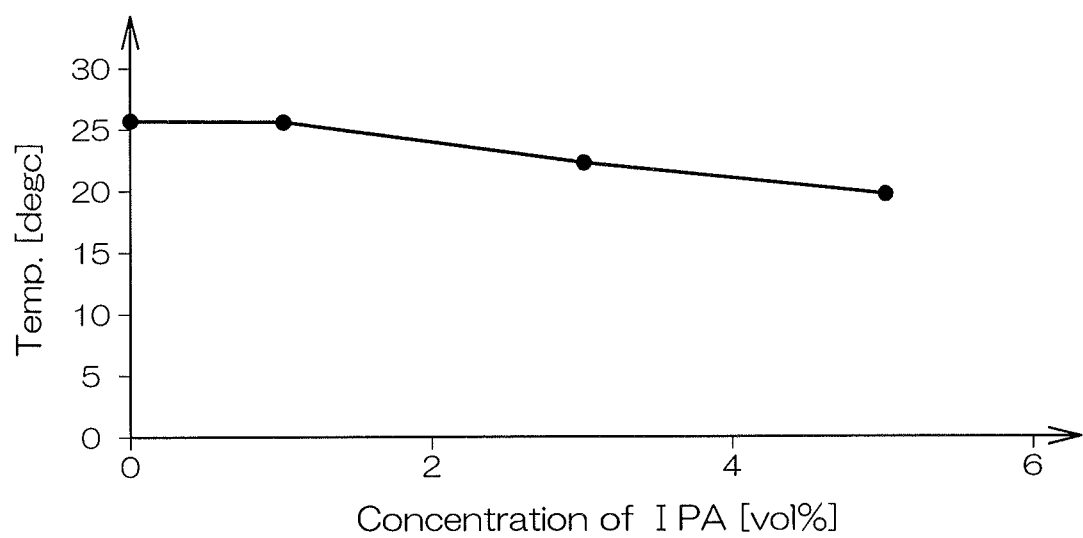
FIG. 26 is a diagram of a relationship of concentration of IPA contained in a mixed processing liquid and freezing point of the mixed processing liquid.

FIG. 26 is a diagram of a relationship of concentration of IPA contained in the mixed processing liquid (mixing ratio of IPA with respect to the mixed processing liquid) and the freezing point of the mixed processing liquid.

From FIG. 26, it can be understood that when the concentration of IPA exceeds 3%, the freezing point of the mixed processing liquid falls below the second ordinary temperature. It can therefore be understood that when the mixing ratio of IPA with respect to the mixed processing liquid is not less than 3%, the mixed processing liquid does not freeze and is maintained in the liquid state at the second ordinary temperature.

Also, the processing unit 2T is not provided with the heating medium supply pipe 37 (see FIG. 2) and the valves 38 and 39. That is, the rear surface supplying unit 10 supplies the cooling medium to the rear surface of the substrate W but does not supply the heating medium to the rear surface of the substrate W. With the sixth preferred embodiment, the mixed processing liquid is maintained in the liquid state at the second ordinary temperature in a mixed processing liquid supplying step (step S24 of FIG. 28 to be described below) and therefore there is no need to supply the heating medium to the rear surface of the substrate W. It is therefore unnecessary to provide an apparatus (the heating medium supply pipe 37 and the valves 38 and 39) arranged to supply the heating medium and cost reduction can thus be achieved.

Figure 27:
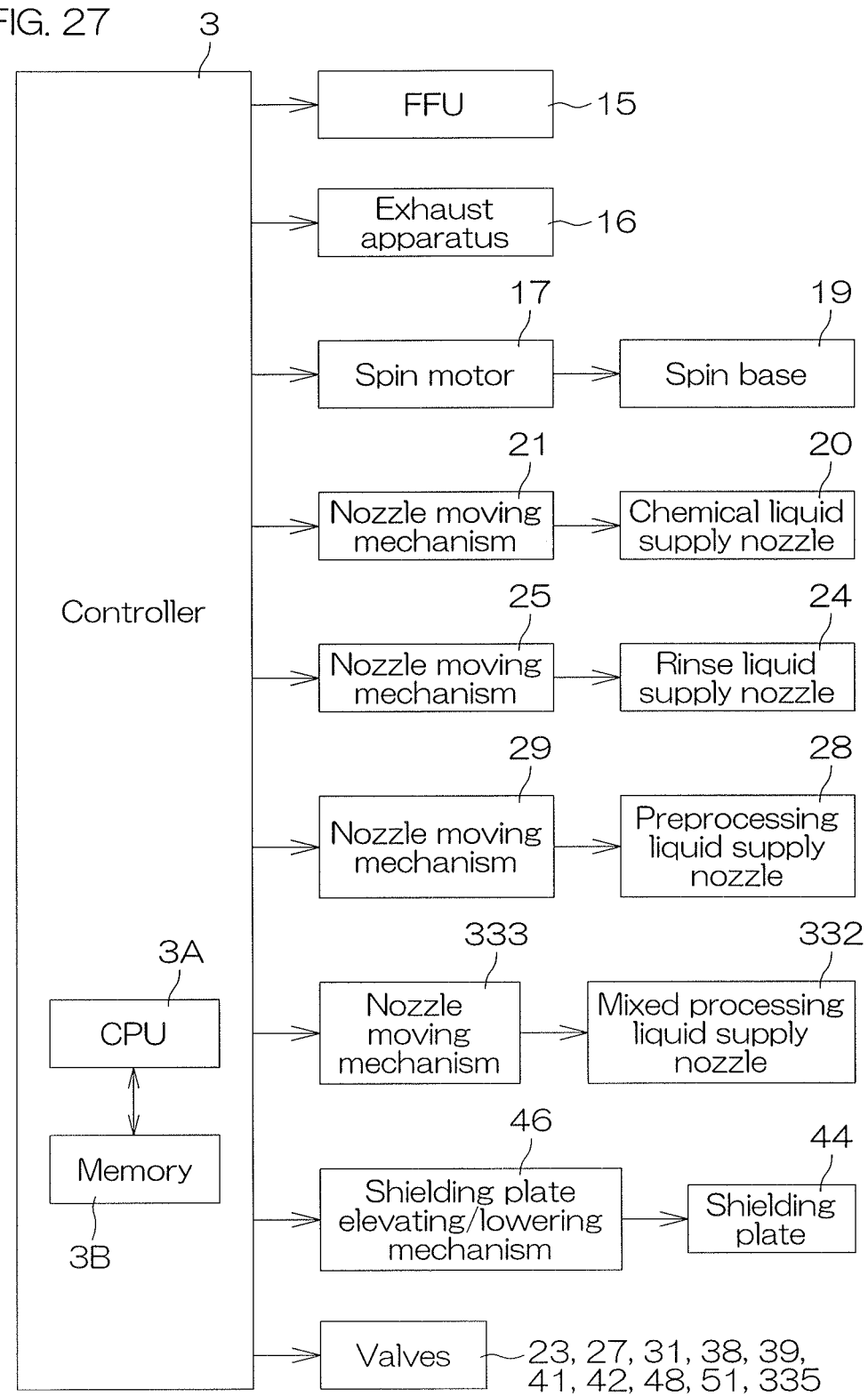
FIG. 27 is a block diagram of the electrical configuration of a main portion of the substrate processing apparatus according to the sixth preferred embodiment.

FIG. 27 is a block diagram of the electrical configuration of a main portion of the substrate processing apparatus 1T.

The controller 3 is programmed to further control a fifth nozzle moving mechanism 333 and the valve 335.

Figure 28:
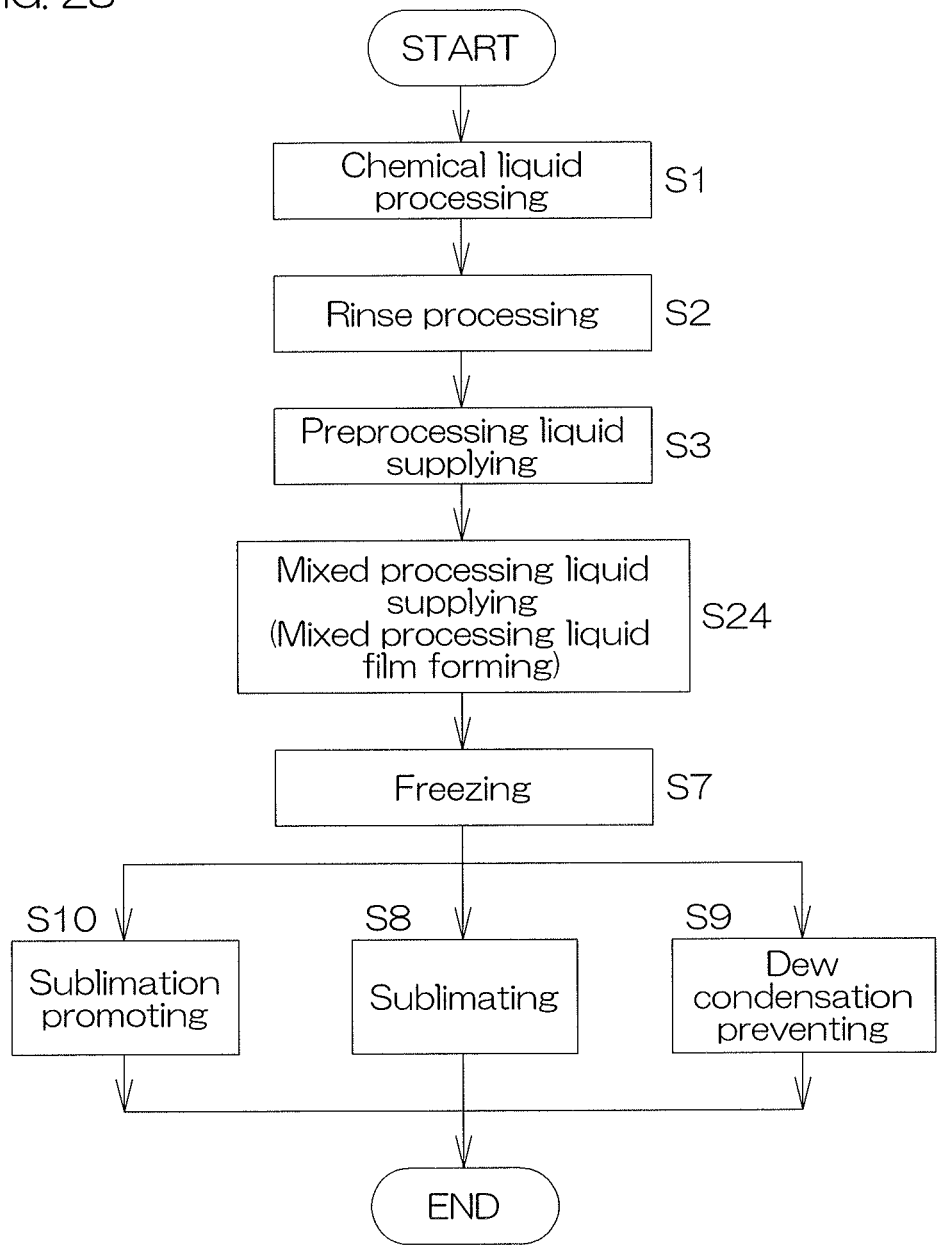
FIG. 28 is a flow diagram for describing an example of substrate processing by the processing unit according to the sixth preferred embodiment.

FIG. 28 is a flow diagram for describing an example of substrate processing by the processing unit 2T. FIGS. 12A to 12C are illustrative sectional views for describing conditions of the substrate processing.

Figure 29A:
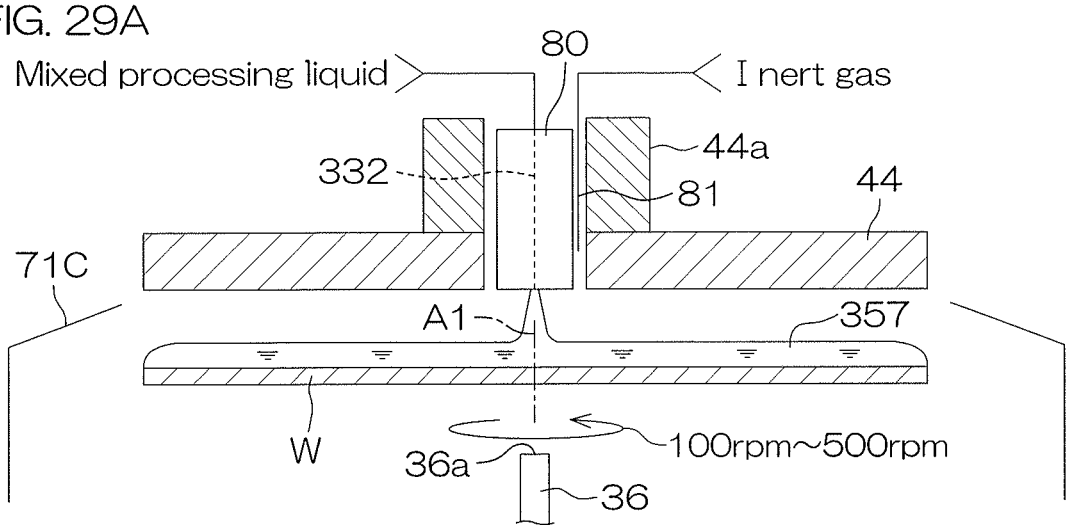
FIG. 29A to FIG. 29C are illustrative sectional views for describing conditions of the substrate processing by the processing unit according to the sixth preferred embodiment.
Figure 29B:
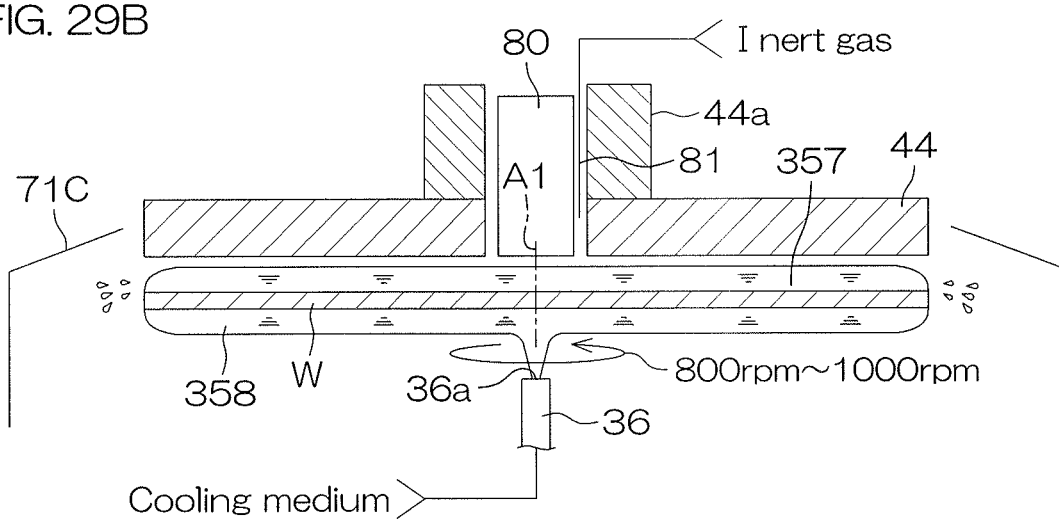
Figure 29C:
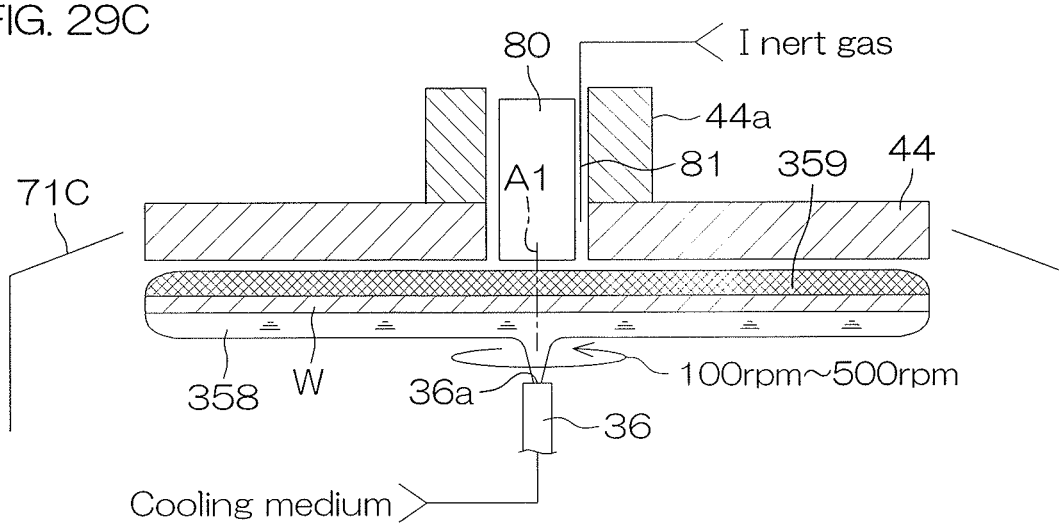

The substrate processing shall now be described with reference to FIG. 1, FIG. 25, FIG. 27, and FIG. 28. FIGS. 29A to 29C shall be referenced where appropriate.

When the substrate W is to be processed by the processing unit 2T, a substrate carry-in step of carrying the unprocessed substrate W into the chamber 4 is performed. Prior to the substrate carry-in step, the controller 3 disposes the shielding plate 44 at the retracted position and makes all nozzles retract from above the spin chuck 5. A hand of the transfer robot CR that holds the substrate W is made to enter inside the chamber 4. In the substrate carry-in step, the controller 3 makes the transfer robot CR pass the substrate W onto the spin chuck 5 in a state where the front surface (pattern forming surface) is faced upward and makes the spin chuck 5 clamp the substrate W in the horizontal orientation by the plurality of clamping members 19b. After handing over the substrate W to the spin chuck 5, the controller 3 makes the hand of the transfer robot CR retract from inside the chamber 4.

In the substrate processing by the processing unit 2T, the controller 3 first executes the chemical liquid processing step (step S1 of FIG. 28; see FIG. 5A). When the fixed period elapses from the start of discharge of the chemical liquid, the controller 3 ends the chemical liquid processing step and starts the rinse processing step (step S2 of FIG. 28;

see FIG. 5B). When the fixed period elapses from the start of discharge of the rinse liquid, the controller 3 ends the rinse processing step and starts the preprocessing liquid supplying step (step S3 of FIG. 28; see FIG. 5C). When the fixed period elapses from the start of discharge of the preprocessing liquid, the controller 3 ends the preprocessing liquid supplying step.

Next, the controller executes the mixed processing liquid supplying step (step S24 of FIG. 28; mixed liquid film forming step) of supplying the mixed processing liquid onto the pattern forming surface of the substrate W. In the mixed processing liquid supplying step, the controller 3 controls the spin motor 17 to make the spin base 19 rotate at a predetermined mixed processing liquid supplying speed. The mixed processing liquid supplying speed is, for example, 100 rpm to 500 rpm.

The controller 3 supplies the mixed processing liquid to the pattern forming surface of the substrate W while keeping the rotational speed of the spin base 19 at the mixed processing liquid supplying speed.

Specifically, the controller 3 controls the fifth nozzle moving mechanism 333 to dispose the mixed processing liquid supply nozzle 332 at the central position above the substrate W. The controller 3 then opens the valve 335. The mixed processing liquid is thereby supplied from the mixed processing liquid supply nozzle 332 toward the pattern forming surface of the substrate W in the rotating state as shown in FIG. 29A (mixed processing liquid supplying step). By the action of the centrifugal force, the supplied mixed processing liquid spreads across substantially the entirety of the pattern forming surface of the substrate W while mixing with the preprocessing liquid and replaces the preprocessing liquid. A mixed processing liquid film 357 is then formed on the pattern forming surface of the substrate W.

The freezing point of the mixed processing liquid is lower than the second ordinary temperature (approximately 23° C.). The mixed processing liquid is thus maintained in the liquid state without freezing. The mixed processing liquid film 357 is thus formed satisfactorily in the mixed processing liquid supplying step that is performed under a second ordinary temperature environment. After the mixed processing liquid film 357 spreads to the entirety of the substrate W, the supply of the mixed processing liquid to the pattern forming surface of the substrate W is stopped.

After the forming of the mixed processing liquid film 357, the controller 3 opens the valve 41 to start the supply of the cooling medium 358 to the cooling medium path (the cooling medium supply pipe 40 and the rear surface supply nozzle 36) as shown in FIG. 29B. The cooling medium is thereby supplied through the cooling medium path and from the discharge port 36a at the upper end of the rear surface supply nozzle 36 toward the rear surface of the substrate W in the rotating state.

Although in FIG. 29B, the cooling medium 358 is supplied from the rear surface supply nozzle 36 to the rear surface of the substrate W after stoppage of the supply of the mixed processing liquid to the pattern forming surface, the cooling medium 358 may instead be supplied to the rear surface of the substrate W at the same time as the stoppage of the supply of the mixed processing liquid to the pattern forming surface.

The cooling medium supplied to the rear surface of the substrate W spreads across substantially the entirety of the rear surface of the substrate W by the action of the centrifugal force. Cooling of the mixed processing liquid film 357 formed on the pattern forming surface of the substrate W is thereby started. The substrate W has the predetermined heat capacity and therefore a temperature of the mixed processing liquid film 357 formed on the pattern forming surface of the substrate W decreases gradually.

Therefore, after some time from the point at which the valve 41 is opened to start the supply of the cooling medium to the cooling medium path, freezing (freezing step; step S7 of FIG. 28) of the mixed processing liquid film 357 formed on the pattern forming surface of the substrate W begins.

As shown in FIG. 29C, in the freezing step (step S7), the controller 3 controls the spin motor 17 to make the spin base 19 rotate at the predetermined freezing process speed while continuing to supply the cooling medium 358 to the rear surface of the substrate W. The freezing process speed is, for example, 100 rpm to 500 rpm.

The processing liquid film formed on the pattern forming surface of the substrate W thereby freezes and a frozen body 359 is formed as shown in FIG. 29C.

Next, the sublimating step (step S8 of FIG. 28) of sublimating and thereby removing the formed frozen body 359 from the pattern forming surface of the substrate W is executed. Also, the dew condensation preventing step (step S9 of FIG. 28) of preventing the dew condensation on the pattern forming surface of the substrate W and the sublimation promoting step (step S10 of FIG. 28) of promoting the sublimation of the frozen body 359 are executed in parallel to the sublimating step. By the sublimating step and the sublimation promoting step being performed, the influence of surface tension of a liquid can be eliminated and therefore the pattern forming surface of the substrate W can be dried while suppressing pattern collapse.

Here, if a sublimable substance with a freezing point higher than the second ordinary temperature is used, a temperature adjusting mechanism, such as the heater 99, etc., is used in some cases as described in the second preferred embodiment of FIG. 8 to prevent freezing of the processing liquid remaining inside the piping (the processing liquid supply nozzle 32 and the processing liquid supply pipe 34) through which the sublimable substance flows. The cost required for the substrate processing apparatus may thus increase greatly. Also, the sublimable substance may freeze inside the piping due to stoppage of the temperature adjusting mechanism, etc., due to apparatus trouble. In this case, there is also a problem that considerable time is required for recovery. That is, if a sublimable substance having a freezing point higher than the second ordinary temperature is used as it is in substrate drying, there remains concern for freezing of the sublimable substance inside the piping.

On the other hand, a sublimable substance having a freezing point lower than the second ordinary temperature may be considered for use in substrate drying. However, a sublimable substance having a freezing point lower than the second ordinary temperature is extremely expensive. Use of such a sublimable substance in substrate drying may thus lead to a large increase in cost.

That is, it is demanded that it be possible to suppress or prevent unintended freezing of the processing liquid having the sublimating property while suppressing cost increase and be possible to process the front surface of the substrate satisfactorily.

Also, to freeze a sublimable substance having a low freezing point, the temperature of the cooling medium used in the freezing step (step S7) must be made low as well. If the temperature of the cooling medium is lowered, dew condensation may occur inside the substrate processing apparatus depending on installation circumstances of a piping for the cooling medium. The dew condensation occurring inside the substrate processing apparatus may become a cause of malfunction of the substrate processing apparatus and therefore installation of heat insulating material, etc., becomes necessary to prevent the occurrence of dew condensation. Extra cost arises in such a case.

With the sixth preferred embodiment, without using a sublimable substance of which the freezing point is lower than the second ordinary temperature (approximately 23° C.), due to the freezing point depression by the mixing of the sublimable substance (for example, tertiary butyl alcohol) and IPA, the freezing point of the mixed processing liquid is made lower than the second ordinary temperature. That is, at the second ordinary temperature, the mixed processing liquid does not freeze and is maintained in the liquid state. Therefore, even when the mixed processing liquid supplying step is performed under the second ordinary temperature environment, the mixed processing liquid film 357 can be formed satisfactorily. The frozen body 359 can then be formed in the freezing step subsequent the mixed processing liquid supplying step. Also, in the subsequent sublimating step, the frozen body 359 can be removed from the pattern forming surface of the substrate W by sublimating the sublimable substance contained in the frozen body 359.

Unintended freezing of the mixed processing liquid can thus be avoided under the second ordinary temperature environment while suppressing cost increase and the pattern forming surface of the substrate W can be processed satisfactorily.

<Collapse Test>

In the substrate processing (see FIG. 28) according to the sixth preferred embodiment, the concentration of IPA contained in the mixed processing liquid supplied from the mixed processing liquid supplying unit 309 was changed to examine a change in collapse rate of a pattern formed on the pattern forming surface of the substrate W. The results are shown in FIG. 30.

Figure 30:
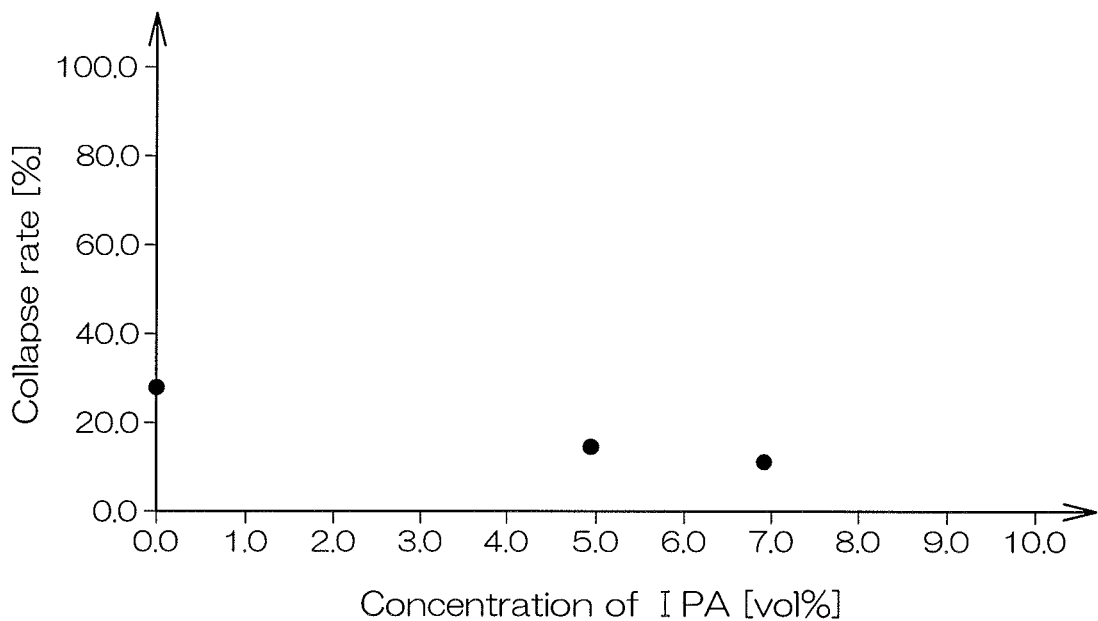
FIG. 30 is a diagram of a relationship of the concentration of IPA contained in the mixed processing liquid and collapse rate of a pattern formed on a front surface of a substrate.

From FIG. 30, it became known that the pattern collapse rate decreases gradually with an increase in the concentration of IPA contained in the mixed processing liquid (mixing ratio of the solvent with respect to the mixed processing liquid). That is, it became known that even if the IPA concentration is increased, pattern collapse is not influenced adversely.

Figure 31:
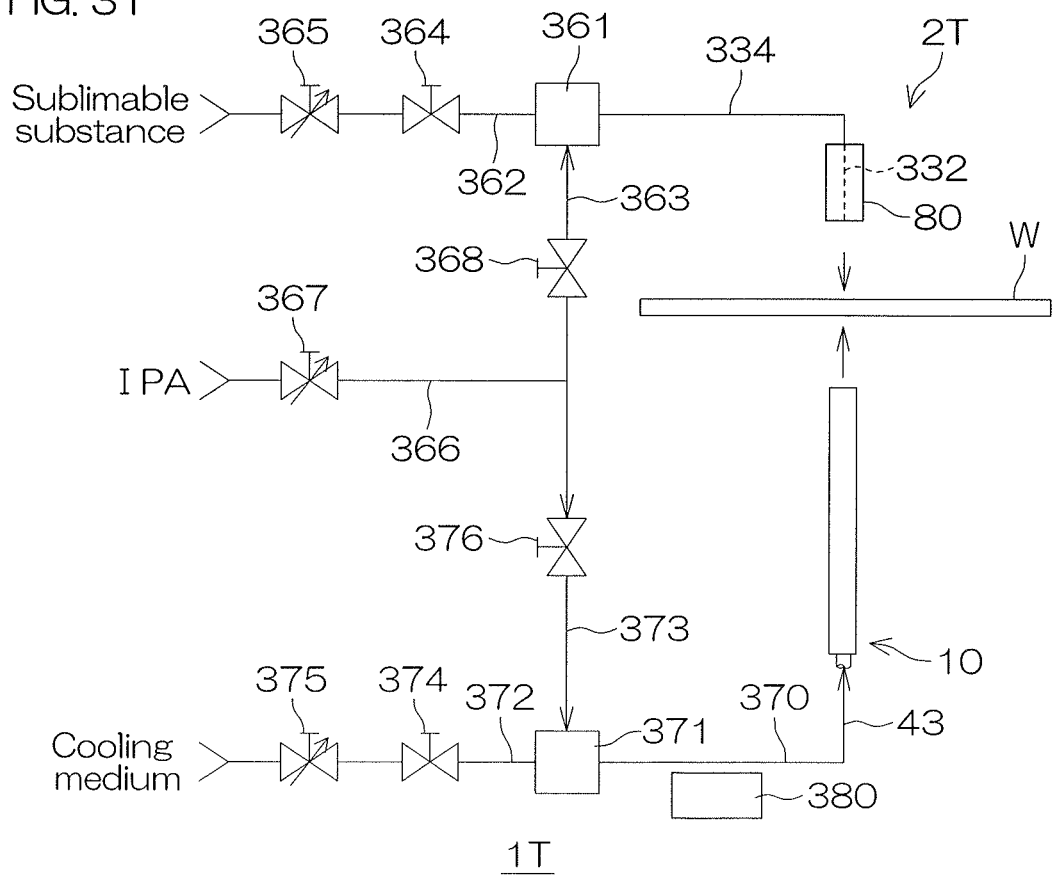
FIG. 31 is a diagram of a modification example according to the sixth preferred embodiment.

FIG. 31 is a diagram of a modification example according to the sixth preferred embodiment.

A first point of difference of the modification example shown in FIG. 31 with respect to the sixth preferred embodiment is that a mixed processing liquid that is prepared in advance is not used in the substrate processing apparatus 1T but the mixed processing liquid is prepared (produced) inside the substrate processing apparatus 1T.

Specifically, a mixing portion 361, configured to mix the sublimable substance and the solvent, is connected to the mixed processing liquid supply pipe 334. A sublimable substance piping 362, configured to supply the sublimable substance, and an additive branch piping 363, arranged to supply the additive (first additive), such as IPA, etc., are connected to the mixing portion 361. The sublimable substance is supplied from a sublimable substance supply source to the sublimable substance piping 362. The sublimable substance piping 362 may be provided with a heat source, such as a heater, etc., to maintain the sublimable substance, having the freezing point higher than the second ordinary temperature (approximately 23° C.), in the liquid state in the sublimable substance piping 362.

The sublimable substance piping 362 has interposed therein a valve 364 that opens and closes its flow passage and a valve 365 that adjusts a flow rate of the sublimable substance flowing through the sublimable substance piping 362.

The additive branch piping 363 branches from and is connected to an additive piping 366. The additive (for example, IPA) is supplied from an additive supply source to the additive piping 366. The additive piping 366 has interposed therein a valve 367 that adjusts a flow rate of the additive flowing through the additive piping 366. The additive branch piping 363 has interposed therein a valve 368 that opens and closes its flow passage.

When, in a state where a valve 376, to be described below, is closed, the valve 364 and the valve 368 are opened, the sublimable substance from the sublimable substance piping 362 and the additive from the additive branch piping 363 flow into the mixing portion 361 and these flow out from the mixing portion 361 to the mixed processing liquid supply pipe 334. The sublimable substance and the additive become sufficiently mixed together in a process of flowing through the mixed portion 361 and/or the mixed processing liquid supply pipe 334. The mixed processing liquid produced thus is supplied to the mixed processing liquid supply nozzle 332.

A second point of difference of the modification example shown in FIG. 31 with respect to the sixth preferred embodiment is that, a mixed cooling medium, in which a cooling medium and an additive (second additive) are mixed, is used as the cooling medium supplied to the rear surface of the substrate W. A freezing point of the mixed cooling medium is lower than the freezing point of the cooling medium before mixing with the additive. The additive contains a solvent (a solvent without a sublimating property). The solvent is, for example, an alcohol. IPA can be cited as an example of the alcohol.

That is, as a further feature of the present modification example, the point that the additive (second additive) contained in the mixed cooling medium and the additive contained in the mixed processing liquid are the same in liquid type can be cited.

Also, as yet another feature of the present modification example, the point that a mixed cooling medium that is prepared in advance is not used in the substrate processing apparatus 1T but the mixed cooling medium is prepared (produced) inside the substrate processing apparatus 1T can be cited.

Also, as yet another feature of the present modification example, the point that the additive (first additive) for preparing the mixed processing liquid and the additive (second additive) for preparing the mixed cooling medium have a supply source in common can be cited.

Specifically, a mixed cooling medium piping 370 is connected via the common piping 43 to the rear surface supply nozzle 36. A mixing portion 371, configured to mix the cooling medium and the additive, is connected to the mixed cooling medium piping 370. A cooling medium piping 372, configured to supply the cooling medium, and an additive branch piping 373, configured to supply the additive (second additive), such as IPA, etc., are connected to the mixing portion 371.

The cooling medium is supplied from a cooling medium supply source to the cooling medium piping 372. The cooling medium piping 372 has interposed therein a valve 374 that opens and closes its flow passage and a valve 375 that adjusts a flow rate of the cooling medium flowing through the cooling medium piping 372. The additive branch piping 373 branching from and connected to the additive piping 366 merges with the cooling medium piping 372. The additive branch piping 373 has interposed therein the valve 376 that opens and closes its flow passage.

When, in a state where the valve 368 is closed, the valve 374 and the valve 376 are opened, the cooling medium from the cooling medium piping 372 and the additive from the additive branch piping 373 flow into the mixing portion 371 and these flow out from the mixing portion 371 to the mixed cooling medium piping 370. The cooling medium and the additive become sufficiently mixed together in a process of flowing through the mixed portion 371 and/or the mixed cooling medium piping 370 and consequently, the mixed cooling medium is produced. Also, in the process of flowing through the mixed cooling medium piping 370, the mixed cooling medium is cooled further by use of a cooler 380.

Due to freezing point depression by the mixing of the cooling medium and the additive, the freezing point of the mixed cooling medium is made lower than the freezing point of the cooling medium. That is, even under a temperature lower than the freezing point of the cooling medium, the mixed cooling medium is maintained in a liquid state. The mixed cooling medium of liquid state, which is maintained at a temperature lower than the freezing point of the cooling medium, can thus be supplied to the rear surface of the substrate. If water is adopted as the cooling medium, the temperature of the mixed cooling medium can be lowered to a temperature lower than water by the cooler 380. Thereby, in the freezing step, the mixed processing liquid film 357 can be cooled to lower than 0° C. by supplying the mixed cooling medium lower than the freezing point (0° C.) of water to the rear surface of the substrate W.

With the modification example of FIG. 31, it was described that the additive (first additive) for preparing the mixed processing liquid and the additive (second additive) for preparing the mixed cooling medium have a supply source in common. However, the supply sources for these may be separate.

Also, with the modification example of FIG. 31, it is described that the additive (second additive) contained in the mixed cooling medium and the additive (first additive) contained in the mixed processing liquid are the same in liquid type. However, the liquid types of these may differ mutually.

Also, with the modification example of FIG. 31, it is described that the mixed cooling medium is prepared in the substrate processing apparatus 1T according to the sixth preferred embodiment. However, the mixed cooling medium may be prepared in advance.

Also, with the modification example of FIG. 31, the additive (second additive) contained in the mixed cooling medium is an alcohol, such as IPA, etc. Unlike with the modification example of FIG. 31, the additive (second additive) contained in the mixed cooling medium may be an alcohol other than IPA or may be a solvent other than an alcohol.

Also, with each of the sixth preferred embodiment and the modification example thereof, the solvent (solvent without a sublimating property) as the additive (first additive) contained in the mixed processing liquid is an alcohol, such as IPA, etc. Even if, unlike with each of the sixth preferred embodiment and the modification example thereof, the solvent (solvent without a sublimating property) as the additive (first additive) contained in the mixed processing liquid is water, such as DIW, etc., it can be used favorably. The solvent shall be described in detail below. As the solvent contained in the mixed processing liquid, the solvents exemplified as the solvent included in the processing liquid according to the first embodiment to the fifth embodiment can be used.

Also, with each of the sixth preferred embodiment and the modification example thereof, a sublimable substance differing in type from the sublimable substance contained in the mixed processing liquid may be adopted as the additive (first additive) contained in the mixed processing liquid without restriction to a solvent without a sublimating property.

Also, cases where the sublimable substance used in the sixth preferred embodiment and the modification example thereof is tertiary butyl alcohol were described as examples, as other examples of sublimable substances favorable for use in the sixth preferred embodiment and the modification example thereof, cyclohexanol (freezing point: approximately 24° C.) and 1,3,5-trioxane (freezing point: approximately 63° C.) can be cited. Also, although it was described that with the sublimable substance used in the sixth preferred embodiment and the modification example thereof, the freezing point of the sublimable substance is higher than the second ordinary temperature and the freezing point of the mixed processing liquid is lower than the second ordinary temperature, the freezing point of the sublimable substance may be lower than the second ordinary temperature and the freezing point of the mixed processing liquid may be higher than the second ordinary temperature. In addition to these, among the sublimable substances exemplified as the sublimable substances contained in the processing liquid according to the first embodiment to fifth embodiment, a sublimable substance in which freezing point depression is caused by mixing with the additive can be used as the sublimable substance contained in the mixed processing liquid.

The present invention is not restricted to the preferred embodiments described above and may be implemented in yet other modes. For example, the preferred embodiments described above may be combined as appropriate.

Also, with the first preferred embodiment, the chemical liquid, the rinse liquid, the preprocessing liquid, and the processing liquid may, for example, be configured to be supplied at substantially the same time to substantially the entirety of the pattern forming surface of the substrate W from a plurality of nozzle holes aligned in a line. Similarly, the heating medium and the cooling medium may, for example, be configured to be supplied at substantially the same time to the rear surface of the substrate W from a plurality of nozzle holes aligned in a line.

Also, with the first preferred embodiment, heat from a heat source, such as a lamp or an electric heater, etc., may be used in place of supplying the heating medium 56 to the rear surface of the substrate W to maintain the temperature of the processing liquid in the temperature range not lower than the melting point of the sublimable substance and lower than the boiling point of the sublimable substance. Also, a cooled inert gas may be supplied or a Peltier element, etc., may be used in place of supplying the cooling medium 58 to the rear surface of the substrate W to cool and freeze processing liquid.

Also, with each of the preferred embodiments described above, the shielding plate 44 may be provided with a depressurizing piping to depressurize the atmosphere between the shielding plate 44 and the substrate W or the shielding plate 44 may be heated to promote the sublimation of the frozen body.

Also, in each of the steps of the substrate processing by the substrate processing apparatuses 1, 1P, 1Q, 1R, 1S, and 1T, another step may be added to the steps indicated with the preferred embodiments.

Figure 32:
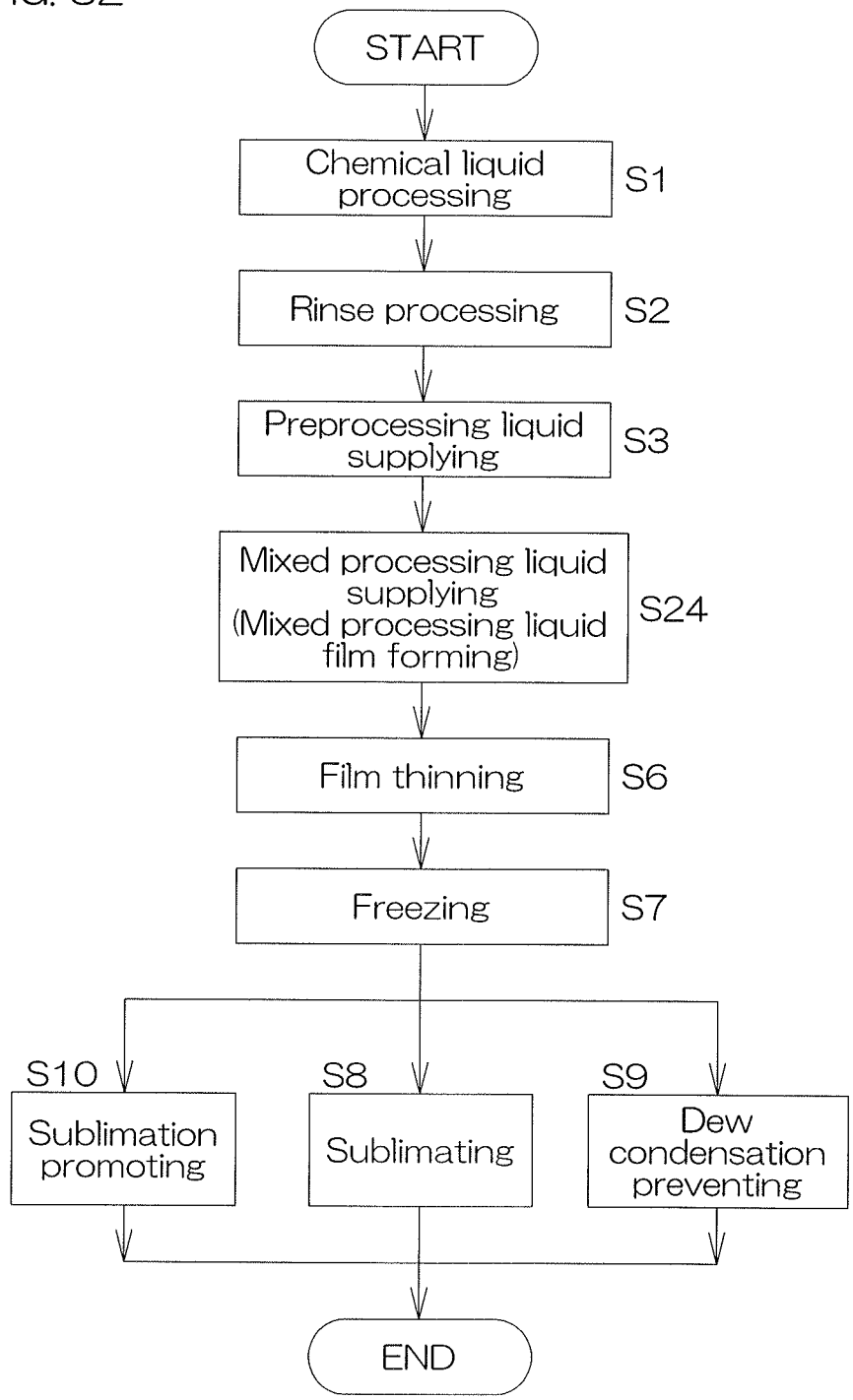
FIG. 32 is a flow diagram for describing another example of the substrate processing by the processing unit according to the sixth preferred embodiment.

For example, the substrate processing shown in FIG. 32 may be executed using the substrate processing apparatus 1T according to the sixth preferred embodiment. That is, the film thinning step (step S6) may be executed after the mixed processing liquid supplying step (step S24). The film thinning step is performed under the second ordinary temperature environment as well as the mixed processing liquid supplying step. Therefore, in the film thinning step, the temperature of the mixed processing liquid film 357 is in a temperature range not lower than the freezing point of the mixed processing liquid and is lower than a boiling point of the mixed processing liquid. By executing the substrate processing shown in FIG. 32, the film thickness of the frozen body, formed in the freezing step, can be reduced in the film thinning step. Also, the freezing point of the mixed processing liquid is lower than the second ordinary temperature and therefore there is no need to execute the temperature maintaining step (step S5 shown in FIG. 4). The substrate processing can thus be simplified.

While preferred embodiments of the present invention have been described in detail above, these are merely specific examples used to clarify the technical contents of the present invention, and the present invention should not be interpreted as being limited only to these specific examples, and the scope of the present invention shall be limited only by the appended claims.

The present application corresponds to Japanese Patent Application No. 2017-182551 filed on Sep. 22, 2017 in the Japan Patent Office, Japanese Patent Application No. 2018-002992 filed on Jan. 11, 2018 in the Japan Patent Office, and Japanese Patent Application No. 2018-105412 filed on May 31, 2018 in the Japan Patent Office, and the entire disclosures of these applications are incorporated herein by reference.

What is claimed is:

1. A substrate processing method comprising:
a processing liquid film forming step of supplying a processing liquid, containing a sublimable substance, to a pattern forming surface of a substrate, to form a processing liquid film on the pattern forming surface;
a temperature maintaining step of maintaining a temperature of the processing liquid film, formed on the pattern forming surface, in a temperature range not lower than a melting point of the sublimable substance and lower than a boiling point of the sublimable substance;
a film thinning step of thinning the processing liquid film while the temperature of the processing liquid film is in the temperature range;
a freezing step of making the processing liquid film, thinned by the film thinning step, freeze on the pattern forming surface after the temperature maintaining step to form a frozen body of the sublimable substance; and
a sublimating step of sublimating the frozen body to remove the frozen body from the pattern forming surface,
wherein the temperature maintaining step includes a temperature adjusting medium supplying step of supplying a temperature adjusting medium to a rear surface at an opposite side to the pattern forming surface of the substrate to adjust the temperature of the processing liquid film, formed on the pattern forming surface, via the substrate, the freezing step includes a substrate cooling step of supplying a cooling medium to the rear surface at the opposite side to the pattern forming surface of the substrate to cool the processing liquid film to a temperature not higher than a freezing point of the sublimable substance via the substrate, and the temperature adjusting medium supplying step includes a first heating medium supplying step of supplying a first heating medium of a first temperature, not lower than the melting point of the sublimable substance and lower than the boiling point of the sublimable substance, to the rear surface at the opposite side to the pattern forming surface of the substrate, and a second heating medium supplying step, executed after the first heating medium supplying step, in which a second heating medium of a temperature not lower than the melting point of the sublimable substance, lower than the boiling point of the sublimable substance, and lower than the first heating medium, is supplied to the rear surface at the opposite side to the pattern forming surface of the substrate.

2. The substrate processing method according to claim 1, wherein the processing liquid film forming step includes a step of forming the processing liquid film that spreads to a peripheral edge of the pattern forming surface, and
the film thinning step includes a film removing thinning step of thinning the processing liquid film by removing a portion of the processing liquid, constituting the processing liquid film, from the pattern forming surface after the supply of the processing liquid is stopped.

3. The substrate processing method according to claim 2, wherein the film removing thinning step includes a substrate rotating step of horizontally holding and rotating the substrate.

4. The substrate processing method according to claim 1, wherein the processing liquid film forming step includes a core forming step of forming, as the processing liquid film, a processing liquid core smaller than a diameter of the substrate, in a predetermined region that includes a center of the pattern forming surface, and
the film thinning step includes a film enlarging thinning step of spreading and thinning the processing liquid core to a peripheral edge of the pattern forming surface to thin the processing liquid film.

5. The substrate processing method according to claim 4, wherein the film enlarging thinning step includes a substrate rotating step of horizontally holding and rotating the substrate.

6. The substrate processing method according to claim 4, wherein the core forming step includes a first substrate rotating step of horizontally holding and rotating the substrate at a first rotational speed, and
the film enlarging thinning step includes a second substrate rotating step of horizontally holding and rotating the substrate at a second rotational speed that is a higher speed than the first rotational speed.

7. The substrate processing method according to claim 4, further comprising: a processing liquid supply stopping step of stopping the supply of the processing liquid before the start of the film enlarging thinning step.

8. The substrate processing method according to claim 4, further comprising: a processing liquid replenishing step of continuing the supply of the processing liquid to the pattern forming surface during execution of the film enlarging thinning step to replenish the processing liquid to the processing liquid film.

9. The substrate processing method according to claim 1, wherein the freezing step includes a substrate cooling step of supplying a cooling medium to a rear surface at an opposite side to the pattern forming surface of the substrate to cool the processing liquid film to a temperature not higher than a freezing point of the sublimable substance via the substrate.

10. The substrate processing method according to claim 1, wherein
the method further comprises: a step of controlling at least one of either of a timing of stopping supply of heating medium by a heating medium supplying unit and a timing of starting the supply of the cooling medium by a cooling medium supplying unit to adjust a film thinning period for the film thinning step and thereby control a film thickness of the processing liquid film after the film thinning step.

11. The substrate processing method according to claim 10, wherein the heating medium supplying unit is configured to supply heating medium to the rear surface of the substrate through a heating medium path,
the cooling medium supplying unit is configured to supply the cooling medium to the rear surface of the substrate through a cooling medium path, and wherein
a timing of stopping supply of heating medium to the heating medium path or a timing of starting the supply of the cooling medium to the cooling medium path is not earlier than a point at which the supply of the processing liquid to the pattern forming surface is stopped.

12. The substrate processing method according to claim 11, wherein the heating medium path and the cooling medium path share a piping at least partially.

13. The substrate processing method according to claim 1, wherein the freezing step includes a substrate cooling step of making heat be transmitted from the substrate to a cooler unit having a facing surface facing the rear surface at the opposite side to the pattern forming surface of the substrate to cool the processing liquid film to a temperature not higher than a freezing point of the sublimable substance via the substrate.

14. The substrate processing method according to claim 1, wherein the temperature maintaining step is started earlier than the processing liquid film forming step.

15. The substrate processing method according to claim 1, wherein the processing liquid contains the sublimable substance, as a solute, and a solvent, and
the temperature maintaining step includes a step of maintaining the temperature of the processing liquid film, formed on the pattern forming surface, lower than a boiling point of the solvent.

16. The substrate processing method according to claim 1, further comprising: a preprocessing liquid supplying step of supplying a preprocessing liquid, which is miscible with the processing liquid, to the pattern forming surface; and
the processing liquid film forming step is executed after the preprocessing liquid supplying step.

17. The substrate processing method according to claim 1, further comprising: a dew condensation preventing step, executed in parallel to the sublimating step and preventing dew condensation on the pattern forming surface.

18. The substrate processing method according to claim 17, wherein the dew condensation preventing step includes a step of supplying an inert gas to the pattern forming surface.

19. The substrate processing method according to claim 18, wherein the inert gas is a high-temperature inert gas of higher temperature than room temperature.

20. The substrate processing method according to claim 17, wherein the dew condensation preventing step includes an atmosphere blocking step of blocking an atmosphere of a space in a vicinity of the pattern forming surface.

21. The substrate processing method according to claim 17, wherein the dew condensation preventing step includes a dehumidifying step of dehumidifying an atmosphere around the substrate.

22. The substrate processing method according to claim 1, further comprising: a sublimation promoting step, executed in parallel to the sublimating step and promoting the sublimation of the frozen body.

23. The substrate processing method according to claim 22, wherein the sublimation promoting step includes a depressurizing step of depressurizing a space in a vicinity of the pattern forming surface.

24. The substrate processing method according to claim 22, wherein the sublimation promoting step includes a rotation sublimation promoting step of rotating the substrate to promote the sublimation of the frozen body.

25. The substrate processing method according to claim 22, wherein the sublimation promoting step includes an atmosphere heating step of heating an atmosphere in a vicinity of the pattern forming surface.

26. A substrate processing method comprising:
a processing liquid film supplying step of supplying a processing liquid, containing a sublimable substance, to a pattern forming surface of a substrate, to form a processing liquid film on the pattern forming surface;
a temperature maintaining step of maintaining a temperature of the processing liquid film, formed on the pattern forming surface, in a temperature range not lower than a melting point of the sublimable substance and lower than a boiling point of the sublimable substance;
a film thinning step of removing a portion of the processing liquid, constituting the processing liquid film, from the pattern forming surface, after stopping the supply of the processing liquid by the processing liquid supplying step and while the temperature of the processing liquid film is in the temperature range to thin the processing liquid film;
a freezing step of making the processing liquid film, thinned by the film thinning step, freeze on the pattern forming surface after the temperature maintaining step to form a frozen body; and
a sublimating step of sublimating the frozen body to remove the frozen body from the pattern forming surface,
wherein the temperature maintaining step includes a temperature adjusting medium supplying step of supplying a temperature adjusting medium to a rear surface at an opposite side to the pattern forming surface of the substrate to adjust the temperature of the processing liquid film, formed on the pattern forming surface, via the substrate,
the freezing step includes a substrate cooling step of supplying a cooling medium to the rear surface at the opposite side to the pattern forming surface of the substrate to cool the processing liquid film to a temperature not higher than a freezing point of the sublimable substance via the substrate, and
the temperature adjusting medium supplying step includes a first heating medium supplying step of supplying a first heating medium of a first temperature, not lower than the melting point of the sublimable substance and lower than the boiling point of the sublimable substance, to the rear surface at the opposite side to the pattern forming surface of the substrate, and a second heating medium supplying step, executed after the first heating medium supplying step, in which a second heating medium of a temperature not lower than the melting point of the sublimable substance, lower than the boiling point of the sublimable substance, and lower than the first heating medium, is supplied to the rear surface at the opposite side to the pattern forming surface of the substrate.

27. The substrate processing method according to claim 26, wherein the temperature adjusting medium supplying step is started earlier than a start of the processing liquid supplying step.

28. The substrate processing method of claim 26, wherein the method further comprises: a step of controlling at least one of either of a timing of stopping supply of heating medium by a heating medium supplying unit and a timing of starting the supply of the cooling medium by a cooling medium supplying unit to adjust a film thinning period for the film thinning step and thereby control a film thickness of the processing liquid film after the film thinning step.

29. The substrate processing method of claim 28, wherein the heating medium supplying unit is configured to supply heating medium to the rear surface of the substrate through a heating medium path,
    the cooling medium supplying unit is configured to supply the cooling medium to the rear surface of the substrate through a cooling medium path, and wherein
    a timing of stopping supply of heating medium to the heating medium path or a timing of starting the supply of the cooling medium to the cooling medium path is not earlier than a point at which the supply of the processing liquid by the processing liquid supplying step is stopped.

30. The substrate processing method according to claim 29, wherein the heating medium path and the cooling medium path share a piping at least partially.

31. The substrate processing method according to claim 26, wherein the film thinning step includes a substrate rotating step of horizontally holding and rotating the substrate.

32. The substrate processing method according to claim 26, further comprising: a preprocessing liquid supplying step of supplying a preprocessing liquid, which is miscible with the processing liquid, to the pattern forming surface; and
    wherein the processing liquid supplying step is executed after the preprocessing liquid supplying step.

33. The substrate processing method according to claim 26, further comprising: a dew condensation preventing step, executed in parallel to the sublimating step and preventing dew condensation on the pattern forming surface.

34. The substrate processing method according to claim 33, wherein the dew condensation preventing step includes a step of supplying an inert gas to the pattern forming surface.

35. The substrate processing method according to claim 34, wherein the inert gas is a high-temperature inert gas of higher temperature than room temperature.

36. The substrate processing method according to claim 33, wherein the dew condensation preventing step includes an atmosphere blocking step of blocking an atmosphere of a space in a vicinity of the pattern forming surface.

37. The substrate processing method according to claim 33, wherein the dew condensation preventing step includes a dehumidifying step of dehumidifying an atmosphere around of the substrate.

38. The substrate processing method according to claim 26, further comprising: a sublimation promoting step, executed in parallel to the sublimating step and promoting the sublimation of the frozen body.

39. The substrate processing method according to claim 38, wherein the sublimation promoting step includes a depressurizing step of depressurizing a space in a vicinity of the pattern forming surface.

40. The substrate processing method according to claim 38, wherein the sublimation promoting step includes a substrate rotating step of rotating the substrate.

41. The substrate processing method according to claim 38, wherein the sublimation promoting step includes an atmosphere heating step of heating an atmosphere in a vicinity of the pattern forming surface.

42. A substrate processing method comprising:
    a processing liquid film forming step of supplying a processing liquid, containing a sublimable substance, to a pattern forming surface of a substrate, to form a processing liquid film on the pattern forming surface;
    a temperature maintaining step of maintaining a temperature of the processing liquid film, formed on the pattern forming surface, in a temperature range not lower than a melting point of the sublimable substance and lower than a boiling point of the sublimable substance;
    a film thinning step of thinning the processing liquid film while the temperature of the processing liquid film is in the temperature range;
    a freezing step of making the processing liquid film, thinned by the film thinning step, freeze on the pattern forming surface after the temperature maintaining step to form a frozen body of the sublimable substance; and
    a sublimating step of sublimating the frozen body to remove the frozen body from the pattern forming surface,
    wherein the temperature maintaining step includes a heating medium supplying step of supplying a heating medium by a heating medium supplying unit to a rear surface at an opposite side to the pattern forming surface of the substrate,
    the freezing step includes a cooling medium supplying step of supplying a cooling medium by a cooling medium supplying unit to the rear surface of the substrate,
    the method further comprises a step of controlling at least one of either of a timing of stopping the supply of the heating medium by the heating medium supplying unit and a timing of starting the supply of the cooling medium by the cooling medium supplying unit to adjust a film thinning period for the film thinning step and thereby control a film thickness of the processing liquid film after the film thinning step,
    the heating medium supplying unit is configured to supply the heating medium to the rear surface of the substrate through a heating medium path,
    the cooling medium supplying unit is configured to supply the cooling medium to the rear surface of the substrate through a cooling medium path, and the timing of stopping the supply of the heating medium to the heating medium path or the timing of starting the supply of the cooling medium to the cooling medium path is not earlier than a point at which the supply of the processing liquid to the pattern forming surface is stopped.

43. A substrate processing method comprising:
- a processing liquid film supplying step of supplying a processing liquid, containing a sublimable substance, to a pattern forming surface of a substrate, to form a processing liquid film on the pattern forming surface;
- a temperature maintaining step of maintaining a temperature of the processing liquid film, formed on the pattern forming surface, in a temperature range not lower than a melting point of the sublimable substance and lower than a boiling point of the sublimable substance;
- a film thinning step of removing a portion of the processing liquid, constituting the processing liquid film, from the pattern forming surface, after stopping the supply of the processing liquid by the processing liquid supplying step and while the temperature of the processing liquid film is in the temperature range to thin the processing liquid film;
- a freezing step of making the processing liquid film, thinned by the film thinning step, freeze on the pattern forming surface after the temperature maintaining step to form a frozen body; and
- a sublimating step of sublimating the frozen body to remove the frozen body from the pattern forming surface, wherein the temperature maintaining step includes a substrate temperature adjusting step of putting a heating medium in contact with a rear surface at an opposite side to the pattern forming surface of the substrate to adjust the temperature of the processing liquid film, formed on the pattern forming surface, via the substrate, and the substrate temperature adjusting step is started earlier than a start of the processing liquid supplying step.

* * * * *